(12) United States Patent
Zhang

(10) Patent No.: US 11,869,434 B1
(45) Date of Patent: Jan. 9, 2024

(54) DISPLAY PANEL AND DISPLAY DEVICE

(71) Applicants: Wuhan Tianma Micro-Electronics Co., Ltd., Wuhan (CN); Wuhan Tianma MicroElectronics Co., Ltd. Shanghai Branch, Shanghai (CN)

(72) Inventor: Peng Zhang, Shanghai (CN)

(73) Assignees: WUHAN TIANMA MICRO-ELECTRONICS CO., LTD., Wuhan (CN); WUHAN TIANMA MICROELECTRONICS CO., LTD. SHANGHAI BRANCH, Shanghai (CN)

( * ) Notice: Subject to any disclaimer, the term of this patent is extended or adjusted under 35 U.S.C. 154(b) by 0 days.

(21) Appl. No.: 17/895,421

(22) Filed: Aug. 25, 2022

(30) Foreign Application Priority Data

Jun. 27, 2022 (CN) .......................... 202210744753.8

(51) Int. Cl.
| | |
|---|---|
| *G09G 3/3233* | (2016.01) |
| *H10K 59/131* | (2023.01) |
| *H10K 59/88* | (2023.01) |

(52) U.S. Cl.
CPC ......... *G09G 3/3233* (2013.01); *H10K 59/131* (2023.02); *G09G 2300/0413* (2013.01); *G09G 2300/0426* (2013.01); *G09G 2300/0842* (2013.01); *G09G 2310/0297* (2013.01); *G09G 2320/0233* (2013.01); *G09G 2330/021* (2013.01); *H10K 59/88* (2023.02)

(58) Field of Classification Search
CPC ..... G09G 3/3233; H10K 59/131; H10K 59/88
See application file for complete search history.

(56) References Cited

FOREIGN PATENT DOCUMENTS

| CN | 108470758 A | 8/2018 |
|---|---|---|
| CN | 113851493 A | 12/2021 |

*Primary Examiner* — Sardis F Azongha
(74) *Attorney, Agent, or Firm* — Anova Law Group, PLLC

(57) ABSTRACT

Display panel and display device are provided. The display panel includes a display area and a non-display area. The display panel includes a plurality of first subpixels on the substrate. A first subpixel of the plurality of first subpixels includes a first pixel circuit and a light-emitting element electrically connected to the first pixel circuit. The first pixel circuit at least includes a first type of double-gate transistor. A first gate of the first type of double-gate transistor is connected to a first control line. A second gate of the first type of double-gate transistor is connected to a second control line. The display panel further includes a second detection line having a same width as the second control line.

27 Claims, 37 Drawing Sheets

DISPLAY PANEL AND DISPLAY DEVICE

CROSS-REFERENCE TO RELATED APPLICATION

This application claims priority of Chinese Patent Application No. 202210744753.8, filed on Jun. 27, 2022, the entire contents of which are hereby incorporated by reference.

FIELD OF THE DISCLOSURE

The present disclosure generally relates to the field of display technology and, more particularly, relates to a display panel and a display device.

BACKGROUND

Organic light emitting diode (OLED) is one of hotspots in the field of current flat panel display research. Compared with liquid crystal display, OLED has advantages of low energy consumption, low production cost, self-illumination, wide viewing angle and fast response speed. At present, in the field of flat panel displays such as mobile phones, PDAs, and digital cameras, OLEDs have begun to replace traditional liquid crystal displays (LCDs). Design of driving circuit is a key technology to realize a display function. A driving circuit may generally include a scan driving circuit, a light-emitting control circuit, a data driving circuit, a pixel circuit, or the like. Design of pixel circuit is a core technical content of OLED display and has an important research significance. As a current driving device, an OLED display screen controls a luminous brightness of pixel units by controlling a current flowing into an OLED device in each pixel unit. In a process of forming an OLED display screen, it is often necessary to form a pixel circuit on the substrate to provide a driving current for the OLED device in each pixel unit.

In the existing technologies, to ensure a driving performance of a pixel circuit, line widths of different film layers need to be monitored during a circuit formation process on each film layer of the pixel circuit to ensure that a formed signal line meets a line width requirement and realize a signal transmission function thereof. At present, a way to monitor line width is mainly to use a professional machine to monitor line width. After a circuit formation of a film layer is completed, pictures of circuits to be monitored are taken. By using grayscale differences of the pictures, boundaries of line width patterns are automatically distinguished through the machine. Required line width information is obtained according to a measurement mode and an algorithm selected by the machine.

However, with the development of display technology, pixel circuits become more and more complex. When there are many film layer structures and many signal lines connected thereto, it often occurs that a plurality of signal lines connected to pixel circuits are disposed to overlap between different film layers on the substrate. When no other signal line overlaps above a signal line, the machine can easily distinguish the boundaries of line width patterns in photographed pictures. When other signal lines overlap under an upper signal line, a boundary of a line width pattern of the upper signal line is easily disturbed by a boundary of a signal line under the upper signal line, so it is difficult to accurately identify the boundary of the line width pattern of the upper signal line, resulting in a difficulty of accurately measuring a line width of the upper layer. However, line width variations of signal lines in the pixel circuits easily affect a signal transmission effect, thereby resulting in a quality degradation of a display screen.

Therefore, it is a technical problem to be solved urgently by a person skilled in the art to provide a display panel and a display device that can monitor line width in real time, improve monitoring accuracy, help ensure display quality, and have a simple and easy-to-operate monitoring method.

BRIEF SUMMARY OF THE DISCLOSURE

One aspect of the present disclosure provides a display panel. The display panel includes a display area and a non-display area. The display panel includes a plurality of first subpixels on the substrate. A first subpixel of the plurality of first subpixels includes a first pixel circuit and a light-emitting element electrically connected to the first pixel circuit. The first pixel circuit at least includes a first type of double-gate transistor. A first gate of the first type of double-gate transistor is connected to a first control line. A second gate of the first type of double-gate transistor is connected to a second control line. In the display area, the first control line and the second control line are disposed on different layers. A film layer where the second control line is located is on a side of a film layer where the first control line is located away from the substrate. At least part of an orthographic projection of the first control line corresponding to the first type of double-gate transistor on the substrate at least overlaps part of an orthographic projection of the second control line on the substrate. The display panel further includes a second detection line having a same width as the second control line.

Another aspect of the present disclosure provides a display device. The display device includes a display panel. The display panel includes a display area and a non-display area. The display panel includes a plurality of first subpixels on the substrate. A first subpixel of the plurality of first subpixels includes a first pixel circuit and a light-emitting element electrically connected to the first pixel circuit. The first pixel circuit at least includes a first type of double-gate transistor. A first gate of the first type of double-gate transistor is connected to a first control line. A second gate of the first type of double-gate transistor is connected to a second control line. In the display area, the first control line and the second control line are disposed on different layers. A film layer where the second control line is located is on a side of a film layer where the first control line is located away from the substrate. At least part of an orthographic projection of the first control line corresponding to the first type of double-gate transistor on the substrate at least overlaps part of an orthographic projection of the second control line on the substrate. The display panel further includes a second detection line having a same width as the second control line.

Other aspects of the present disclosure can be understood by a person skilled in the art in light of the description, the claims, and the drawings of the present disclosure.

BRIEF DESCRIPTION OF THE DRAWINGS

Accompanying drawings, which are incorporated in and constitute part of the present specification, illustrate embodiments of the present disclosure and together with descriptions thereof, serve to explain principles of the present disclosure.

DETAILED DESCRIPTION

Various exemplary embodiments of the present disclosure will be described in detail with reference to the accompanying drawings. It should be noted that, unless specifically stated otherwise, a relative arrangement of components and steps, numerical expressions and numerical values set forth in the embodiments do not limit the scope of the present disclosure.

The following description of at least one exemplary embodiment is merely illustrative and is not intended to limit the disclosure and applications or uses thereof.

Techniques, methods, and apparatus known to a person skilled in the art may not be discussed in detail, but where appropriate, such techniques, methods, and apparatus should be considered as part of the present specification.

In all examples illustrated and discussed herein, any specific value should be construed as illustrative only and not as a limitation. Accordingly, other examples of exemplary embodiments may have different values.

It should be noted that similar numerals and letters refer to similar items in the accompanying drawings below. Therefore, once an item is defined in one accompanying drawing, the item does not need further discussion in subsequent accompanying drawings.

Figure 1:
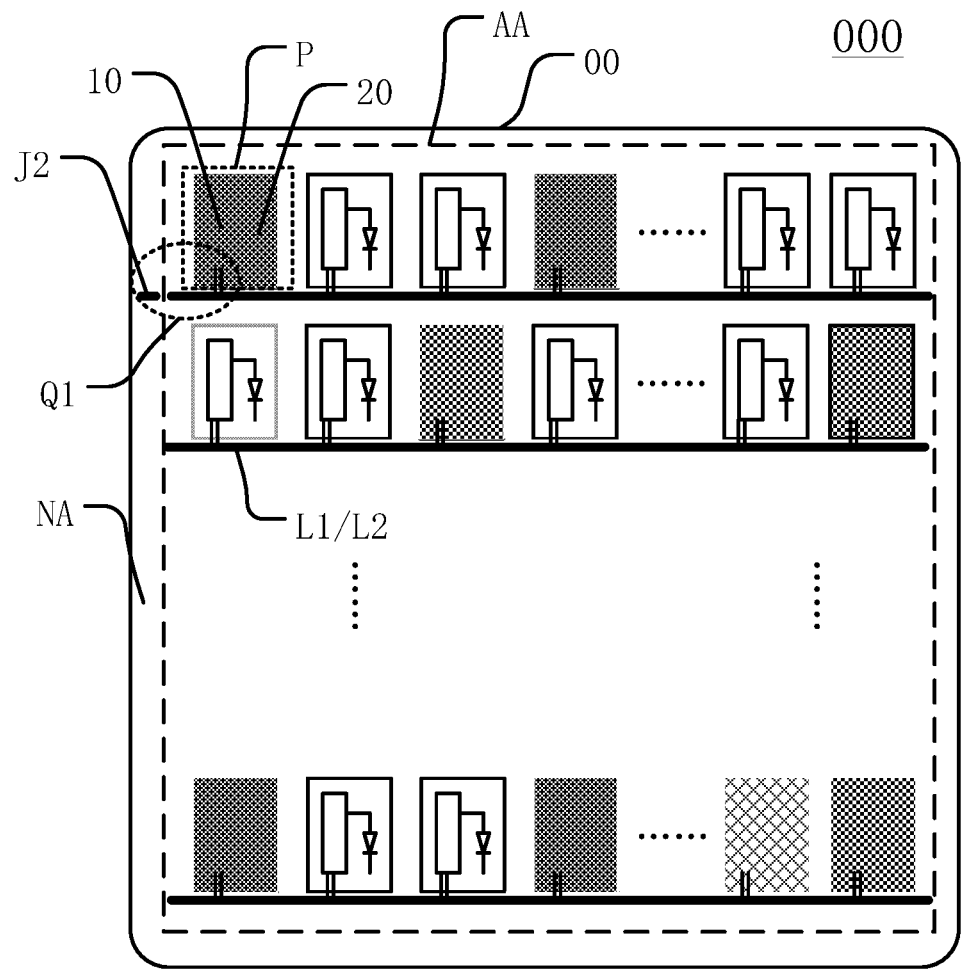
FIG. 1 illustrates a structural plan view of a display panel consistent with various embodiments of the present disclosure.
Figure 2:
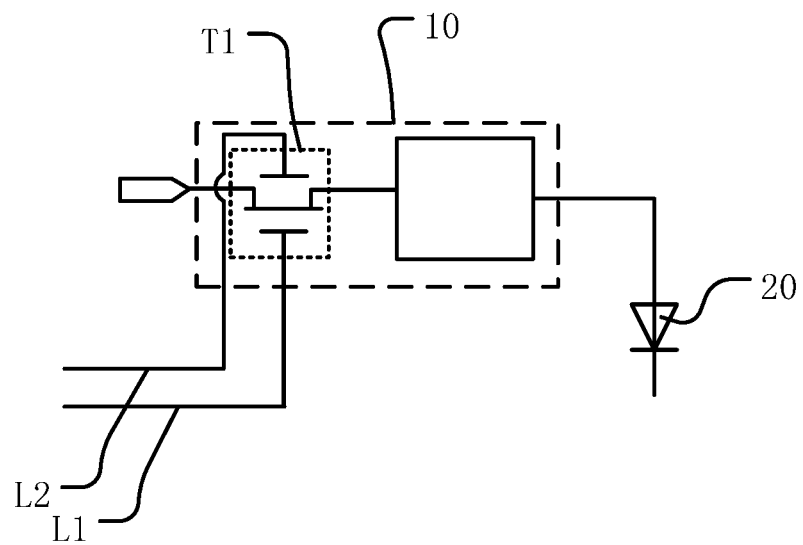
FIG. 2 illustrates a schematic diagram of an electrical connection structure of a first pixel circuit and a light-emitting element in a first subpixel in FIG. 1.
Figure 3:
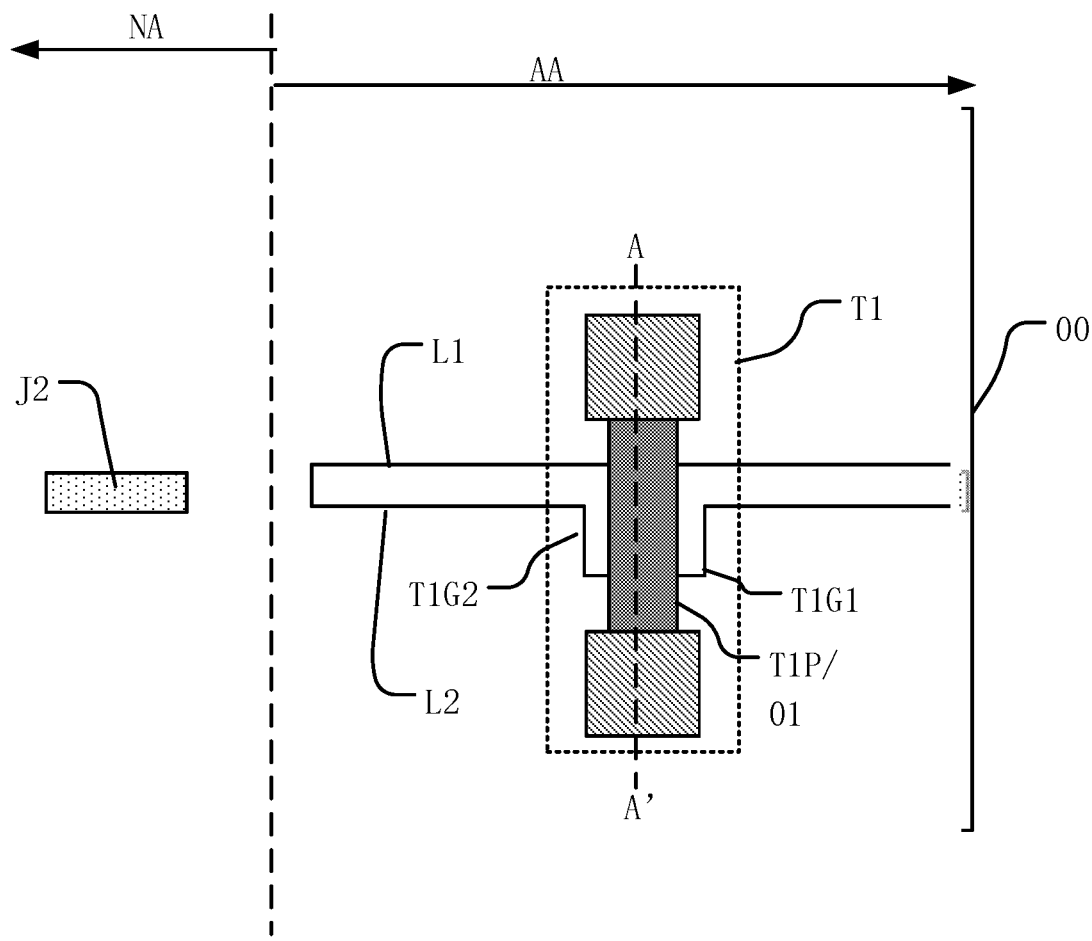
FIG. 3 illustrates a schematic diagram of a local planar structure of a Q1 region on a substrate in FIG. 1.
Figure 4:
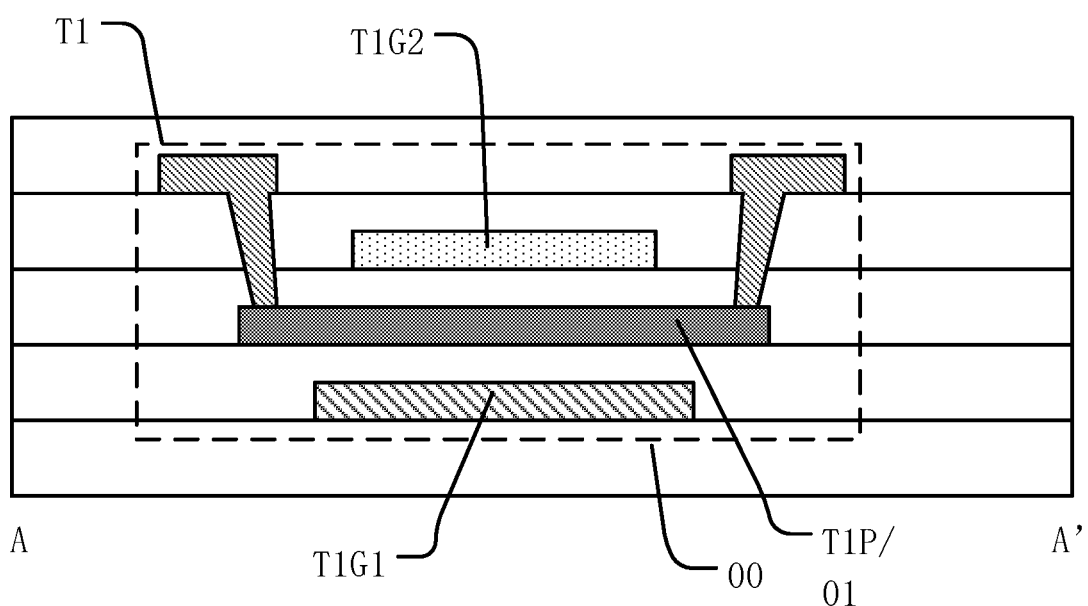
FIG. 4 illustrates a cross-sectional structural view in a direction of A-A' in FIG. 3.

Referring to FIGS. 1-4, FIG. 1 illustrates a structural plan view of a display panel consistent with various embodiments of the present disclosure, illustrates a schematic diagram of an electrical connection structure of a first pixel circuit and a light-emitting element in a first subpixel in FIG. 1, FIG. 3 illustrates a schematic diagram of a local planar structure of a Q1 region on a substrate in FIG. 1, and FIG. 4 illustrates a cross-sectional structural view in a direction of A-A' in FIG. 3. It can be understood that transparencies are filled in FIG. 1 and FIG. 3 to clearly illustrate a structure of one embodiment. In the embodiment, A display panel 000 includes a display area AA and a non-display area NA.

The display panel 000 includes a substrate 00 (not filled) on which the display area AA includes a plurality of first subpixels P. A first subpixel P includes a first pixel circuit 10 and a light-emitting element 20 electrically connected thereto. The first pixel circuit 10 at least includes a first type of double-gate transistor T1. A first gate T1G1 of the first type of double-gate transistor T1 is connected to a first control line L1. A second gate T1G2 of the first type of double-gate transistor T1 is connected to a second control line L2. In the display area AA, the first control line L1 and the second control line L2 are disposed on different layers, and a film layer where the second control line L2 is located is on a side of a film layer where the first control line L1 is located away from the substrate 00. At least part of an orthographic projection of the first control line L1 corresponding to the first type of double-gate transistor T1 on the substrate 00 at least overlaps part of an orthographic projection of the second control line L2 on the substrate 00. The display panel 000 further includes a second detection line J2 having a same width as the second control line L2.

Specifically, the display panel 000 provided in the embodiment may be an organic light emitting diode (OLED) display panel. The display area AA of the display panel 000 may include a plurality of first subpixels P, which can be understood as subpixels used for display on the display panel 000. Optionally, the plurality of first subpixels P may include a plurality of different colors represented by different filling patterns in FIG. 1, e.g., may include at least red subpixels, green subpixels, blue subpixels, and may also include white subpixels and the like. The plurality of first subpixels P may be disposed in an array on the display panel 000 or may also be disposed in another arrangement. In FIG. 1, the array arrangement of a plurality of first subpixels P is taken as an example for illustration. It can be understood that FIG. 1 is illustrated by taking an example that an orthographic projection shape of a first subpixel P to a light-emitting surface of the display panel 000 is a strip. During specific implementation, a shape of the first subpixel P includes but is not limited to the above shape and can be designed according to actual needs.

As shown in FIG. 2, in one embodiment, the first subpixel P includes a first pixel circuit 10 and a light-emitting element 20 electrically connected thereto, both of which are formed on the substrate 00. That is, the substrate 00 can be used as a carrier substrate of the display panel 00. The light-emitting element 20 may be an organic light-emitting diode (OLED), which is not limited herein and may also be a miniature light-emitting diode, such as a Mini LED or a Micro LED. The first pixel circuit 10 is configured to transmit a light-emitting driving current to the light-emitting element 20 under a signal action of a driving signal line (e.g., scan line, data line, voltage signal line, or the like including the first control line L1, the second control line L2, not shown) on the display panel 000 to provide the driving current for the light-emitting element 20 to emit light.

As shown in FIG. 4, in one embodiment, the first pixel circuit 10 at least includes a first type of double-gate transistor T1. Compared with a single-gate transistor, an induced charge generated by a potential between a first gate T1G1 and a second gate T1G2 of the first type of double-gate transistor T1 is no longer limited to a bottom interface area or a top interface area of an active part of the first type of double-gate transistor T1. The active part of the first type of double-gate transistor T1 can be understood as an active part T1P located between the first gate T1G1 and the second gate T1G2. A material of the active part T1P can be a semiconductor, a metal oxide, or the like, which is not limited herein. Since the first gate T1G1 overlaps the second gate T1G2 on upper and lower surfaces of the active part, induced charges generated by a potential between the first gate T1G1 and the second gate T1G2 of a first type of double-gate transistor T1 can extend to an entire area of the active part in a thickness direction of the active part, so as to increase a carrier ion concentration in the first type of double-gate transistor T1, thereby effectively improving carrier mobility of the first type of double-gate transistor T1, and further improving resolution of the display panel. The first pixel circuit 10 includes the first type of double-gate transistor T1. A driving capability of the first type of double-gate transistor T1 can be improved by utilizing a relatively high mobility of a double-gate transistor. Therefore, the first type of double-gate transistor T1 is used in the first pixel circuit 10, which can make the first pixel circuit 10 suitable for a display panel with a large size and a high resolution.

Optionally, as shown in FIG. 3 and FIG. 4, in one embodiment, an active layer 01 is included between the film layer where the first control line L1 is located and the film layer where the second control line L2 is located. The active part T1P of the first type of double-gate transistor T1 is on the active layer 01. At least part of the orthographic projection of the first control line L1 on the substrate 00 overlaps an orthographic projection of the active part T1P of the first type of double-gate transistor T1 on the substrate 00. At least part of an orthographic projection of the second control line L2 on the substrate 00 overlaps the orthographic projection of the active part T1P of the first type of double-gate transistor T1 on the substrate 00. The embodiment explains that in a process of forming the display panel 000, the active layer 01 is further disposed between the film layer where the first control line L1 is located and the film layer where the second control line L2 is located. The active layer 01 is insulated from the film layer where the first control line L1 is located and the film layer where the second control line L2 is located. By patterning the active layer 01, the active part T1P of the first type of double-gate transistor T1 can be on the active layer 01, part of the orthographic projection of the first control line L1 on the substrate 00 overlaps the orthographic projection of the active part T1P of the first type of double-gate transistor T1 on the substrate 00, and at least part of the orthographic projection of the second control line L2 on the substrate 00 overlaps the orthographic projection of the active part T1P of the first type of double-gate transistor T1 on the substrate 00. That is, the active part T1P is disposed in part of an area between the first control line L1 and the second control line L2, forming a double-gate structure of the first type of double-gate transistor T1 including the first gate T1G1 as a bottom gate and the second gate T1G2 as a top gate.

It can be understood that in FIG. 2, structures of the first pixel circuit 10 other than the first type of double-gate transistor T1 are only represented by a block diagram. Other specific structures of the first pixel circuit 10 are not limited herein. During specific implementation, the first pixel circuit 10 includes, but is not limited to, structures shown in FIG. 2. The first pixel circuit 10 may also include other structures that can realize the light-emitting element 20 to emit light, such as a reset module, a driving module, and a data signal writing module, a light-emitting module, and the like, which are not repeated herein. For details, references can be made to a pixel circuit structure in a related art.

It can be understood that the first pixel circuit 10 for providing the light-emitting element 20 with a driving current to drive the light-emitting element 20 to emit light may include a plurality of transistors. The first type of double-gate transistor T1 in the embodiment may be one, two or more of a plurality of transistors included in the first pixel circuit 10. There is no specific limitation on which module in the first pixel circuit 10 the first type of double-gate transistor T1 is, provided that the first pixel circuit 10 at least includes the first type of double-gate transistor T1. For example, a reset module in the first pixel circuit 10 may include the first type of double-gate transistor T1, or a driving module in the first pixel circuit 10 may include the first type of double-gate transistor T1, or a threshold compensation module in the first pixel circuit 10 may include the first type of double-gate transistor T1, which is not limited herein.

In one embodiment, the first gate T1G1 of the first type of double-gate transistor T1 is connected to the first control line L1, and the second gate T1G2 of the first type of double-gate transistor T1 is connected to the second control line L2. Optionally, the first gate T1G1 and the first control line L1 may be disposed on a same layer and connected to each other, and the second gate T1G2 and the second control line L2 may be disposed on a same layer and connected to each other. That is, two gates of a same first type of double-gate transistor T1 are respectively given control signals by two control lines. A first control signal can be given to the first gate T1G1 through the first control line L1, and a second control signal can be given to the second gate T1G2 to turn on or off the first type of double-gate transistor T1. The first control line L1 and the second control line L2 may be two of a plurality of signal lines on the display panel 000, and the first control line L1 and the second control line L2 are disposed on different layers in the display area AA. The film layer where the second control line L2 is located is on a side of the film layer where the first control line L1 is located away from the substrate 00. That is, the layer where the first control line L1 is located is closer to the substrate 00 than the layer where the second control line L2 is located. The first control line L1 can be understood as a signal line on a lower layer, and the second control line L2 can be understood as a signal line on an upper layer. During a process of forming the display panel 000, the first control line L1 is formed first, and the second control line L2 is formed later. In the embodiment, at least part of the orthographic projection of the first control line L1 corresponding to the first type of double-gate transistor T1 on the substrate 00 at least partially overlaps the orthographic projection of the second control line L2 on the substrate 00, thereby reducing spaces occupied by the first control line L1 and the second control line L2 in the display area AA, and avoiding that when all the orthographic projection of the first control line L1 on the substrate 00 does not overlap the projection of the second control line L2 on the substrate 00 at all, too many spaces are occupied in the display area AA to affect a transmittance of the display panel 000.

In one embodiment, in a process of forming the display panel 000, after the first control line L1 is formed on the substrate 00, a line width of the first control line L1 needs to be monitored to ensure a signal transmission effect of the first control line L1, which not only can avoid wire breakage caused by too small line width, but also can avoid an overload of the first control line L1 to affect a signal transmission caused by too large line width. When a line width is monitored, if no other signal lines overlap the first control line L1 between the first control line L1 and the substrate 00, a boundary of a line width pattern of the first control line L1 in a picture including the first control line L1 on the substrate 00 can be automatically distinguished by a machine, thereby realizing monitoring the line width of the first control line L1. After the second control line L2 is formed, since the orthographic projection of the first control line L1 on the substrate 00 at least partially overlaps the orthographic projection of the second control line L2 on the substrate 00, when the boundary of the line width pattern is distinguished in a picture including the first control line L1 and the second control line L2 on the substrate 00 taken by the machine, a boundary of a line width pattern of the second control line L2 is easily disturbed by the boundary of the line width pattern of the first control line L1. Therefore, it is difficult to accurately identify the boundary of the line width pattern of the second control line L2, which make it difficult to accurately measure a line width of the second control line L2.

It should be noted that, in the embodiment, an overall length extending direction of the first control line L1 is defined as a first length direction. The line width of the first control line L1 can be understood as a width of the first control line L1 in a direction perpendicular to the first length direction of the first control line L1. An overall length extension direction of the second control line L2 is defined as a second length direction. The line width of the second control line L2 can be understood as a width of the second control line L2 perpendicular to the second length direction of the second control line L2. Optionally, the first length direction of the first control line L1 and the second length direction of the second control line L2 are a same direction. That is, the overall extending directions of the first control line L1 and the second control line L2 in the embodiment are basically same and extend in a same direction.

In one embodiment, to solve the above problem, the display panel 000 is set to further include the second detection line J2 that has s same width as the second control line L2. A setting position of the second detection line J2 on the display panel 000 is not specifically limited herein. Optionally, the second detection line J2 may be in the display area AA, or may be in the non-display area NA. When the second detection line J2 is in the display area AA, the second detection line J2 can be set in any free space in the display area AA and the second detection line J2 can also multiplex some floating signal lines in the display area AA into detection lines for line width monitoring, provided that the second detection line J2 and the second control line L2 have a same width. It can be understood that, in FIG. 1, the second detection line J2 being in the non-display area NA is taken as an example for illustration. During specific implementation, the second detection line J2 may be at another position on the display panel 000. In the embodiment, by setting the second detection line J2 with a same width as the second control line L2 on the display panel 000, the line width of the second control line L2 can be obtained by monitoring a line width of the second detection line J2. Since a position of the second detection line J2 avoids an overlapping area with the first control line L1, that is, no other interference lines overlap the second detection line J2 under the second detection line J2, a boundary of a line width pattern of the second detection line J2 in a picture including the second detection line J2 on the substrate 00 can be automatically distinguished by a machine. Therefore, the line width of the second detection line J2 is accurately obtained, and the line width of the second control line L2 is obtained at a same time. The display panel 000 provided in the embodiment can monitor a signal trace width on the display panel 000 in real time by setting the second detection line J2, which not only make a monitoring method simple and easy to operate, but also can improve monitoring accuracy and helps ensure display quality of a formed display panel 000.

It can be understood that the embodiment only exemplarily illustrates a connection structure included in the first pixel circuit 10, which is included but not limited herein during specific implementation. The first pixel circuit 10 may also include other electrically connected module structures represented by a block diagram in FIG. 2 for realizing the light-emitting element 20 to emit light, thereby realizing a display effect of the display panel. For details, references may be made to a pixel circuit structure in a related art, which is not repeated herein. It can be understood that, in the accompanying drawings in the embodiment, the first type of double-gate transistor T1 being an N-type of double-gate transistor is taken as an example for illustration. During specific implementation, the first type of double-gate transistor T1 may also be a P-type of double-gate transistor, which is not limited herein.

It should be noted that a structure of the display panel 000 in the embodiment includes but is not limited to the above structures. During specific implementation, the display panel 000 may further include other structures capable of realizing a display function, which are not repeated herein. For details, references can be made to a display panel structure of an organic light-emitting diode in a related art.

Optionally, referring to FIGS. 1-4, in one embodiment, the second detection line J2 and the second control line L2 can be disposed on a same layer. In FIG. 3, a same filling pattern indicates a same layer structure. Not only can the second detection line J2 and the second control line L2 in the display area AA have a same line width, but also the second detection line J2 and the second control line L2 that needs to monitor line width can be formed on a same film layer. Therefore, it is possible to avoid disposing an additional film layer for the second detection line J2 on the display panel, which helps reduce an overall thickness of the display panel. In a process of forming the display panel 000, the second detection line J2 and the second control line L2 can also be formed on a same film layer and in same process with same steps, which helps improve process efficiency.

Figure 5:
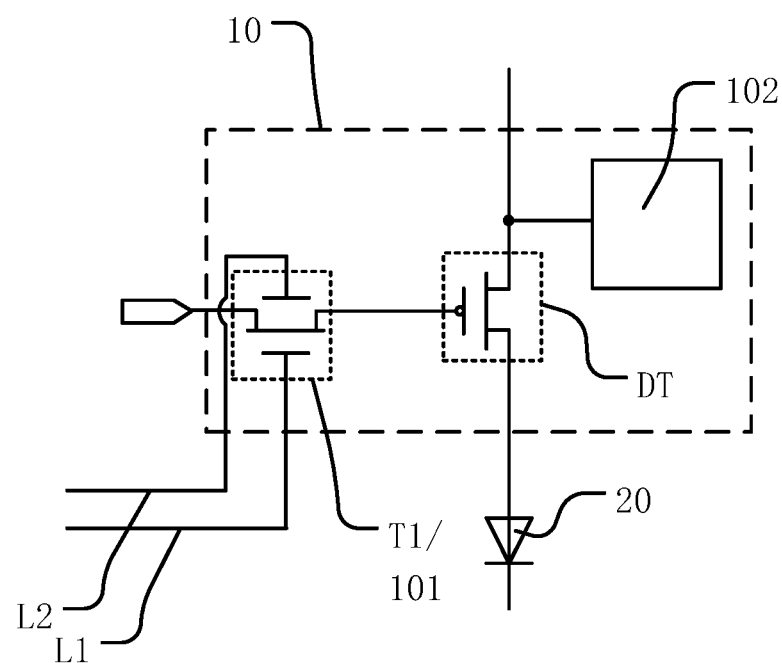
FIG. 5 illustrates another schematic diagram of an electrical connection structure of a first pixel circuit and a light-emitting element in a first subpixel in FIG. 1.

Optionally, referring to FIG. 1 and FIG. 5, FIG. 5 illustrates another schematic diagram of an electrical connection structure of a first pixel circuit and a light-emitting element in a first subpixel in FIG. 1. In one embodiment, the first pixel circuit 10 may further include a reset module 101, a drive transistor DT, and a data writing module 102. A control end of the drive transistor DT may be electrically connected to the reset module 101. A first electrode of the driving transistor DT can be electrically connected to the data writing module 102. A second electrode of the driving transistor DT can be electrically connected to an anode of the light-emitting element 20. The driving transistor DT is configured to generate a driving current in response to a voltage of a control end of the driving transistor DT to drive the light-emitting element 20 to emit light. The data writing module 102 is configured to write a data voltage signal into a control end of the driving transistor DT. The reset module 101 is configured to initialize the control end of the driving transistor DT before the light-emitting element 20 emits light. In the first pixel circuit 10 shown in FIG. 5, the reset module 101 may include the first type of double-gate transistor T1. Since a leakage current of a double-gate transistor is much smaller than a leakage current of a single-gate transistor, the reset module 101 adopts the first type of double-gate transistor T1. When a reset phase is complete, after the first type of double-gate transistor T1 in the reset module 101 is turned off, a potential of the control end of the driving transistor DT can be kept stable, so as to avoid an occurrence of a potential drop of the control end of the driving transistor DT that affects light-emitting brightness of the light-emitting element 20, thereby helping improve color shift phenomenon at low grayscale.

Optionally, in one embodiment, in FIG. 5, the driving transistor DT being a P-type low-temperature polysilicon transistor is taken as an example for illustration. During specific implementation, the driving transistor DT includes, but is not limited to, a P-type low-temperature polysilicon transistor. The driving transistor DT may also be another type of transistor. Since the driving transistor DT is a P-type low-temperature polysilicon transistor, characteristics of high mobility and high driving speed of a low-temperature polysilicon transistor can be utilized. Therefore, when the data writing module 102 writes a data voltage signal, a response speed of the driving transistor DT is fast, and a data voltage signal can be written quickly to avoid an insufficient charging phenomenon caused by a long on-time of the driving transistor DT. Optionally, as shown in FIG. 5, in one embodiment, the first type of double-gate transistor T1 in the reset module 101 may be an N-type oxide transistor, such as an N-type indium gallium zinc oxide (IGZO). The first control line L1 is turned on when a high level control signal is input to the first gate T1G1, and the second control line L2 is turned on when a high level control signal is input to the second gate T1G2. Since a leakage current of a IGZO single-gate transistor is smaller than a leakage current of a low-temperature polysilicon transistor, when the reset module 101 is electrically connected to the control end of the driving transistor DT, a charge leakage of the control end of the driving transistor DT during low-frequency driving can be prevented, thereby effectively solving a leakage current problem during low-frequency driving. Therefore, design of the first pixel circuit 10 in the embodiment is also suitable for realizing low-frequency driving, which helps reduce a power consumption of the display panel. Although a low leakage current of an IGZO single-gate transistor can effectively solve a current leakage problem during low-frequency driving. However, an IGZO single-gate transistors has a low mobility, but an organic light-emitting diode as a current-driven device requires a high mobility. Therefore, in the embodiment, an N-type IGZO single-gate transistor of the reset module 101 is designed as an N-type IGZO double-gate transistor. A high mobility of a double-gate transistor can be utilized to improve driving capability thereof, thereby solving the leakage current problem during low-frequency driving. A high mobility requirement of a current-mode driver can also be met by utilizing a characteristic of high mobility of a double-gate transistor.

Optionally, in one embodiment, if another module such as the data writing module 102 include transistors, the transistors of the module can still be designed as low-temperature polysilicon transistors. Therefore, provided that a portion of the first pixel circuit 10 that is prone to leakage (e.g., a portion connected to the control end of the driving transistor DT) adopts double-gate transistors of IGZO, the pixel circuit can maintain a strong driving capability by using the low-temperature polysilicon transistors. In the embodiment, the first pixel circuit 10 combines thin film transistors of low-temperature polysilicon transistors and IGZO transistors. Therefore, the display panel 000 adopting the first pixel circuit 10 has characteristics of strong driving capability and low power consumption at a same time and is suitable for high frequency display and low frequency display at a same time.

It should be noted that the embodiment only illustrates that the reset module 101 in the first pixel circuit 10 may include the first type of double-gate transistor T1 of the embodiment. In the control lines to which two gates of the first type of double-gate transistor T1 are respectively connected, the line width of the second control line L2 on an upper layer can be monitored by the second detection line J2 in the above embodiment. During specific implementation, other modules of the first pixel circuit 10 may also adopt double-gate transistors, which are not limited herein.

It can be understood that an electrical connection between two structures in the embodiment can be understood as a variety of ways in which electrical connection can be achieved between the two structures. If no other structures are included between the two structures, the electrical connection can be realized by direct connection. If other structures are included between the two structures, the electrical connection can also be realized by disposing other conductive structures between the two structures. A specific arrangement structure of the electrical connection is not limited herein. During specific implementation, a specific arrangement structure of the electrical connection can be understood according to an actual design structure of the pixel circuit. For example, in the embodiment, the second electrode of the driving transistor is electrically connected to the anode of the light-emitting element 20, which can also be understood that the first pixel circuit 10 may further include a light-emitting control transistor connected to the anode of the light-emitting element 20. When the light-emitting control transistor is turned on, an electrical connection can also be achieved between the second end of the driving transistor and the anode of the light-emitting element 20.

Figure 6:
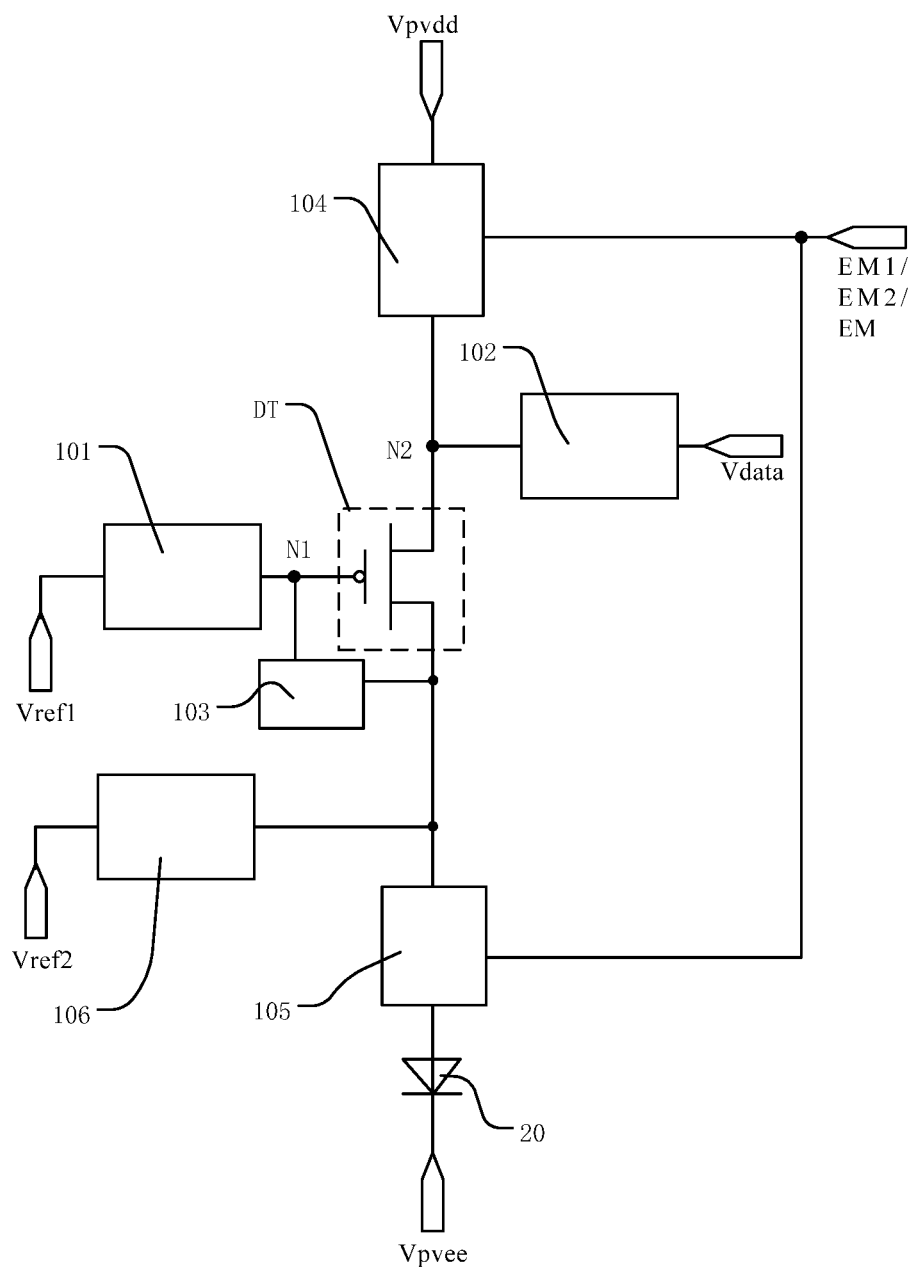
FIG. 6 illustrates another schematic diagram of an electrical connection structure of a first pixel circuit and a light-emitting element in a first subpixel in FIG. 1.

In some optional embodiments, referring to FIG. 1 and FIG. 6, FIG. 6 illustrates another schematic diagram of an electrical connection structure of a first pixel circuit and a light-emitting element in a first subpixel in FIG. 1. In one embodiment, the first pixel circuit 10 includes a driving transistor DT, a data writing module 102, a compensation module 103, a first lighting control module 104, a second lighting control module 105, and a first reset module 101 (i.e., a reset module connected to a control end of the driving transistor DT in FIG. 5) and a second reset module 106, that are electrically connected. A first end of the first lighting control module 104 is connected to a first power supply signal Vpvdd, and a second end of the first lighting control module 104 is connected to the first electrode of the driving transistor DT. A first end of the data writing module 102 is connected to a data voltage signal Vdata, and a second end of the data writing module 102 is connected to a first electrode of the driving transistor DT. A first end of the compensation module 103 is connected to a gate of the drive transistor DT (i.e., the control end of the drive transistor DT), and a second end of the compensation module 103 is connected to a second electrode of the drive transistor DT. A first end of the first reset module 101 is connected to a first reset signal Vref1, and a second end of the first reset module 101 is connected to a gate of the driving transistor DT. A first end of the second reset module 106 is connected to a second reset signal Vref2, and a second end of the second reset module 106 is connected to an anode of the light-emitting element 20. A first end of the second light emitting control module 105 is connected to a second electrode of the driving transistor DT, a second end of the second light emitting control module 105 is connected to an anode of the light emitting element 20, and a cathode of the light emitting element 20 is connected to a second power supply signal Vpvee.

The embodiment explains that the first pixel circuit 10 includes the driving transistor DT, the data writing module 102 and the first reset module 101, and further includes the compensation module 103, the first lighting control module 104, and the second lighting control module 105 and the second reset module 106, that are electrically connected. The first lighting control module 104 is connected in series between the first power supply signal Vpvdd and the first electrode of the driving transistor DT. The second light emitting control module 105 is connected in series between the anode of the light emitting element 20 and the second electrode of the driving transistor DT. The first light-emitting control module 104 and the second light-emitting control module 105 are configured to provide a light-emitting control signal for the light-emitting element 20 in a light-emitting stage of the light-emitting element 20. Optionally, in one embodiment, the first lighting control module 104 may be connected to a first lighting control signal EM1 and the second lighting control module 105 may be connected to a second lighting control signal EM2. The first lighting control signal EM1 and the second control signal EM2 is configured to control whether the first lighting control module 104 and the second lighting control module 105 are turned on or not respectively. Specifically, the first end of the first lighting control module 104 can be connected to a first power supply signal Vpvdd. When the first lighting control signal EM1 is a valid signal to control the first lighting control module 104 to be turned on, the first power supply signal Vpvdd is transmitted to the first electrode of the driving transistor DT. Further optionally, the first lighting control signal EM1 may be connected to a first lighting control signal line (not shown) on the display panel 000, and the second lighting control signal EM2 may be connected to a second lighting control signal line (not shown) on the display panel 000. The first end of the second light emitting control module 105 is connected to the second electrode of the driving transistor DT, and the second end of the second light emitting control module 105 is connected to the anode of the light emitting element 20. When the second light-emitting control signal EM2 is a valid signal to control the second light-emitting control module 105 to be turned on, a driving current generated by the driving transistor DT can drive the light-emitting element 20 to emit light. The other end of the second light emitting control module 105 is connected to the anode of the light emitting element 20 for realizing a path among the first power supply signal Vpvdd, the first lighting control module 104, the driving transistor DT, the second lighting control module 105, the light-emitting element 20, and the second power supply signal Vpvee.

In one embodiment, through a control of the first lighting control signal EM1 and the second lighting control signal EM2, the first lighting control module 104 and the second lighting control module 105 can be turned on in a light-emitting stage of the light-emitting element 20 to provide a current path for the light-emitting element 20 to emit light. The first lighting control module 104 and the second lighting control module 105 are controlled to be turned off in another stage (e.g., a reset stage, a data writing stage, or the like) to prevent the light-emitting element 20 from erroneously emitting light in a non-light-emitting stage. Optionally, as shown in FIG. 6, the first lighting control signal EM1 and the second lighting control signal EM2 can be connected by a same lighting control signal line to provide a lighting control signal of the two lighting control modules. That is, the first lighting control module 104 and the second lighting control module 105 may receive a same lighting control signal EM, so that the first lighting control signal EM1 for turning on the first lighting control module 104 and the second light-emitting control signal EM2 for turning on the second light-emitting control module 105 can be shared, which helps reduce number of signal lines on the display panel 000 adopting the first pixel circuit 10, improve transmittance of the display panel or increase wiring space of the display panel.

In one embodiment, the first end of the compensation module 103 is connected to the gate of the driving transistor DT (i.e., a first node N1), and the second end of the compensation module 103 is connected to the second electrode of the driving transistor DT. The compensation module 103 is configured to compensate a threshold voltage of the driving transistor DT. The compensation module 103 can short-circuit the gate and the second electrode of the driving transistor DT in a turn-on state, and generate a voltage difference between the gate and the first electrode of the driving transistor DT through the threshold voltage of the driving transistor DT. The driving transistor DT is turned on, and the data writing module 102 inputs the data voltage signal Vdata to a second node N2. The data voltage signal Vdata contains the threshold voltage to be compensated, and is transmitted to the gate of the driving transistor DT, thereby compensating for a threshold voltage deviation of the driving transistor DT.

In one embodiment, the first end of the first reset module 101 is connected to the first reset signal Vref1, the second end of the first reset module 101 is connected to the gate of the driving transistor DT, and the first reset module 101 is configured to reset the gate of the driving transistor DT. Optionally, the first reset signal Vref1 may be provided by a first reference voltage signal line on the display panel 000, and the first reset module 101 may connect the first reset signal Vref1 to the gate of the driving transistor DT when the first reset module 101 is in a turn-on state, The gate of the driving transistor DT can be reset by using a low-level potential of the driving transistor DT, thereby facilitating a conduction of the driving transistor DT after the reset operation is completed.

In one embodiment, the first end of the second reset module 106 is connected to the second reset signal Vref2, and the second end of the second reset module 106 is connected to the anode of the light-emitting element 20 to provide a second reset signal Vref2 for the light-emitting element 20 when the second reset module 106 is turned on. Optionally, the second reset signal Vref2 can be provided by a second reference voltage signal line on the display panel 000. The second reset signal Vref2 reset the anode of the light-emitting element 20 by a low-level potential of the second reset signal Vref2 to initialize the anode of the light-emitting element 20, thereby improving residual of the data signal of a previous frame, improving afterimage phenomenon, and improving display effect of the display panel.

It can be understood that the first reset module 101, the data writing module 102, the first lighting control module 104, the second lighting control module 105, the compensation module 103, and the second reset module 106 in FIG. 6 of the embodiment are illustrated by a block diagram, which does not represent actual structures thereof. During specific implementation, connection structures of the first reset module 101, the data writing module 102, the first lighting control module 104, the second lighting control module 105, the compensation module 103, and the second reset module 106 may include electrical connection structures such as transistors. A conduction of transistors in each module is controlled by an enable signal of the gate of the transistor to realize a connection between a module and the driving transistor DT. An internal specific electrical connection structure of each module is not limited herein. During specific implementation, references may also be made to a light emitting control module and a compensation module of a pixel circuit in a related art, which are not repeated herein.

Figure 7:
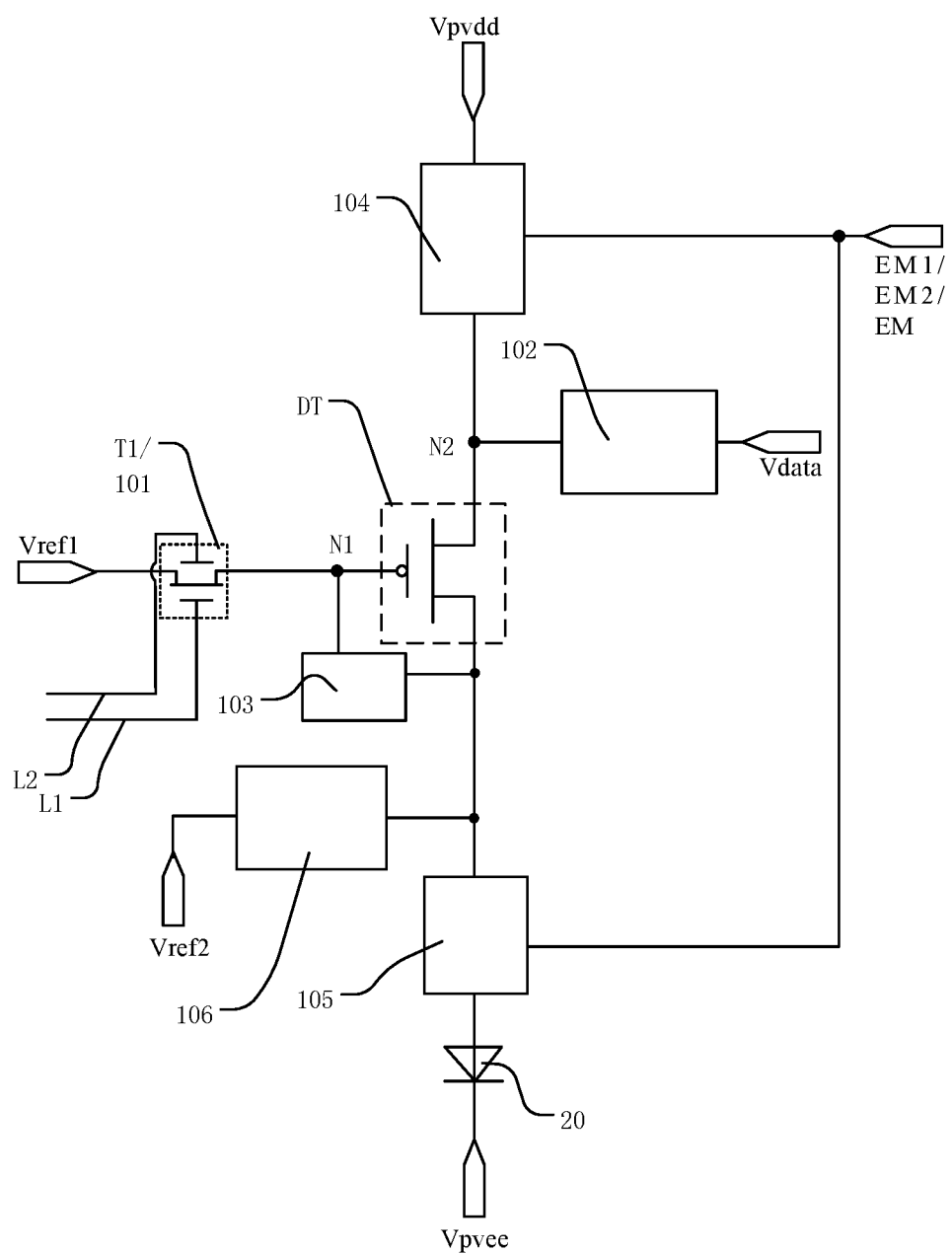
FIG. 7 illustrates another schematic diagram of an electrical connection structure of a first pixel circuit and a light-emitting element in a first subpixel in FIG. 1.
Figure 8:
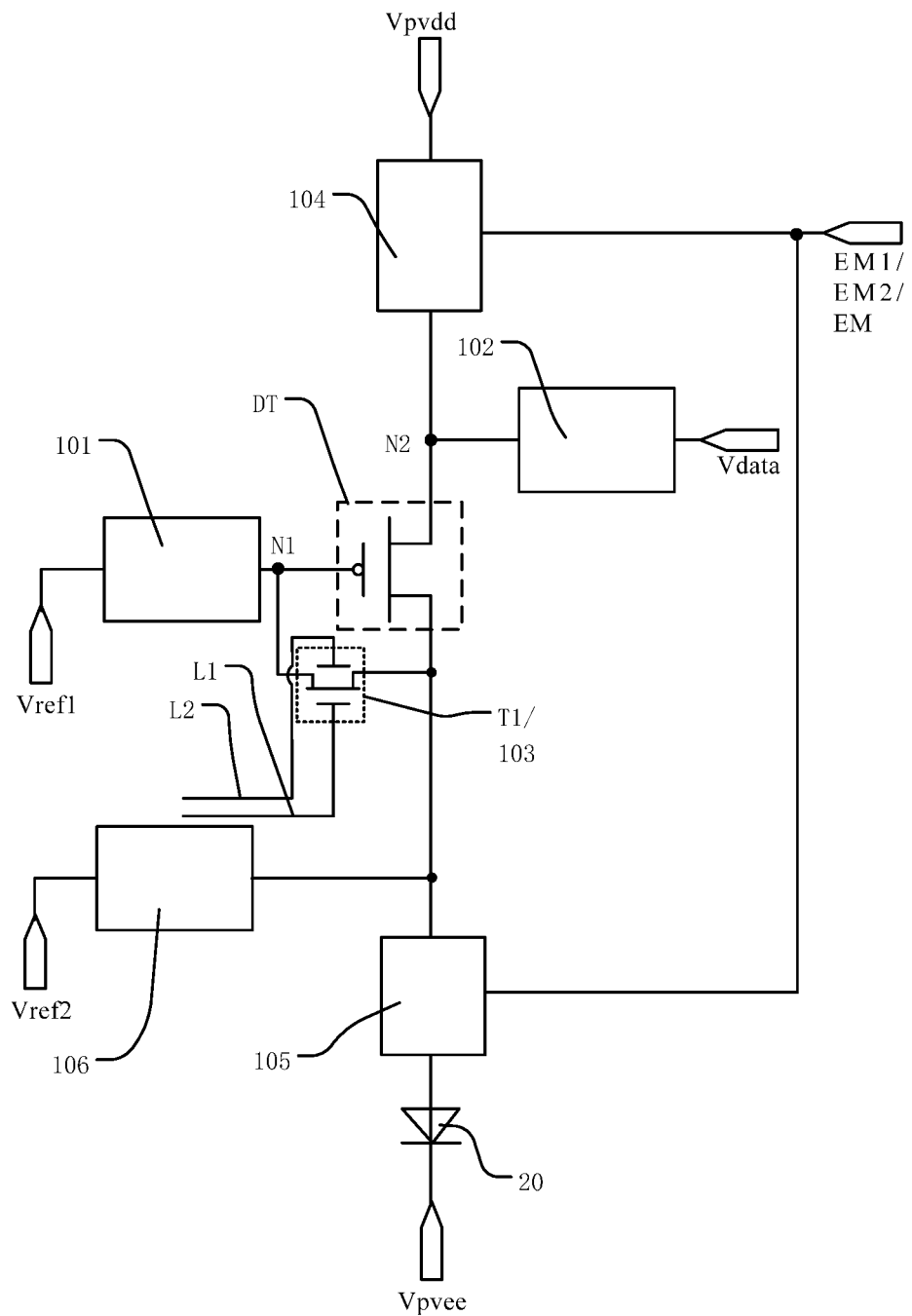
FIG. 8 illustrates another schematic diagram of an electrical connection structure of a first pixel circuit and a light-emitting element in a first subpixel in FIG. 1.
Figure 9:
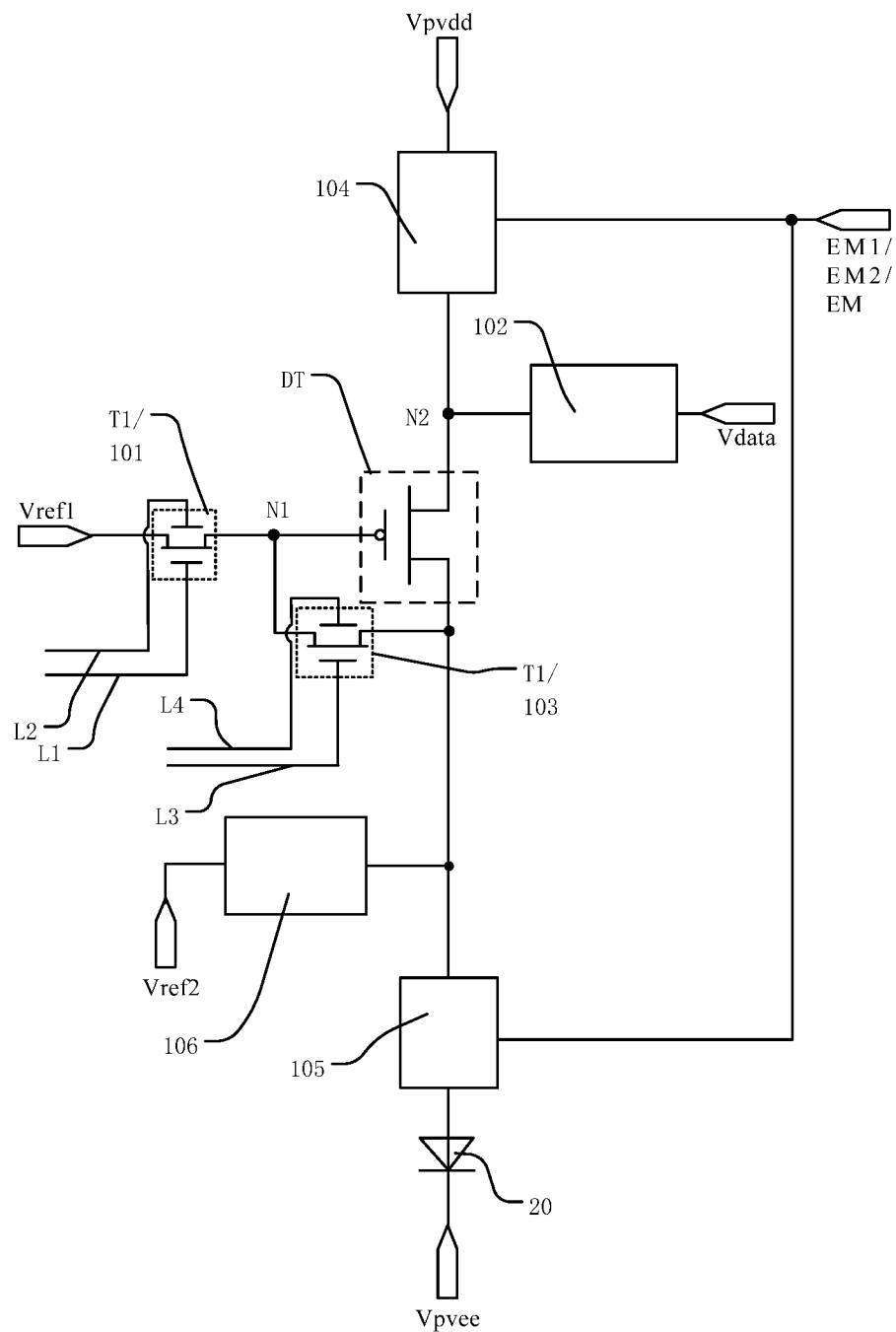
FIG. 9 illustrates another schematic diagram of an electrical connection structure of a first pixel circuit and a light-emitting element in a first subpixel in FIG. 1.

Optionally, as shown in FIG. 1, FIG. 7, FIG. 8 and FIG. 9, FIG. 7 illustrates another schematic diagram of an electrical connection structure of a first pixel circuit and a light-emitting element in a first subpixel in FIG. 1. FIG. 8 illustrates another schematic diagram of an electrical connection structure of a first pixel circuit and a light-emitting element in a first subpixel in FIG. 1. FIG. 9 illustrates another schematic diagram of an electrical connection structure of a first pixel circuit and a light-emitting element in a first subpixel in FIG. 1. In one embodiment, as shown in FIG. 77, the first reset module 101 includes the first type of double-gate transistor T1; or, as shown in FIG. 8, the compensation module 103 includes the first type of double-gate transistor T1; or, as shown in FIG. 9, both the compensation module 103 and the first reset module 101 include the first type of double-gate transistor T1. Two gates of the first type of double-gate transistor T1 in the first reset module 101 may be connected to the first control line L1 and the second control line L2. Two gates of the first type of double-gate transistor T1 in the compensation module 103 may be connected to the first control line L1 and the second control line L2. An arrangement structure and a way to monitor line widths of a third control line L3 and a fourth control line L4 may be same as an arrangement structure and a way to monitor line widths of the first control line L1 and the second control line L2, which is not repeated herein.

The embodiment explains that the first reset module 101 and/or the compensation module 103 connected to the gate of the driving transistor DT may include the first type of double-gate transistor T1. Since a leakage current of a double-gate transistor is much smaller than a leakage current of a single-gate transistor, the first reset module 101 adopts the first type of double-gate transistor T1. When a reset stage is complete, after the first type of double-gate transistor T1 in the first reset module 101 is turned off, a potential of the gate of the driving transistor DT can be kept stable, to avoid that the luminous brightness of the light-emitting element 20 is affected by a potential drop of the gate of the driving transistor DT, which helps improve color shift phenomenon at low grayscale. In a light-emitting stage, the gate of the driving transistor DT has two leakage paths, one leakage path is leakage through the first reset module 101, and the other leakage path is leakage through the compensation module 103. Since the first reset module 101 adopts the first type of double-gate transistor T1, and/or the compensation module 103 adopts the first type of double-gate transistor T1, a leakage current of the driving transistor DT is small. Therefore, leakage of the driving transistor DT can be effectively reduced, and a gate potential of the driving transistor DT can be kept stable, so that a driving current generated by the driving transistor DT does not change in a large range, thereby improving brightness and color shift when the light-emitting element 20 emits light.

It can be understood that a setting position of the first type of double-gate transistor T1 in the first pixel circuit 10 is not limited herein. In FIGS. 7-9, the first reset module 101 includes the first type of double-gate transistor T1, and/or the compensation module 103 includes the first type of double-gate transistor T1. During specific implementation, in one embodiment, the first pixel circuit 10 may further include other modules connected to the gate of the driving transistor DT. In the embodiment, the other modules connected to the gate of the driving transistor DT may also include the first type of double-gate transistor T1, which helps improve display quality of the display panel.

Figure 10:
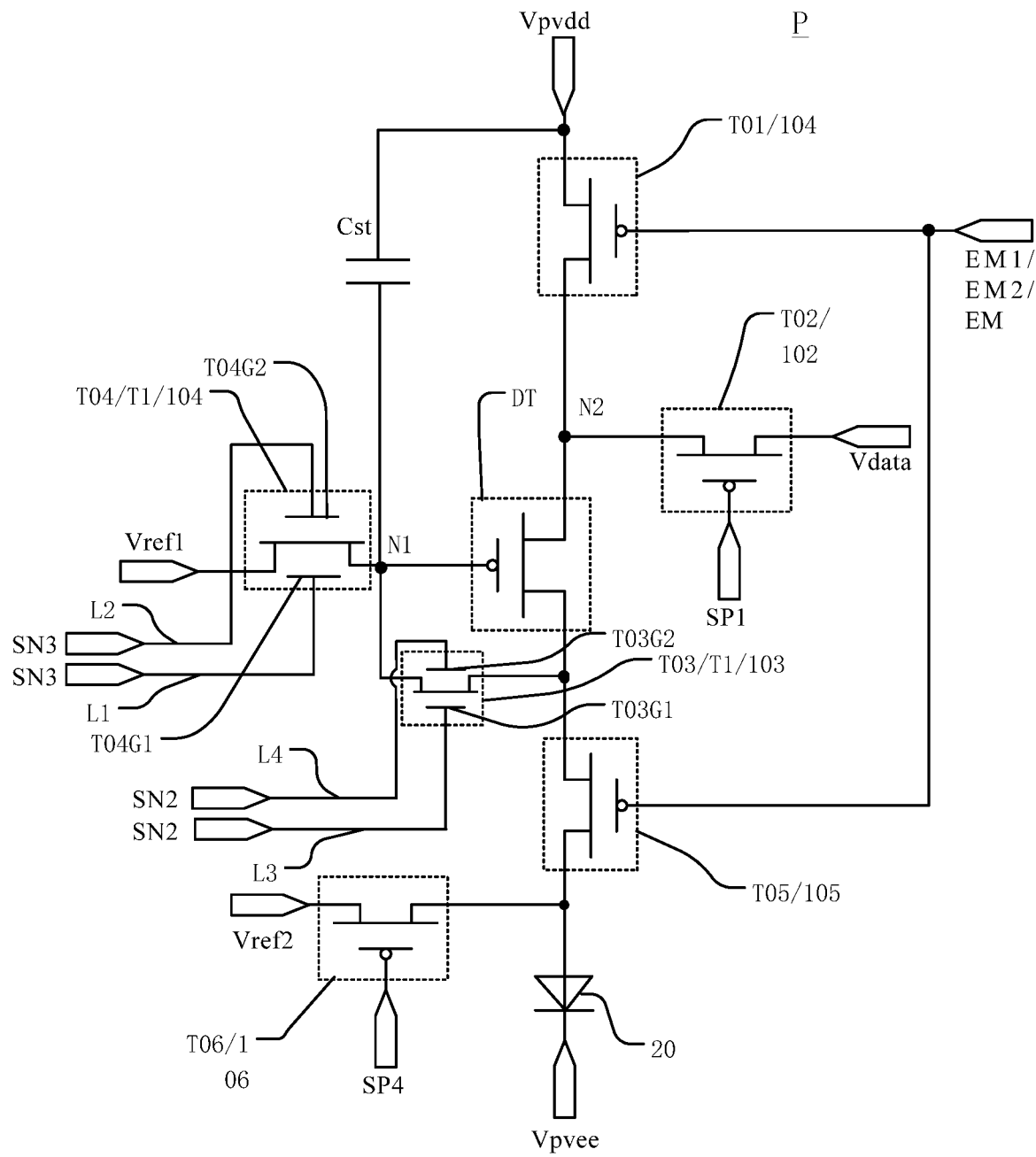
FIG. 10 illustrates a schematic diagram of a specific circuit connection structure in FIG. 9.
Figure 11:
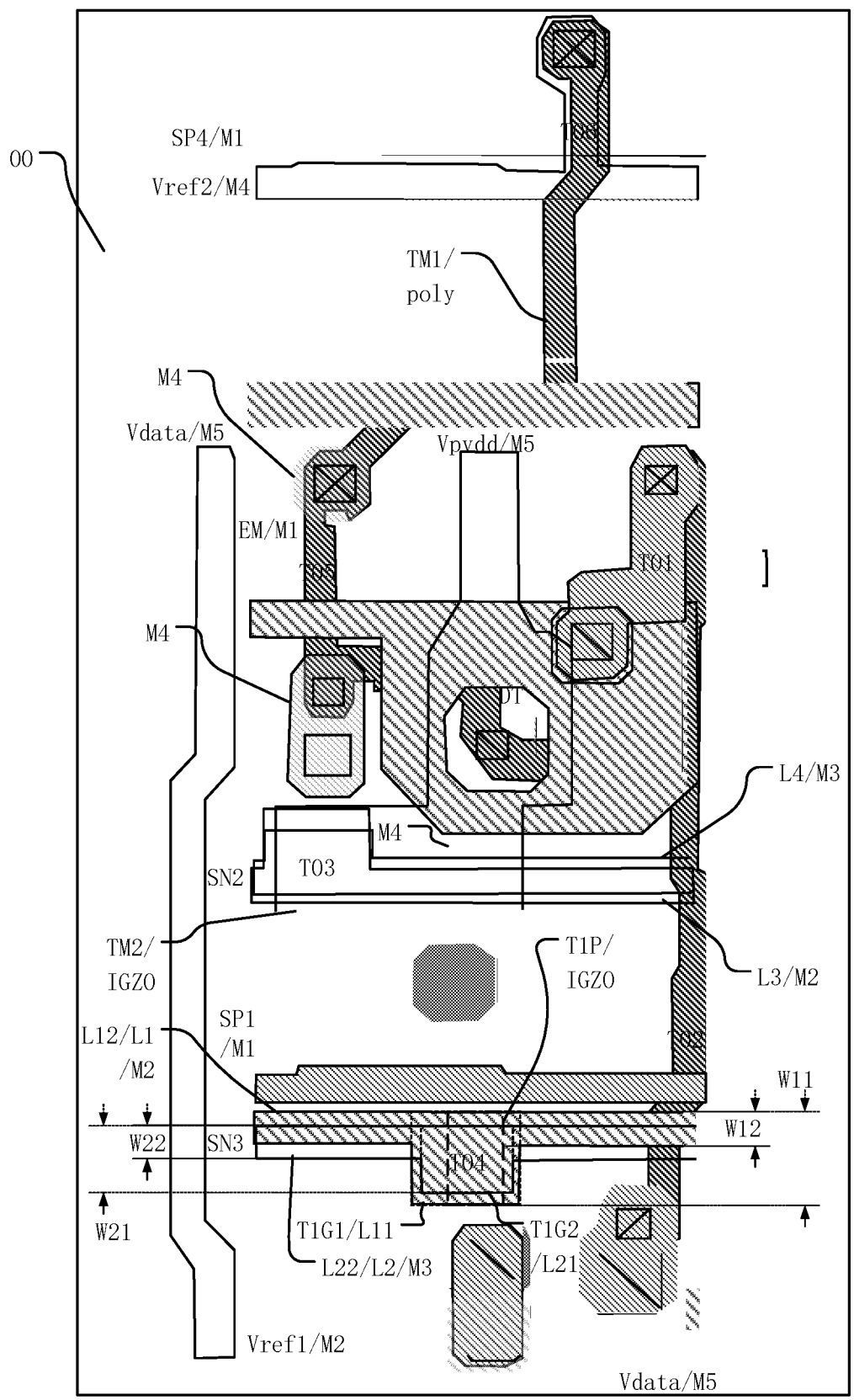
FIG. 11 illustrates a layout structure of a circuit connection structure formed on a substrate in FIG. 10.

In some optional embodiments, referring to FIG. 1, FIG. 9, FIG. 10 and FIG. 11, FIG. 10 illustrates a schematic diagram of a specific circuit connection structure in FIG. 9. FIG. 11 illustrates a layout structure of a circuit connection structure formed on a substrate in FIG. 10. It can be understood that a transparency is filled in FIG. 11 to clearly illustrate a structure of one embodiment. In the embodiment, the first lighting control module 104 includes a first transistor T01, a gate of the first transistor T01 is connected to the first lighting control signal EM1, a first electrode of the first transistor T01 is connected to the first power supply signal Vpvdd, and a second electrode of the first transistor T01 is connected to the first electrode of the driving transistor DT.

The data writing module 102 includes a second transistor T02, a gate of the second transistor T02 is connected to a first scanning signal SP1, a first electrode of the second transistor T02 is connected to the data voltage signal Vdata, and a second electrode of the second transistor T02 is connected to the first electrode of the driving transistor DT.

The compensation module 103 includes a third transistor T03, and the third transistor T03 is the first type of double-gate transistor T1. A first gate T03G1 of the third transistor T03 is connected to a second scanning signal SN2, a second gate T03G2 of the third transistor T03 is connected to the second scanning signal SN2, a first electrode of the third transistor T03 is connected to the gate of the driving transistor DT, and a second electrode of the third transistor T03 is connected to the second electrode of the driving transistor DT. The first gate T03G1 of the third transistor T03 may be connected to the third control line L3 to provide the second scanning signal SN2, and the second gate T03G2 of the third transistor T03 may be connected to the fourth control line L4 to provide the second scanning signal SN2.

The first reset module 101 includes a fourth transistor T04, and the fourth transistor T04 is the first type of double-gate transistor T1. A first gate T04G1 of the fourth transistor T04 is connected to a third scanning signal SN3, a second gate T04G2 of the fourth transistor T04 is connected to the third scanning signal SN3, a first electrode of the fourth transistor T04 is connected to the first reset signal Vref1, and a second electrode of the fourth transistor T04 is connected to the gate of the driving transistor DT. The first gate T04G1 of the fourth transistor T04 may be connected to the first control line L1 to provide the third scanning signal SN3, and the second gate T04G2 of the fourth transistor T04 may be connected to the second control line L2 to provide the third scanning signal SN3.

The second lighting control module 105 includes a fifth transistor T05, a gate of the fifth transistor T05 is connected to the second lighting control signal EM2, a first electrode of the fifth transistor T05 is connected to the second electrode of the driving transistor DT, and a second electrode of the fifth transistor T05 is connected to the anode of the light-emitting element 20.

The second reset module 106 includes a sixth transistor T06, a gate of the sixth transistor T06 is connected to the fourth scanning signal SP4, a first electrode of the sixth transistor T06 is connected to the second electrode of the driving transistor DT, and a second electrode of the sixth transistor T06 is connected to the anode of the light-emitting element 20.

The embodiment explains that the data writing module 102 includes the second transistor T02, and the gate of the second transistor T02 is connected to the first scanning signal SP1. The first scanning signal SP1 can be connected to a first scanning signal line on the display panel, the first electrode of the second transistor T02 is connected to the data voltage signal Vdata, and the second electrode of the second transistor T02 is connected to the first electrode of the driving transistor DT. The first scanning signal SP1 controls a turn-on and a turn-off of the second transistor T02, so that the data voltage signal Vdata is written. The second reset module 106 includes a sixth transistor T06, and the gate of the sixth transistor T06 is connected to the fourth scanning signal SP4. The gate of the second transistor T02 and the gate of the sixth transistor T06 may be commonly connected to a scanning signal line, that is, the fourth scanning signal SP4 and the first scanning signal SP1 can be connected to a same first scanning signal line on the display panel. The first electrode of the sixth transistor T06 is connected to the second electrode of the driving transistor DT, and the second electrode of the sixth transistor T06 is connected to the anode of the light-emitting element 20. The fourth scanning signal SP4 controls a turn-on and a turn-off of the sixth transistor T06 to provide the second reset signal Vref2 to the anode of the light-emitting element 20 and initialize the anode of the light-emitting element 20. The first lighting control module 104 includes the first transistor T01, the gate of the first transistor T01 is connected to the first lighting control signal EM1, the first electrode of the first transistor T01 is connected to the first power signal Vpvdd and the second electrode of the first transistor T01 is connected to the first electrode of the driving transistor DT. The second lighting control module 105 includes the fifth transistor T05, the gate of the fifth transistor T05 is connected to the second lighting control signal EM2, and the first electrode of fifth transistor T05 is connected to the second electrode of the driving transistor DT, and the second electrode of the fifth transistor T05 is connected to the anode of the light-emitting element 20. The gate of the first transistor T01 and the gate of the fifth transistor T05 may be commonly connected to a same light-emitting control signal EM. Optionally, the gate of the first transistor T01 and the gate of the fifth transistor T05 may be connected to a same light-emitting control signal line on the display panel. That is, when the gate of the first transistor T01 and the gate of the fifth transistor T05 jointly respond to the light-emitting control signal EM, the first transistor T01 and the fifth transistor T05 are in a turn-on state. A path is formed among the first power supply signal Vpvdd, the driving transistor DT, the light emitting element 20, and the second power supply signal Vpvee. The compensation module 103 includes the third transistor T03. The third transistor T03 is the first type of double-gate transistor T1, and a leakage current thereof is small, so a potential of the gate of the driving transistor DT connected thereto can be kept stable. The third transistor T03 is turned on or off under a control of the second scanning signal SN2. The second scanning signal SN2 can be input by two control lines. When the third transistor T03 is turned on, the gate and the second electrode of the driving transistor DT can be short-circuited, and a voltage difference is generated between the gate and the first electrode of the driving transistor DT through the threshold voltage of the driving transistor DT. The driving transistor DT is turned on, the second transistor T02 is turned on, and the data voltage signal Vdata is input to the second node N2. The data voltage signal Vdata contains a threshold voltage to be compensated, and is transmitted to the gate of the driving transistor DT, thereby compensating for a threshold voltage deviation of the driving transistor DT. The first gate T03G1 of the third transistor T03 can be connected to the third control line L3 to provide the second scanning signal SN2, the second gate T03G2 of the third transistor T03 can be connected to the fourth control line L4 to provide the second scanning signal SN2. An arrangement structure and a way to monitor line widths of the third control line L3 and the fourth control line L4 can be same as an arrangement structure and a way to monitor line widths of the first control line L1 and the second control line L2 in the above embodiment. The first reset module 101 includes the fourth transistor T04, and the fourth transistor T04 is the first type of double-gate transistor T1. A leakage current of the fourth transistor T04 is small, so a gate potential of the driving transistor DT connected to the fourth transistor T04 can be kept stable. The fourth transistor T04 is turned on or off under a control of the third scanning signal SN3 and the third scanning signal SN3 may be input by two control lines. When the fourth transistor T04 is turned on, the gate of the driving transistor DT may be reset. In the embodiment, the first gate T04G1 of the fourth transistor T04 may be connected to the first control line L1 to provide the third scanning signal SN3. The second gate T04G2 of the fourth transistor T04 may be connected to the second control line L2 to provide the third scanning signal SN3. For details, references may be made to an arrangement structure and a way to monitor line widths of the first control line L1 and the second control line L2 in the above embodiments, which are not repeated herein.

In one embodiment, the compensation module 103 is set to include the third transistor T03 and the third transistor T03 is the first type of double-gate transistor T1. The first reset module 101 includes a fourth transistor T04, and the fourth transistor T04 is the first type of double-gate transistor T1. Since a leakage current of a double-gate transistor is small, a phenomenon of an unstable gate potential of the driving transistor DT can be improved, and a color shift phenomenon at low grayscale due to an insufficient light emission of the light-emitting element 20 can be avoided, which helps improve display effect.

Taking a design layout of the first pixel circuit 10 shown in FIG. 11 as an example, the first control line L1 at least partially overlaps the second control line L2 that provide third scanning signals SN3 in the direction perpendicular to the plane where the substrate 00 is located. To monitor the line width of the second control line L2, the second detection line J2 can be set in a spare position in the display area AA or in the non-display area NA of the display panel 000, and the second detection line J2 and the second control line L2 are on a same layer and have a same width. That is, the second detection line J2 and the second control line L2 that needs to monitor line width are formed on a same film layer and in a same process with same steps, so that the second detection line J2 and the second control line L2 are on a same layer and have a same width. The line width of the second control line L2 can be obtained by monitoring the line width of the second detection line J2. Since a location of the second detection line J2 avoids an overlapping area with the first control line L1, that is, no other interference lines the second detection line J2 under the second detection line J2, a boundary of the line width pattern of the second detection line J2 in a picture including the second detection line J2 on the substrate 00 can be automatically distinguished by a machine. Therefore, the line width of the second detection line J2 is accurately obtained, and the line width of the second control line L2 is obtained at a same time. The display panel 000 provided by the embodiment can monitor a signal trace width on the display panel 000 in real time by setting the second detection line J2, which not only make a monitoring method simple and easy to operate, but also can improve monitoring accuracy and helps ensure display quality of a formed display panel 000.

It can be understood that in one embodiment shown in FIG. 10 and FIG. 11, the first transistor T01, the second transistor T02, the fifth transistor T05, the sixth transistor T06, and the driving transistor DT being P-type low-temperature polysilicon transistors as examples, and the third transistor T03 and the fourth transistor T04 being N type oxide double-gate transistors are taken as an example for illustration.

Optionally, in one embodiment, the first pixel circuit 10 further includes a storage capacitor Cst. A first electrode of the storage capacitor Cst is connected to the gate of the driving transistor DT (the first node N1), and a second electrode of the storage capacitor Cst is connected to the first power supply signal Vpvdd. In the embodiment, the first electrode of the storage capacitor Cst is connected to the gate of the driving transistor DT through the first node N1, and the second electrode of the storage capacitor Cst is connected to the first power supply signal Vpvdd to store the data voltage signal Vdata after the data voltage signal Vdata is transmitted to the first node N1, which helps maintain a stability of a whole circuit.

In some optional embodiments, referring to FIG. 1 and FIGS. 9-11, in one embodiment, the first pixel circuit 10 further includes a plurality of thin film transistors. As shown in FIG. 10 and FIG. 11, the first transistor T01, the second transistor T02, the fifth transistor T05, the sixth transistor T06, the driving transistor DT, and the thin film transistors are P-type low-temperature polysilicon transistors. As shown in FIG. 10 and FIG. 11, the third transistor T03 and the fourth transistor T04 are the first type of double-gate transistor T1, and the first type of double-gate transistor T1 is an N-type oxide transistor.

The display panel 000 at least further includes a first metal layer M1, a second metal layer M2, a third metal layer M3, and a fourth metal layer M4 stacked in sequence on one side of the substrate 00. Optionally, an insulating layer (not shown) may be disposed between adjacent metal layers.

Gates of thin film transistors including the first transistor T01, the second transistor T02, the fifth transistor T05, the sixth transistor T06, and the driving transistor DT shown in FIG. 10 and FIG. 11 are on the first metal layer M1. Optionally, the first metal layer M1 may be made of a metal molybdenum (Mo) material. The first control line L1 and the first gate T1G1 of the first type of double-gate transistor T1 are on the second metal layer M2, and the third control line L3 may also be on the second metal layer M2. Optionally, a formation material of the second metal layer M2 may be same as a formation material of the first metal layer M1, which is a metal molybdenum (Mo) material. The second control line L2 and the second gate T1G2 of the first type of double-gate transistor T1 are on the third metal layer M3, the second detection line J2 may be on the third metal layer M3, and the fourth control line L4 may also be on the third metal layer M3. Optionally, a formation material of the third metal layer M3 may be a composite material of metal titanium (Ti) and metal molybdenum (Mo). When the first type of double-gate transistor T1 is an N-type oxide transistor, as an oxide transistor is sensitive to hydrogen ions which affect electrical properties, a titanium metal is added to the third metal layer M3. The metal titanium is relatively dense, which helps block hydrogen ions and plays a role of shielding hydrogen ions. Sources and drains of thin film transistors (e.g., the first transistor T01, the second transistor T02, the fifth transistor T05, the sixth transistor T06, the driving transistor DT shown in FIGS. 10 and 11) are on the fourth metal layer M4. Optionally, a formation material of the fourth metal layer M4 may be a composite material of metal titanium (Ti), metal aluminum (Al) and metal titanium (Ti).

In one embodiment, an active layer TM1 of a thin film transistor may be on a side of the first metal layer M1 close to the substrate 00. The active layer TM1 of the thin film transistor can be a polysilicon material such as a poly material. An active layer of the first type of double-gate transistor T1 may be between the second metal layer M2 and the third metal layer M3. A material of the active part T1P of the first type of double-gate transistor T1 can be a metal oxide, such as IGZO. In the embodiment, the first metal layer M1 can also be configured to form the first scanning signal line, the light-emitting control signal line, and the second reference voltage signal line. The gate of the second transistor T02 and the gate of the sixth transistor T06 may be commonly connected to a scanning signal line. That is, the first scanning signal line is configured to provide the fourth scanning signal SP4 and the first scanning signal SP1. The gate of the first transistor T01 and the gate of the fifth transistor T05 may be commonly connected to the light-emitting control signal line configured to provide the first lighting control signal EM1 and the second light emission control signal EM2. In the embodiment, the second metal layer M2 can also be configured to form the first reference voltage signal line, and a plate of the storage capacitor Cst, that is, the first reference voltage signal line is configured to provide the first reset signal Vref1. The fourth metal layer M4 can also be configured to form the second reference voltage signal line, and the second reference voltage signal line is configured to provide the second reset signal Vref2. In the embodiment, a side of the fourth metal layer M4 on the substrate 00 away from the substrate 00 may further include a fifth metal layer M5 (not filled). The fifth metal layer M5 is configured to form a data line providing the data voltage signal Vdata, a first power signal line providing the first power signal Vpvdd, a second power signal line providing the second power signal Vpvee and another plate of the storage capacitor Cst on the display panel 000.

It should be noted that, in the embodiment, a working process and a working principle of the first pixel circuit 10 in FIG. 9 are not described here in detail. For details, references may be made to a working principle of a pixel circuit in a related art. A technical point of the embodiment is that the second detection line J2 is set to be on a same layer and have a same width as the second control line L2. Both the second detection line J2 and the second control line L2 are set to be on the third metal layer M3, so that even if the first control line L1 at least partially overlaps the second control line L2, the line width of the second control line L2 can be monitored by the second detection line J2, which can improve monitoring accuracy, and help ensure display quality of a formed display panel 000.

In some optional embodiments, referring to FIG. 1, FIG. 10, FIG. 11, and FIG. 12, FIG. 12 illustrates a schematic diagram of another partial layout structure of the Q1 region on the substrate in FIG. 1. It can be understood that a transparency is filled in FIG. 12 to clearly illustrate a structure of one embodiment. In the embodiment, taking a layout design of the first pixel circuit 10 on the substrate 00 shown in FIG. 11 as an example, the second detection line J2 is in the non-display area NA.

Figure 12:
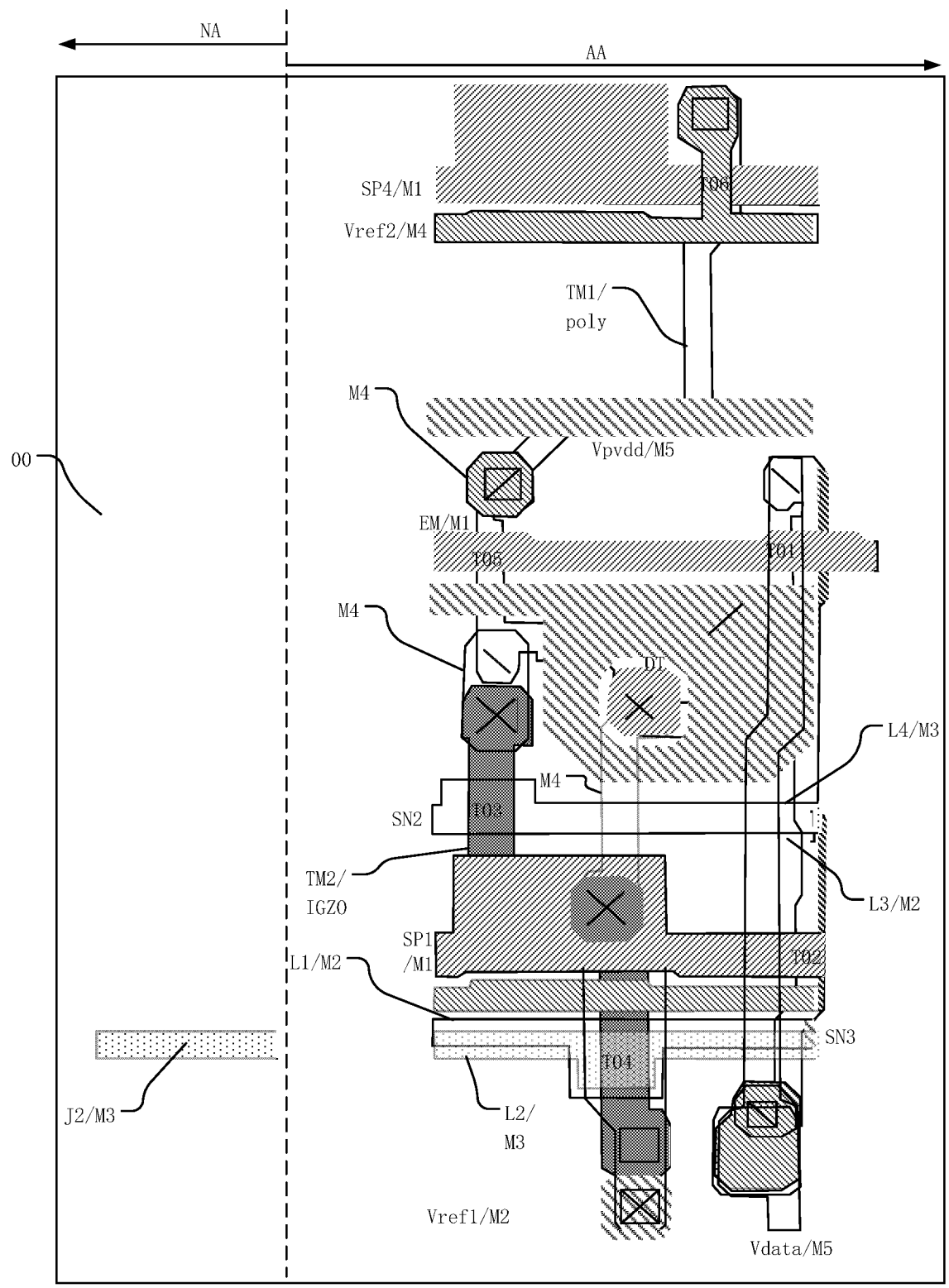
FIG. 12 illustrates a schematic diagram of another local planar structure of the Q1 region on the substrate in FIG. 1.
Figure 13:
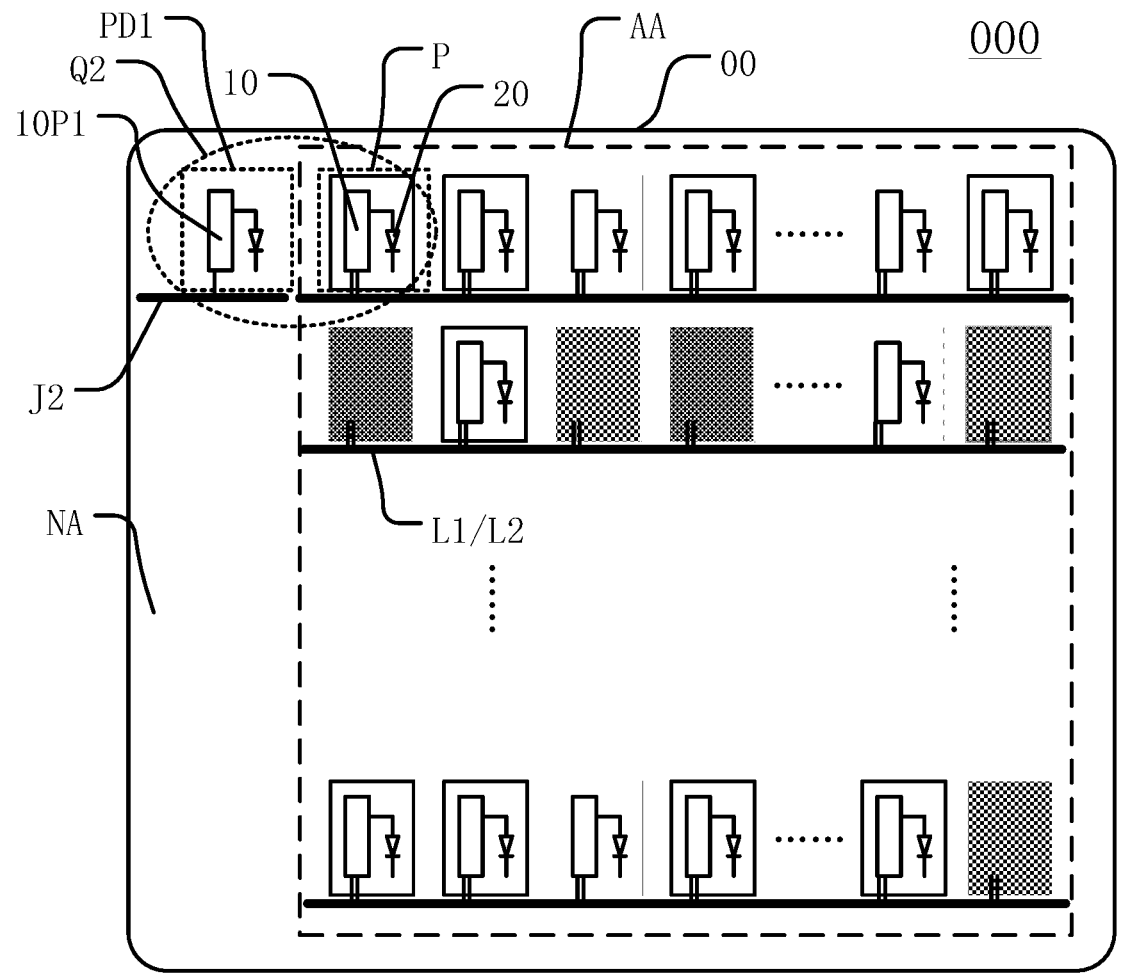
FIG. 13 illustrates another structural plan view of a display panel consistent with various embodiments of the present disclosure.

The embodiment explains that the display area AA of the display panel 000 includes a plurality of first pixel circuits 10. A layout structure of the first pixel circuit 10 formed on the substrate 00 can be as shown in FIG. 11. Provided that the second detection line J2 and the second control line L2 are on a same layer and have a same width, the second detection line J2 can be disposed in the non-display area NA. Disposing the second detection line J2 in the non-display area NA can prevent the second detection line L2 from occupying a normal display space of first subpixels P, thereby improving transmittance of the entire display area AA. Optionally, in one embodiment, as shown in FIG. 12, both the second detection line J2 and the second control line L2 may be on the third metal layer M3. The second detection line J2 and the second control line L2 can be formed at a same time. That is, when the third metal layer M3 is patterned, a structure of part of the third metal layer M3 in the display area AA can be defined as the second control line L2, and a structure of part of the third metal layer M3 in the non-display area NA can be defined as the second detection line J2, thereby achieving a purpose of monitoring the line width of the second control line L2 in the display area AA through the second detection line J2 in the non-display area NA.

Figure 14:
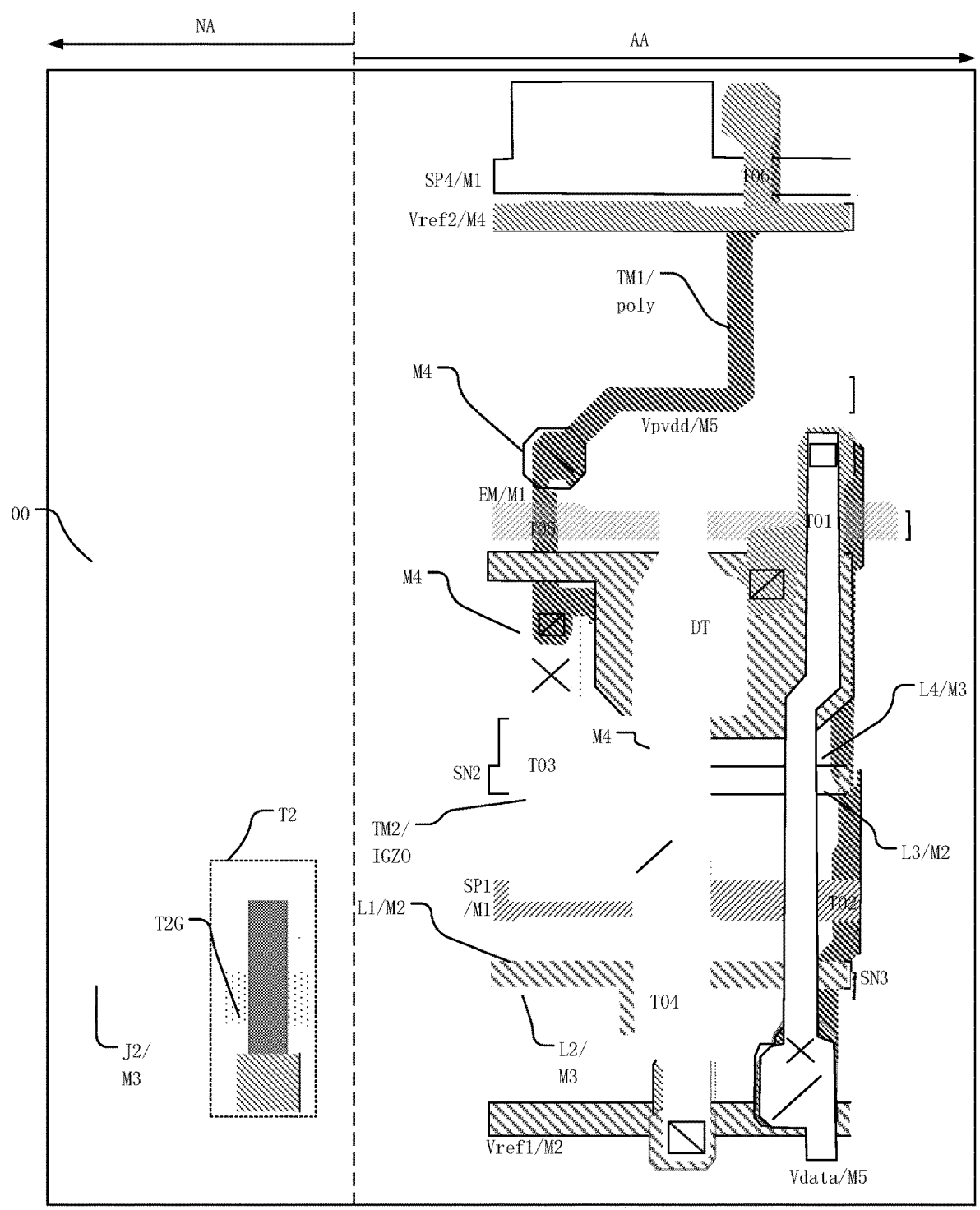
FIG. 14 illustrates a schematic diagram of a local planar structure of a Q2 region on a substrate in FIG. 13.

In some optional embodiments, referring to FIG. 10, FIG. 11, FIG. 13, and FIG. 14, FIG. 13 illustrates another structural plan view of a display panel consistent with various embodiments of the present disclosure. FIG. 14 illustrates a schematic diagram of a local planar structure of a Q2 region on a substrate in FIG. 13. It is understood that transparencies are filled in FIGS. 13-14 to clearly illustrate a structures of one embodiment. In the embodiment, the non-display area NA of the display panel 000 includes at least one first dummy subpixel PD1, and a first dummy subpixel PD1 includes a second pixel circuit 10P1. The second pixel circuit 10P1 includes at least one second type of transistor T2, and the second detection line J2 is disposed on a same layer as the gate of the second type of transistor T2.

The embodiment explains that the display panel 000 may further include at least one first dummy subpixel PD1. Optionally, the at least one first dummy subpixel PD1 may be disposed in the non-display area NA and may be disposed on a periphery of the non-display area NA close to the display area AA. In one embodiment, the at least one first dummy subpixel PD1 can be formed in a same process as the first subpixels P in the display area AA. A first dummy subpixel PD1 includes a second pixel circuit 10P1, and the second pixel circuit 10P1 includes at least a second type of transistor T2. The second type of transistor T2 may have a same structure and may be formed in a same process as any transistor in the first pixel circuit 10, which helps improve process efficiency. In one embodiment, the first dummy subpixel PD1 does not emit light and is not configured for display. The first dummy subpixel PD1 can be configured to prevent damage to the first subpixel P in the display area AA caused by an electrostatic discharge (ESD). Optionally, a cathode of a dummy light-emitting element in the first dummy subpixel PD1 can be electrically connected to a positive power signal line, and an anode of the dummy light-emitting element in the first dummy subpixel PD1 can be connected to the cathode of the light-emitting element 20 in the first subpixel P, so that the dummy light-emitting element becomes a light-emitting diode that is reversely connected. Specifically, the anode of the light-emitting element 20 in the first sub-pixel P of a normal display is connected to the driving transistor and is connected to the first power supply signal Vpvdd through the driving transistor. The light-emitting element 20 is connected to the second power supply signal Vpvee, which can normally emit light and display. The anode of the dummy light-emitting element in the first dummy sub-pixel PD1 is connected to the cathode of the light-emitting element 20 in the first sub-pixel P of a normal display, which is equivalent to being connected to the second power signal Vpvee. The cathode of the dummy light-emitting element in the first dummy sub-pixel PD1 is connected to the first power supply signal Vpvdd, so that the dummy light-emitting element in the first dummy sub-pixel PD1 becomes a light-emitting diode that is reversely connected. Since a light-emitting diode has characteristics of forward conduction and reverse cut-off, the dummy light-emitting element in the first dummy subpixel PD1 cannot emit light normally after being reversely connected, forming an electrostatic protector, which plays an electrostatic protection function and can reduce electrostatic damage to the display panel. It can be understood that an anti-static working principle of the first dummy subpixel PD1 in the embodiment is only exemplified for illustration, which includes but is not limited to the above anti-static structure during specific implementation. For details, references can be made to technical solutions for a use of dummy pixels for electrostatic protection in a related art.

In one embodiment, the second pixel circuit 10P1 in the first dummy subpixel PD1 at least includes the second type of transistor T2, and the second detection line J2 for monitoring the second control line L2 is disposed on a same layer as the gate of the second type of transistor T2. By using a structure of the first dummy subpixel PD1 on the display panel 000, the second detection line J2 can multiplex the structure of the first dummy subpixel PD1 on the display panel 000. The second type of transistor T2 is disposed on a same layer as the gate of the second type of transistor T2. That is, when the gate of the second type of transistor T2 of the first dummy subpixel PD1 in the non-display area NA is formed, the second detection line J2 is jointly formed. There is no need to dispose additional lines in the non-display area NA of the display panel 000 to monitor line width, which helps save a space of the non-display area NA.

Optionally, in one embodiment, the second type of transistor T2 in the first dummy subpixel PD1 is a double-gate transistor. That is, the type of the second type of transistor T2 and the first type of double-gate transistor T1 may be same. The first gate T2G1 of the second type of transistor T2 and the first gate T1G1 of the first type of double-gate transistor T1 are formed on a same layer and in a same process. The second gate T2G2 of the second type of transistor T2 and the second gate T1G2 of the first type of double-gate transistor T1 are formed on a same layer and in a same process. The source and drain of the second type of transistor T2 and the source and drain of the first type of double-gate transistor T1 are formed on a same layer and in a same process. The second gate T2G2 of the second type of transistor T2 is disposed on a same layer as the second detection line J2.

Figure 15:
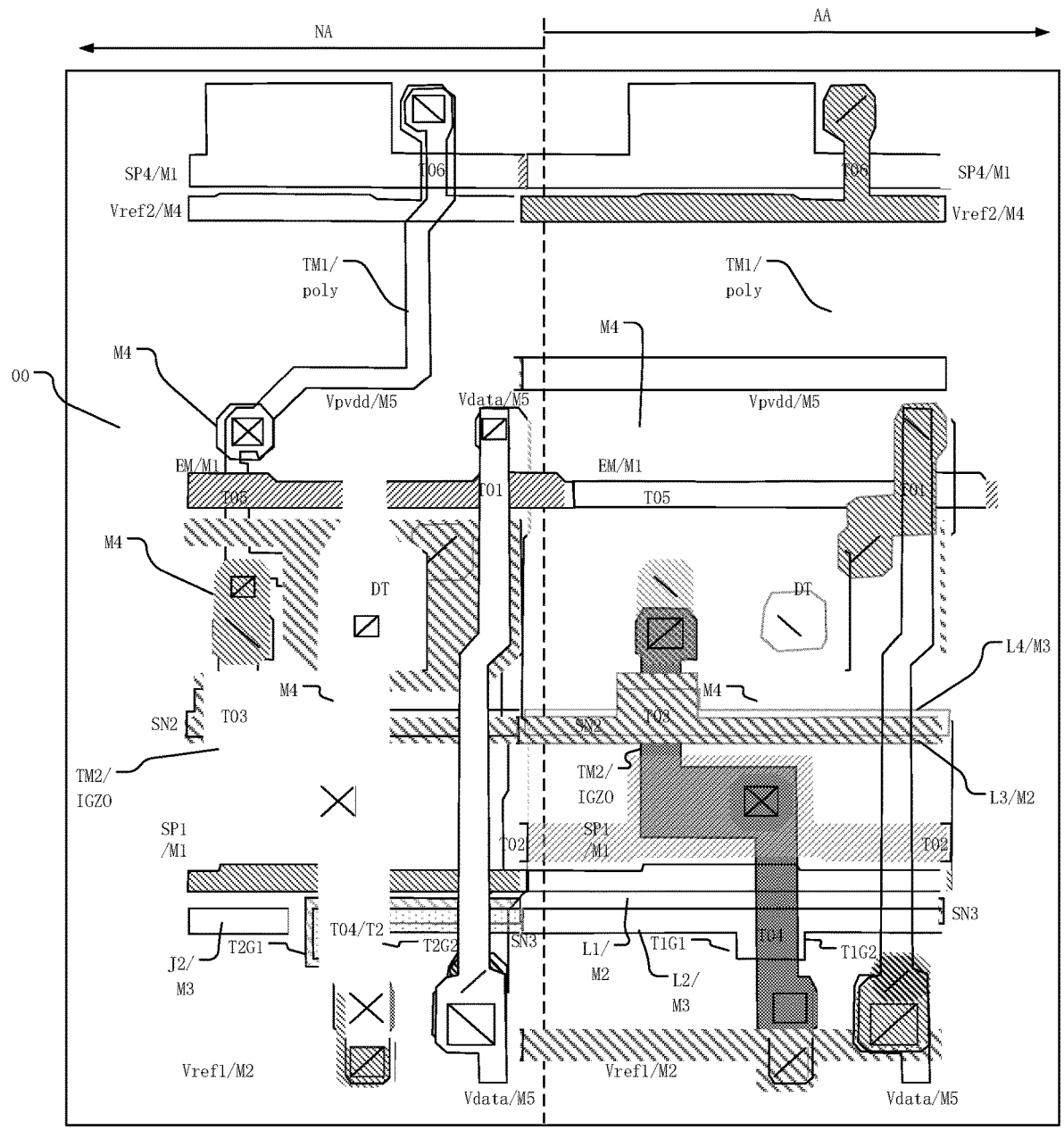
FIG. 15 illustrates another layout structure of a circuit connection structure formed on the substrate in FIG. 10.
Figure 16:
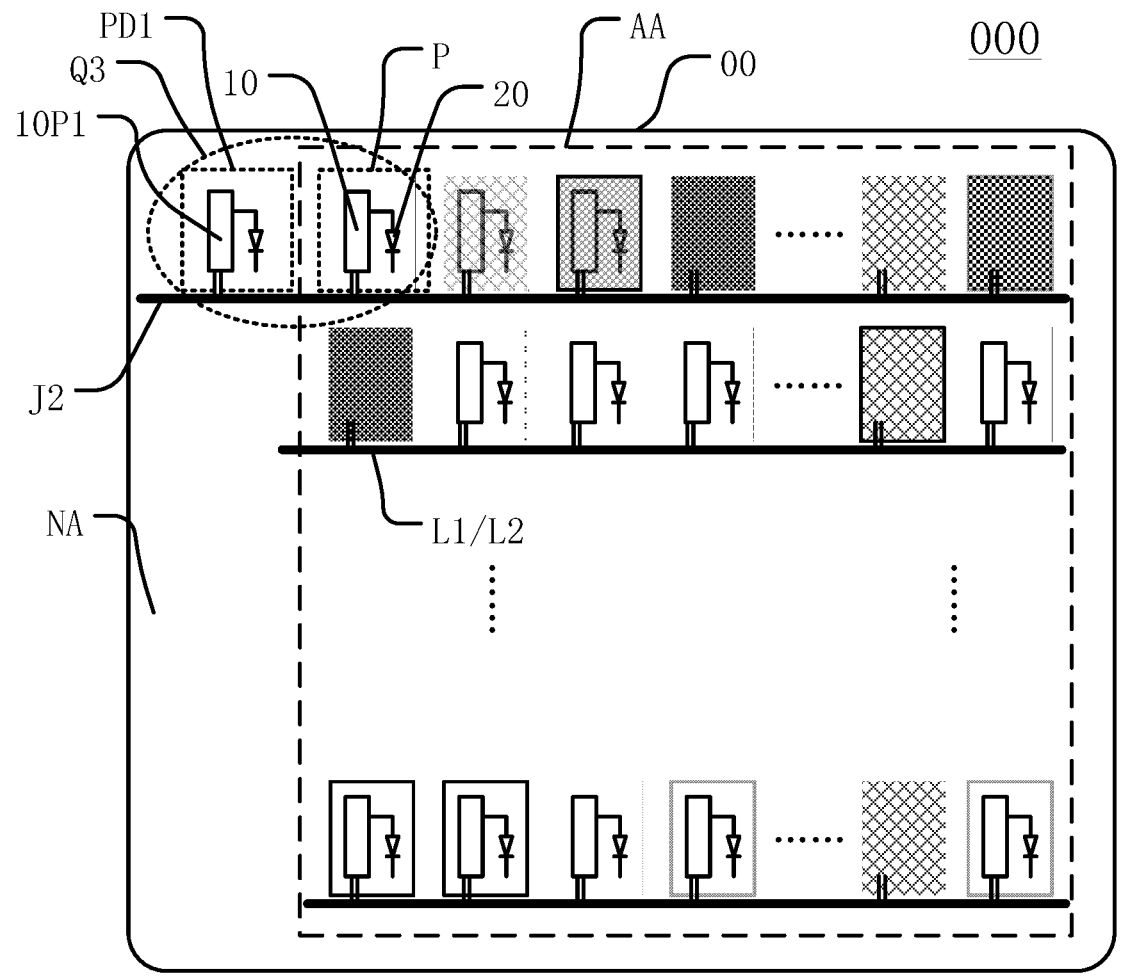
FIG. 16 illustrates another structural plan view of a display panel consistent with various embodiments of the present disclosure.

The embodiment explains that at least part of a structure of the first dummy subpixel PD1 for electrostatic protection disposed in the non-display area NA may be same as a structure of the first subpixel P. That is, a structure of the first pixel circuit 10 and a structure of the second pixel circuit 10P1 may be basically same. That is, the second pixel circuit 10P1 may also include a circuit connection structure shown in FIG. 10. FIG. 15 illustrates another layout structure of a circuit connection structure formed on the substrate in FIG. 10. It can be understood that a transparency is filled in FIG. 15 to clearly illustrate a structure of one embodiment. The second type of transistor T2 in the first dummy subpixel PD1 can also be a double-gate transistor and can be formed using a same structure and a same process as the first type of double-gate transistor T1 in the display area AA. When the second type of transistor T2 is of a same type as the first type of double-gate transistor T1, the second detection line J2 in the non-display area NA can be formed on a same layer and in a same process as the second gate T2G2 in the second type of transistor T2 in the non-display area NA. The second type of transistor T2 and the first type of double-gate transistor T1 are of a same type. The first gate T2G1 of the second type of transistor T2 and the first gate T1G1 of the first type of double-gate transistor T1 are formed on a same layer and in a same process. The second gate T2G2 of the second type of transistor T2 and the second gate T1G2 of the first type of double-gate transistor T1 are formed on a same layer and in a same process. The source and drain of the second type of transistor T2 and the source and drain of the first type of double-gate transistor T1 are formed on a same layer and in a same process. The second detection line J2 and the second gate T1G2 of the first type of double-gate transistor T1 can be formed on a same layer and in a same process, so that the second gate T1G2 of the first type of double-gate transistor T1 is connected to the second control line L2 on a same layer, thereby realizing that the second detection line J2 of the non-display area NA and the second control line L2 in the display area AA not only are on a same layer and have a same material, but also are on a same layer and have a same width. By monitoring the line width of the second detection line J2 in the non-display area NA, the line width of the second control line L2 in the display area AA can be obtained. Furthermore, on a premise that no additional signal lines are disposed in the non-display area NA, a monitoring accuracy of the line width of the display area AA can be improved, which helps ensure display quality of a formed display panel 000.

Figure 17:
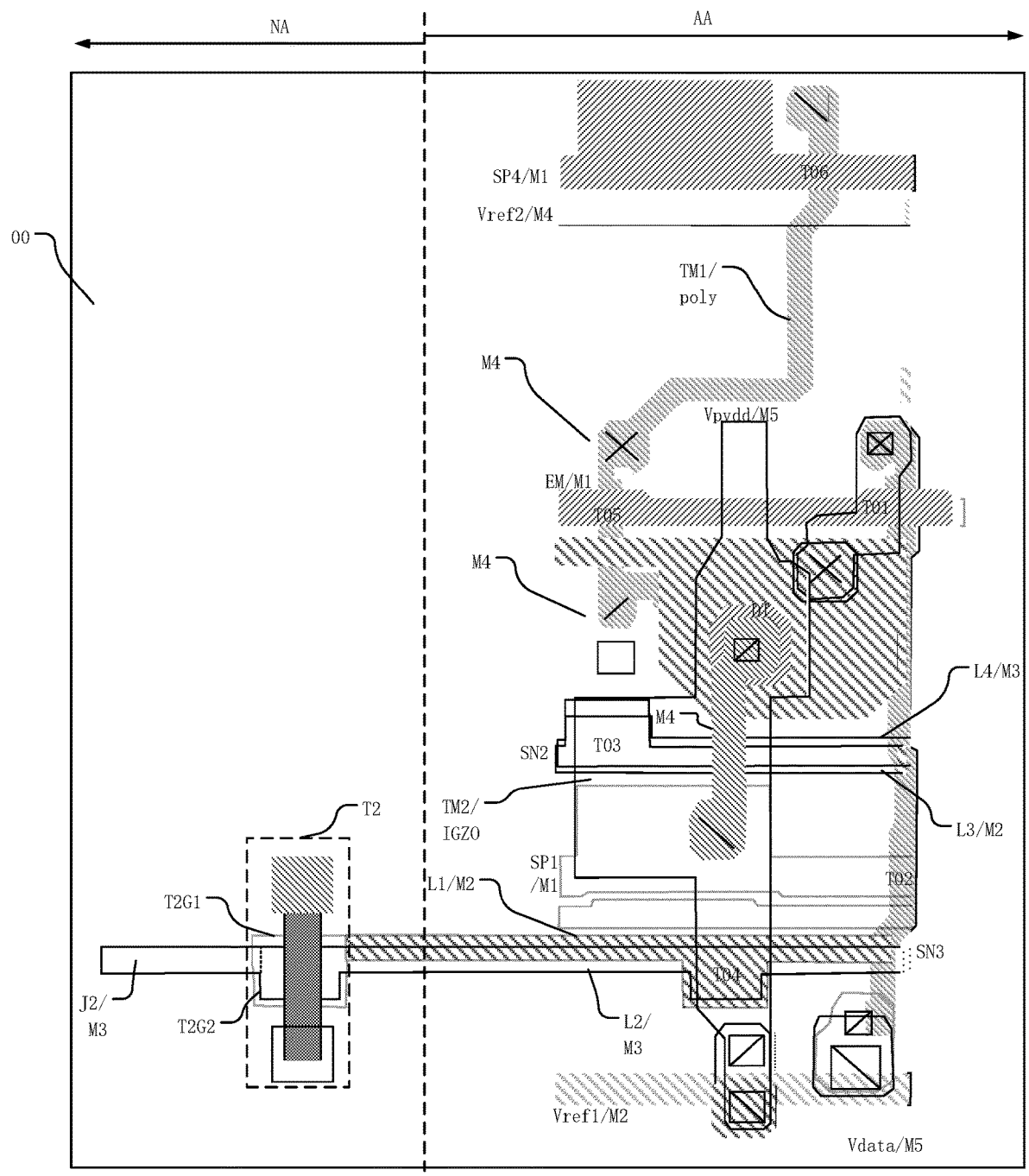
FIG. 17 illustrates a schematic diagram of a local planar structure of a Q3 region on a substrate in FIG. 16.
Figure 18:
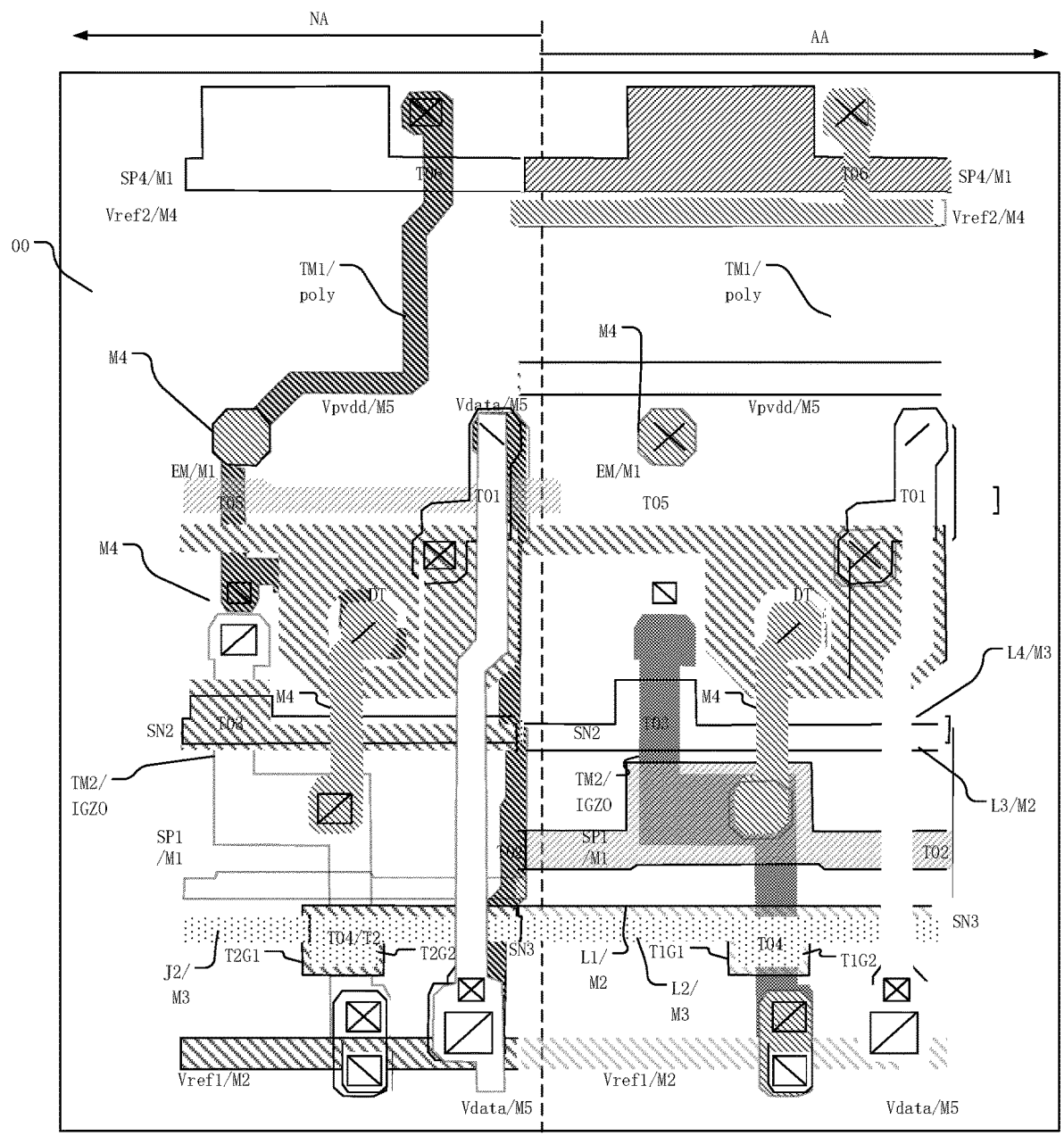
FIG. 18 illustrates another layout structure of a circuit connection structure formed on the substrate in FIG. 10.

In some optional embodiments, referring to FIG. 10, FIG. 11, and FIGS. 16-18, FIG. 16 illustrates another structural plan view of a display panel consistent with various embodiments of the present disclosure. FIG. 17 illustrates a schematic diagram of a local planar structure of a Q3 region on a substrate in FIG. 16. FIG. 18 illustrates another layout structure of a circuit connection structure formed on the substrate in FIG. 10. It can be understood that transparencies are filled in FIGS. 16-18 to clearly illustrate a structure of one embodiment. In the embodiment, the second control line L2 in the display area AA is connected to the second detection line J2 in the non-display area NA. The second gate T2G2 of the second type of transistor T2 is connected to the second detection line J2 in the non-display area NA.

The embodiment explains that both the second detection line J2 and the second control line L2 can be on the third metal layer M3. The second detection line J2 and the second control line L2 can be formed at a same time. The second detection line J2 and the second control line L2 are a one-piece connected structure. That is, when the third metal layer M3 is patterned, a structure of part of the third metal layer M3 in the display area AA can be defined as the second control line L2, and a structure of part of the third metal layer M3 in the non-display area NA can be defined as the second detection line J2, thereby achieving a purpose of monitoring the line width of the second control line L2 in the display area AA through the second detection line J2 in the non-display area NA. When the third scanning signal SN3 is provided to the first pixel circuit 10 through the second control line L2, the third scanning signal SN3 can be provided through an outer surrounding line of the display area AA and the outer surrounding line can be multiplexed into the second detection line J2. Since the first dummy subpixel PD1 is in the non-display area NA, the scanning signal line connected to the second gate of the second type of transistor T2 of the second pixel circuit 10P1 can also be multiplexed into the second detection line J2. In one embodiment, the second control line L2 in the display area AA and the second detection line J2 of the non-display area NA are connected in the non-display area NA, and the second detection line J2 is also connected to the third scanning signal SN3. Not only can the scanning signal line connected to the second gate of the second type of transistor T2 of the second pixel circuit 10P1 in the first dummy subpixel PD1 be multiplexed into the second detection line J2, but also the outer surrounding line of the display area AA2 can also be multiplexed into the second detection line J2. The third scanning signal SN3 can be provided for the second control line L2 in the display area AA through the second detection line J2 without disposing an additional signal trace in the non-display area NA to monitor line width, which helps realize an accurate monitoring of line width and saves a wiring space of the non-display area NA.

Figure 19:
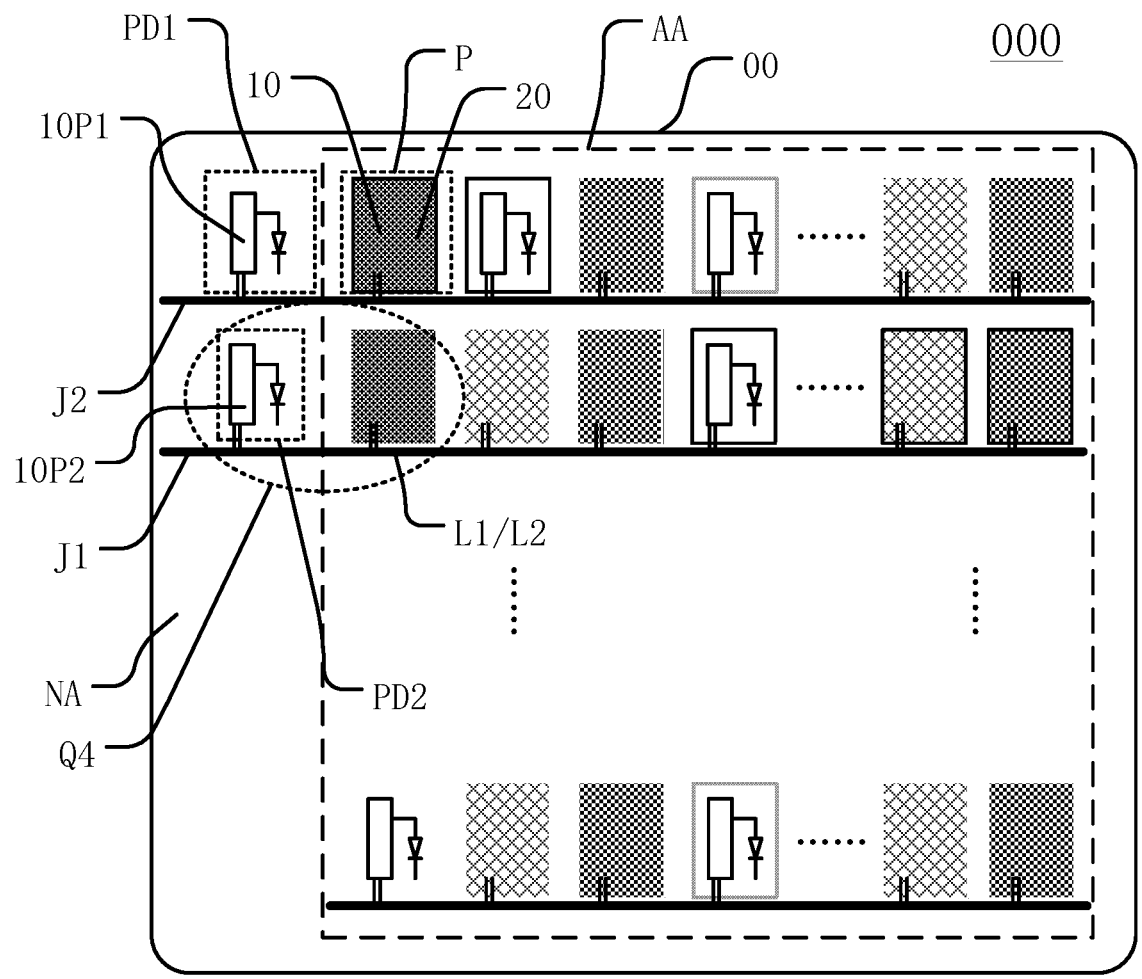
FIG. 19 illustrates another structural plan view of a display panel consistent with various embodiments of the present disclosure.
Figure 20:
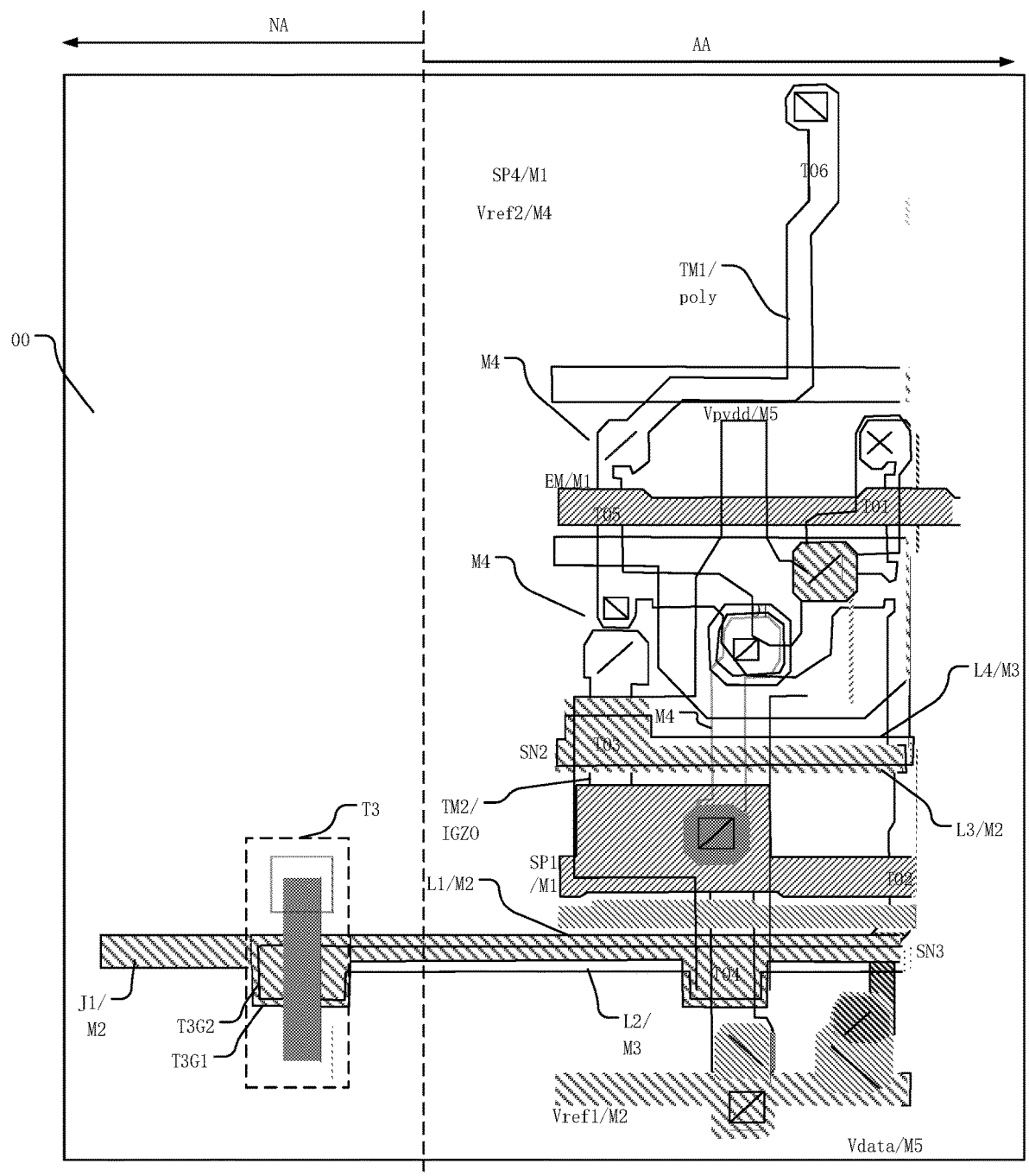
FIG. 20 illustrates a schematic diagram of a local planar structure of a Q4 region on the substrate in FIG. 19.
Figure 21:
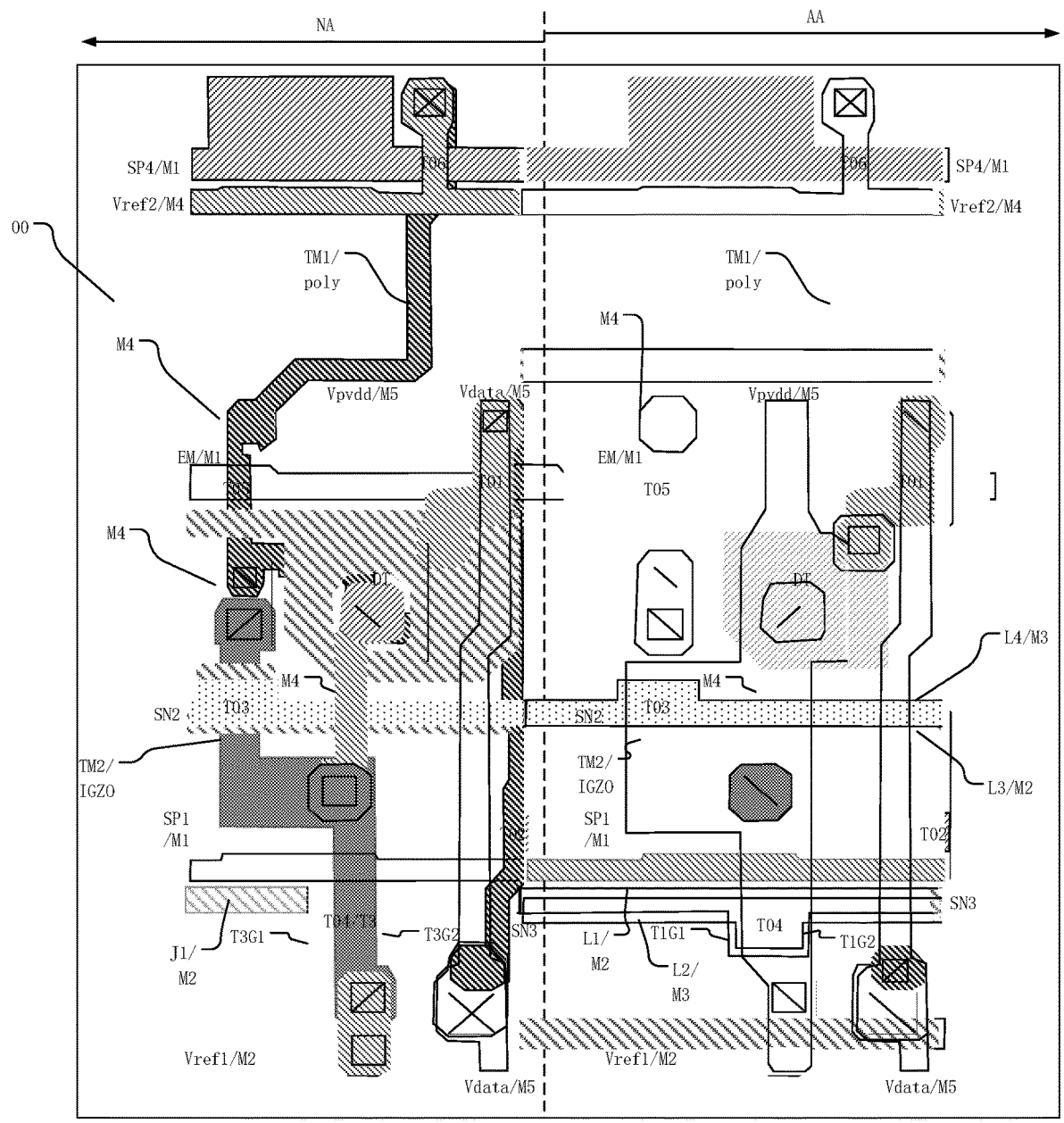
FIG. 21 illustrates another layout structure of a circuit connection structure formed on the substrate in FIG. 10.
Figure 22:
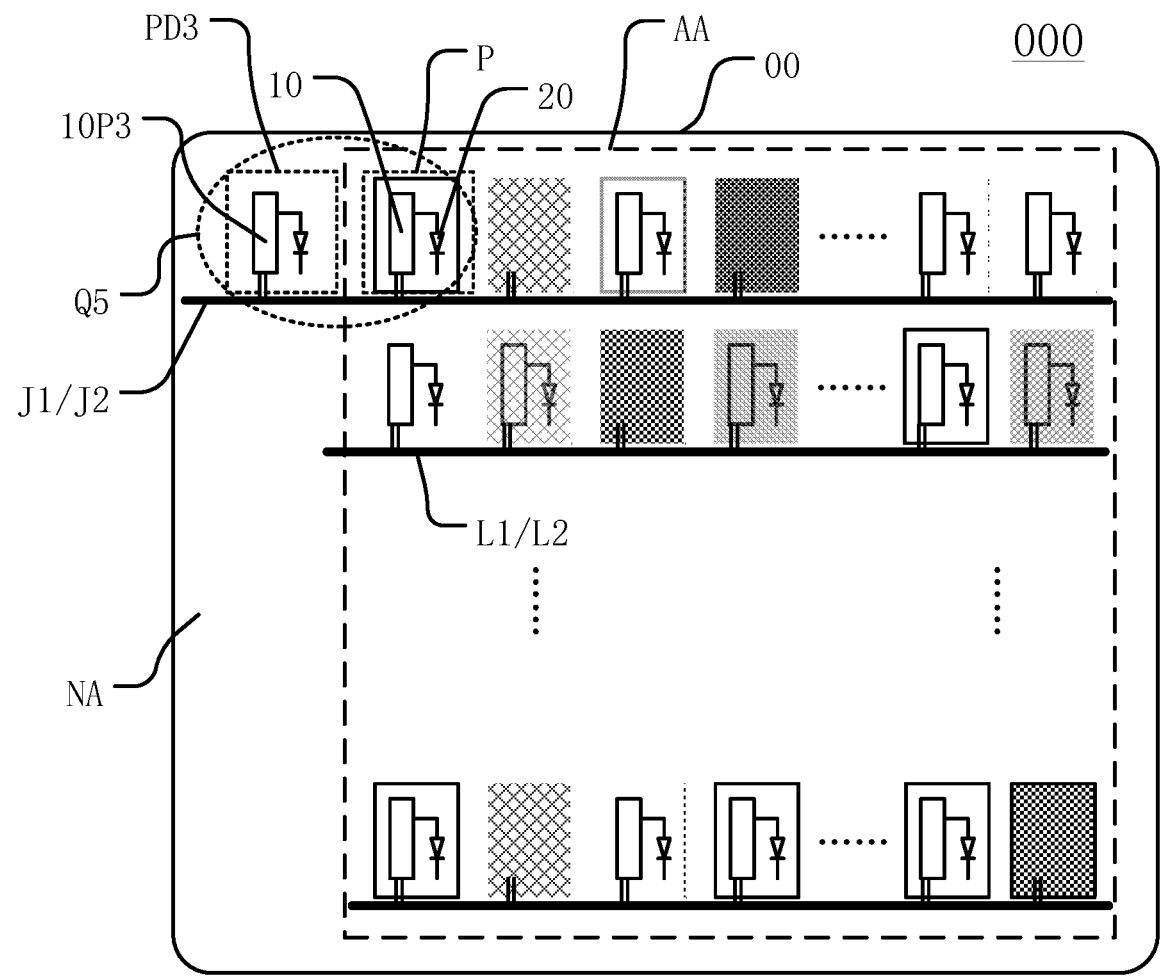
FIG. 22 illustrates another structural plan view of a display panel consistent with various embodiments of the present disclosure.

In some optional embodiments, referring to FIG. 10, FIG. 11, and FIGS. 19-21. FIG. 19 illustrates another structural plan view of a display panel consistent with various embodiments of the present disclosure. FIG. 20 illustrates a schematic diagram of a local planar structure of a Q4 region on the substrate in FIG. 19. FIG. 21 illustrates another layout structure of a circuit connection structure formed on the substrate in FIG. 10. It can be understood that transparencies are filled in FIGS. 19-21 to clearly illustrate a structure of one embodiment. In the embodiment, the non-display area NA of the display panel 000 includes at least one second dummy subpixel PD2, and the second dummy subpixel PD2 includes a third pixel circuit 10P2.

The third pixel circuit 10P2 at least includes a third type of double-gate transistor T3. A first gate T3G1 of the third type of double-gate transistor T3 and the first gate T1G1 of the first type of double-gate transistor T1 are formed on a same layer and in a same process. A second gate T3G2 of the third type of double-gate transistor T3 and the second gate T1G2 of the first type of double-gate transistor T1 are formed on a same layer and in a same process. The source and drain of the third type of double-gate transistor T3 and the source and drain of the first type of double-gate transistor T1 are formed on a same layer and in a same process. The non-display area NA includes at least one first detection line J1. The first gate T3G1 of the third type of double-gate transistor T3 is connected to the first detection line J1 in the non-display area NA. The first detection line J1 is connected to the first control line L1. The first detection line J1 and the first control line L1 are on a same layer and have a same width.

The embodiment explains that the display panel 000 may further include at least one second dummy subpixel PD2. Optionally, the second dummy subpixel PD2 may be disposed in the non-display area NA and may be disposed on a periphery of the non-display area NA close to the display area AA. In the embodiment, the second dummy subpixel PD1 can be formed in a same process as the first subpixel P in the display area AA. The second dummy subpixel PD2 includes a third pixel circuit 10P2. The third pixel circuit 10P2 includes at least a third type of double-gate transistor T3. The third-type of double-gate transistor T3 may have a same structure and be formed in a same process as the first type of double-gate transistor T1 in the first pixel circuit 10, which helps improve process efficiency. In the embodiment, the second dummy subpixel PD2 does not emit light and is not configured for display. The second dummy subpixel PD2 has a same function as the first dummy subpixel PD1. The second dummy subpixel PD2 and the first dummy subpixel PD1 can be configured to prevent damage to the first subpixel P in the display area AA caused by an electrostatic discharge (ESD). It can be understood that, in the embodiment, an anti-static working principle of the second dummy subpixel PD2 is not repeated herein. For details, references can be made to technical solutions of a virtual pixel for electrostatic protection in the related art or an anti-static principle of the first dummy subpixel PD1 described in the above embodiment.

In one embodiment, the third pixel circuit 10P2 in the second dummy subpixel PD2 is set to include at least the third type of double-gate transistor T3. The third type of double-gate transistor T3 and the first type of double-gate transistor T1 can be of a same type. At least part of a structure of the second dummy subpixel PD2 for electrostatic protection disposed in the non-display area NA may be same as the structure of the first subpixel P. That is, the structure of the first pixel circuit 10 and the structure of the third pixel circuit 10P2 may be basically same. That is, the third pixel circuit 10P2 may also include the circuit connection structure shown in FIG. 10. As shown in FIG. 21, the first gate T3G1 of the third-type of double-gate transistor T3 and the first gate T1G1 of the first type of double-gate transistor T1 are formed on a same layer and in a same process. The second gate T3G2 of the third type of double-gate transistor T3 and the second gate T1G2 of the first type of double-gate transistor T1 are formed on a same layer and in a same process. The source and drain of the third type of double-gate transistor T3 and the source and drain of the first type of double-gate transistor T1 are formed on a same layer and in a same process, so that the structure of the second dummy subpixel PD2 is formed together with the structure of the first subpixel P in the display area AA, which helps improve process efficiency.

In one embodiment, the non-display area NA includes at least one first detection line J1. The first detection line J1 and the first control line L1 are on a same layer and have a same width. That is, the first detection line J1 and the first control line L1 are on same film layer and are formed in a same process to obtain a same line width. The first detection line J1 can be configured to monitor the line width of the first control line L1. That is, the line width of the first control line L1 on a low layer in the display area AA can also be monitored by the first detection line J1 in the non-display area NA, without considering an overlapping positional relationship between the first control line L1 and the second control line L2 in the display area AA. It is only necessary to include the first detection line J1 in the non-display area NA that is on a same layer and has a same width as the first control line L1 to realize an accurate monitoring of the line width of the first control line L1, which helps improve flexibility and freedom of a layout of control lines in the display area AA.

In one embodiment, the first gate T3G1 of the third type of double-gate transistor T3 is connected to the first detection line J1 in the non-display area NA, and the first detection line J1 is connected to the first control line L1.

That is, the first detection line J1 multiplexes a film layer where the first gate T3G1 of the third type of double-gate transistor T3 is located. For example, the first detection line J1, the first control line L1, the first gate T1G1 of the first type of double-gate transistor T1 and the first gate T3G1 of the third type of double-gate transistor T3 are all disposed on the second metal layer M2, so that the first detection line J1 can be formed by multiplexing a film layer structure on the display panel 000. The first detection line J1 and the first control line L1 can be formed at a same time. The first detection line J1 and the first control line L1 are a one-piece connected structure. When the second metal layer M2 is patterned, a structure of part of the second metal layer M2 in the display area AA can be defined as the first control line L1, and a structure of part of the second metal layer M2 in the non-display area NA can be defined as the first detection line J1, thereby achieving a purpose of monitoring the line width of the first control line L1 in the display area AA through the first detection line J1 in the non-display area NA. When the third scanning signal SN3 is provided to the first pixel circuit 10 through the first control line L1, the third scanning signal SN3 can be provided through an outer surrounding line of the display area AA. The outer surrounding line can be multiplexed into the first detection line J1. Since the second dummy subpixel PD2 is in the non-display area NA, a scanning signal line connected to the first gate of the third type of double-gate transistor T3 of the third pixel circuit 10P2 can also be used as the first detection line J1. In the embodiment, the first control line L1 in the display area AA and the first detection line J1 of the non-display area NA are connected in the non-display area NA, and the first detection line J1 is also connected to the third scanning signal SN3. Not only can a scanning signal line connected to the first gate of the third type of double-gate transistor T3 of the third pixel circuit 10P2 in the second dummy subpixel PD2 be multiplexed into the first detection line J1, but also an outer surrounding line in the display area AA2 can be multiplexed into the first detection line J1. The outer surrounding line is multiplexed into the first detection line J1. The third scanning signal SN3 can be provided for the first control line L1 in the display area AA through the first detection line J1 without disposing an additional signal trace in the non-display area NA to monitor line width, which helps realize an accurate monitoring of line width and saves a wiring space of the non-display area NA.

Figure 23:
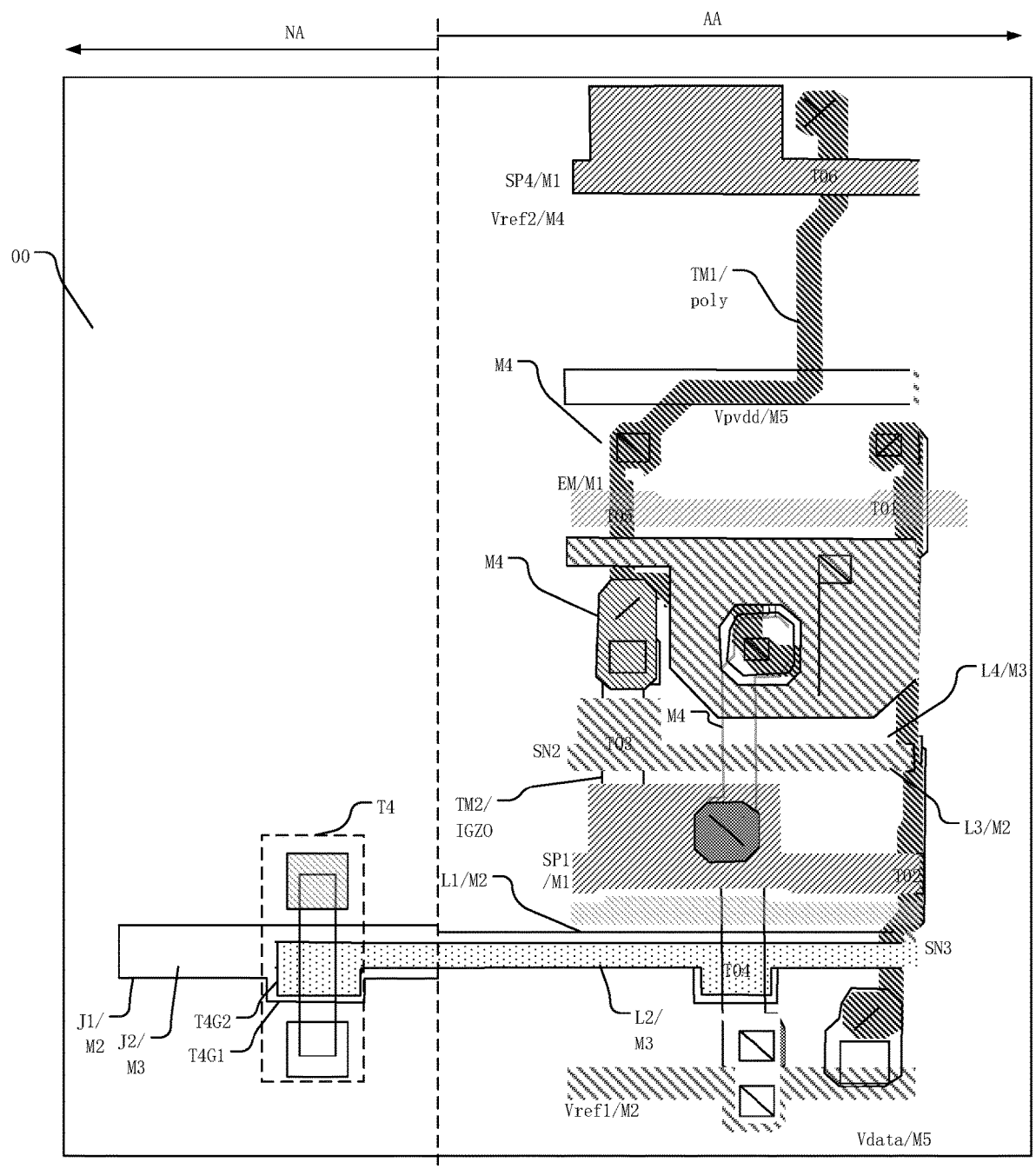
FIG. 23 illustrates a schematic diagram of the partial layout structure of a Q5 region on the substrate in FIG. 22.
Figure 24:
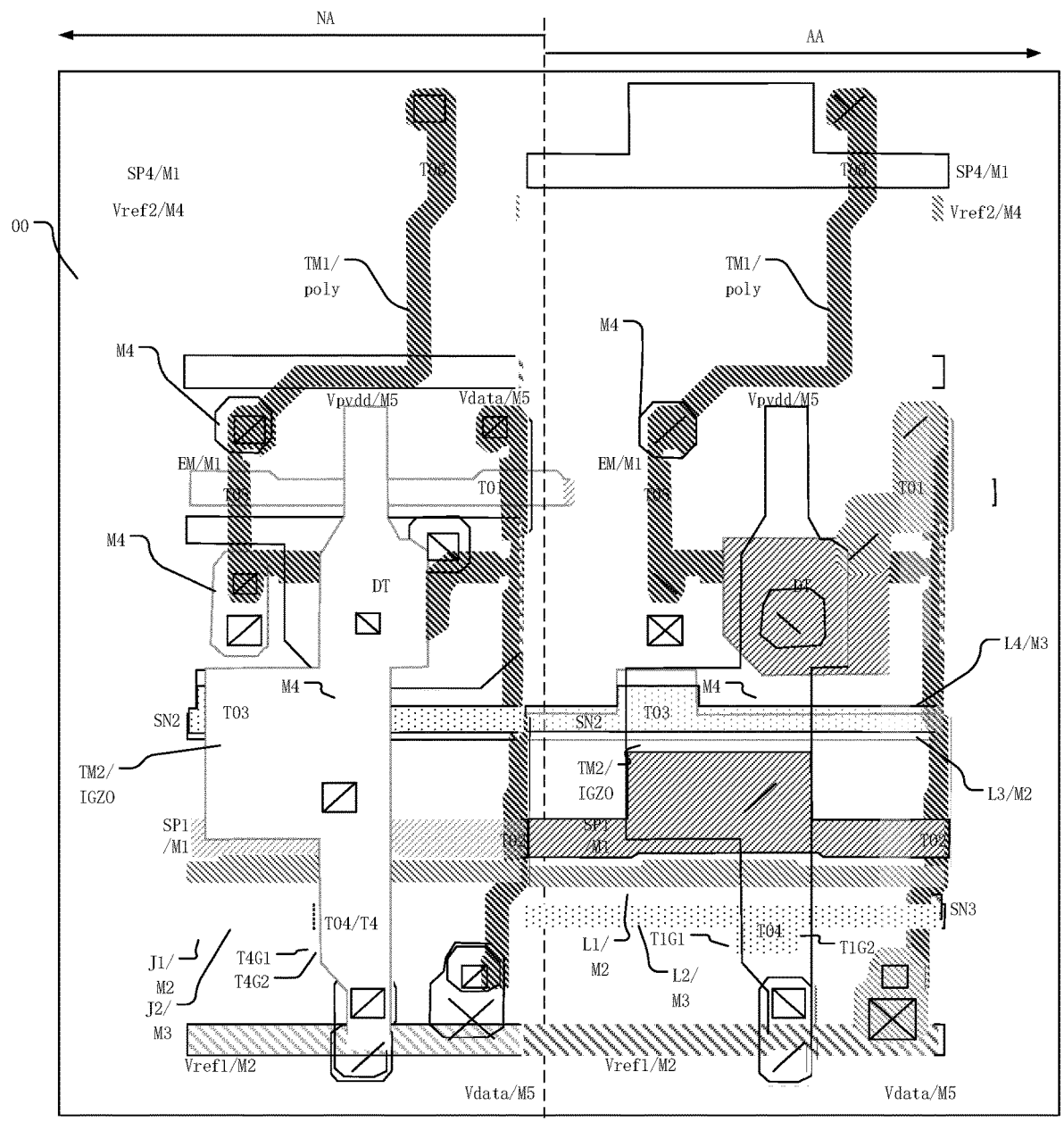
FIG. 24 illustrates another layout structure of a circuit connection structure formed on the substrate in FIG. 10.

In some optional embodiments, referring to FIG. 10, FIG. 11, and FIG. 22 to FIG. 24, FIG. 22 illustrates another structural plan view of a display panel consistent with various embodiments of the present disclosure. FIG. 23 illustrates a schematic diagram of the partial layout structure of a Q5 region on the substrate in FIG. 22. FIG. 24 illustrates another layout structure of a circuit connection structure formed on the substrate in FIG. 10. It can be understood that transparencies are filled in FIGS. 22-24 to clearly illustrate a structure of one embodiment. In the embodiment, the non-display area NA of the display panel 000 includes at least one third dummy subpixel PD3. The third dummy subpixel PD3 includes a fourth pixel circuit 10P3.

The fourth pixel circuit 10P3 at least includes a fourth type of double-gate transistor T4. A first gate T4G1 of the fourth type of double-gate transistor T4 and the first gate T1G1 of the first type of double-gate transistor T1 are formed on a same layer and in a same process. A second gate T4G2 of the fourth type of double-gate transistor T4 and the second gate T1G2 of the first type of double-gate transistor T1 are formed on a same layer and in a same process. The source and drain of the fourth-type of double-gate transistor T4 and the source and drain of the first type of double-gate transistor T1 are formed on a same layer and in a same process.

The non-display area NA includes at least one first detection line J1. The first gate T4G1 of the fourth type of double-gate transistor T4 is connected to the first detection line J1 in the non-display area NA. The second gate T4G2 of the fourth type of double-gate transistor T4 is connected to the second detection line J2 in the non-display area NA. A line width of the first detection line J1 is larger than the line width of the first control line L1. The line width of the first detection line J1 is larger than the line width of the second detection line J2. An orthographic projection of the first detection line J1 on the substrate 00 covers an orthographic projection of the second detection line J2 on the substrate 00.

The embodiment explains that the display panel 000 may further include at least one third dummy subpixel PD3. Optionally, the third dummy subpixel PD3 may be disposed in the non-display area NA. The third dummy subpixel PD3 may be disposed on a periphery of the non-display area NA close to the display area AA. In the embodiment, the third dummy subpixel PD3 can be formed in a same process as the first subpixel P in the display area AA. The third dummy subpixel PD3 includes a fourth pixel circuit 10P3. The fourth pixel circuit 10P3 includes at least the fourth type of double-gate transistor T4. The fourth type of double-gate transistor T4 may have a same structure and be formed in a same process as the first type of double-gate transistor T1 in the first pixel circuit 10, which helps improve process efficiency. In the embodiment, the third dummy subpixel PD3 does not emit light and is not configured for display. The third dummy subpixel PD3 has a same function as the first dummy subpixel PD1. The third dummy subpixel PD3 the first dummy subpixel PD1 and can be configured to prevent damage to the first subpixel P in the display area AA caused by an electrostatic discharge (ESD). It can be understood that, in the embodiment, an anti-static working principle of the third dummy subpixel PD3 is not repeated herein. For details, references can be made to technical solutions of the virtual pixel for electrostatic protection in s related art or an anti-static principle of the first dummy subpixel PD1 in the above embodiments.

In one embodiment, the fourth pixel circuit 10P3 in the third dummy subpixel PD3 is set to include at least a fourth type of double-gate transistor T4. That is, the fourth type of double-gate transistor T4 and the first type of double-gate transistor T1 may be of a same type. At least part of a structure of the third dummy subpixel PD3 for electrostatic protection disposed in the non-display area NA may be same as the structure of the first subpixel P. That is, the structure of the first pixel circuit 10 and a structure of the fourth pixel circuit 10P3 may be basically same. That is, the fourth pixel circuit 10P3 may also include the circuit connection structure shown in FIG. 10. As shown in FIG. 24, the first gate T4G1 of the fourth type of double-gate transistor T4 and the first gate T1G1 of the first type of double-gate transistor T1 are formed on a same layer and in a same process. The second gate T4G2 of the fourth type of double-gate transistor T4 and the second gate T1G2 of the first type of double-gate transistor T1 are formed on a same layer and in a same process. The source and drain of the fourth type of double-gate transistor T4 and the source and drain of the first type of double-gate transistor T1 are formed on a same layer and in a same process, so that the structure of the third dummy subpixel PD3 is formed together with the structure of the first subpixel P in the display area AA, which helps improve process efficiency.

In one embodiment, the non-display area NA includes at least one first detection line J1. The first gate T4G1 of the fourth type of double-gate transistor T4 is connected to the first detection line J1 in the non-display area NA. The line width of the first detection line J1 is larger than the line width of the first control line L1. That is, the first detection line J1 is not configured for monitoring the line width of the first control line L1. A monitoring of the line width of the first control line L1 is still in the display area AA. The line width of the first control line L1 is obtained by monitoring the first control line L1. The first gate T4G1 of the fourth type of double-gate transistor T4 is connected to the first detection line J1 in the non-display area NA. That is, the first detection line J1, the first gate T4G1 of the fourth type of double-gate transistor T4 and the first control line L1 in the display area AA can be formed on a same film layer and can be connected to each other to provide the third scanning signal SN3 for the first pixel circuit 10 in the display area AA through the first detection line J1. In the embodiment, the second gate T4G2 of the fourth type of double-gate transistor T4 is set to be connected to the second detection line J2 in the non-display area NA. The line width of the first detection line J1 is larger than the line width of the second detection line J2. The orthographic projection of the first detection line J1 on the substrate 00 covers the orthographic projection of the second detection line J2 on the substrate 00. When the second detection line J2 is formed above the first detection line J1. The line width of the second detection line J2 is smaller than the line width of the first detection line J1 under the second detection line J2, so that the orthographic projection of the second detection line J2 on the substrate 00 completely falls within an orthographic projection range of the first detection line J1 on the substrate 00. Since the boundary of the line width pattern of the second detection line J2 is all inside the boundary of the line width pattern of the first detection line J1, the boundary of the line width pattern of the second detection line J2 can be clearly obtained, thereby obtain the line width of the second detection line J2 by measurement. In addition, since the second detection line J2 and the second control line L2 are on a same layer and have a same width, the line width of the second control line L2 can be accurately obtained. In the embodiment, the first detection line J1 is used as a scan line of the third dummy subpixel PD3. The first detection line J1 and the first control line L1 in the display area AA are a one-pieced connected structure. The second detection line J2 is used as the scan line of the third dummy subpixel PD3. The second detection line J2 and the second control line L2 in the display area AA are a one-piece connected structure. The line width of the first detection line J2 is larger than the line width of the first control line L1, so the line width of the first control line L1 is still obtained by monitoring the first control Line L1 in the display area AA after the first control line L1 is formed, and before other metal lines are not superimposed on the first control line L1. The second detection line J2 can be used as a scanning line to provide the third scanning signal SN3 for the first pixel circuit 10 and can also be multiplexed into an outer surrounding line of the display area AA. The second detection line J2 and the second control line L2 are on a same layer and have a same width. The orthographic projection of the second detection line J2 on the substrate 00 completely falls within the orthographic projection range of the first detection line J1 on the substrate 00. Therefore, the second detection line J2 can be configured to monitor the line width of the second control line L2 without disposing an additional signal trace in the non-display area NA, which helps realize an accurate monitoring of line width and save a wiring space of the non-display area NA. In the embodiment, when the second control line L2 is formed in the display area AA, it is not necessary to consider an overlapping positional relationship between the first control line L1 and the second control line L2 in the display area AA. It is only necessary to include the second detection line J2 that is on a same layer and have a same width as the second control line L2 in the non-display area NA to realize an accurate monitoring of the line width of the second control line L2, which helps improve flexibility and freedom of a layout of control lines in the display area AA.

Figure 25:
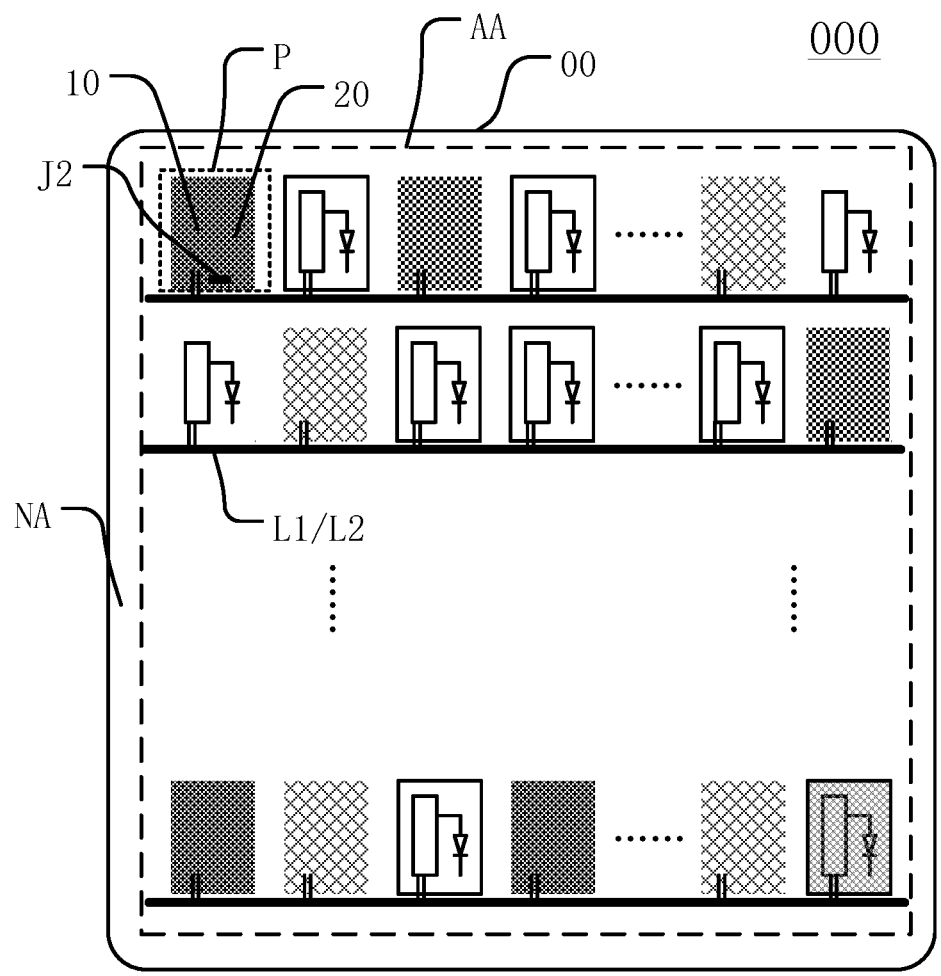
FIG. 25 illustrates another structural plan view of a display panel consistent with various embodiments of the present disclosure.
Figure 26:
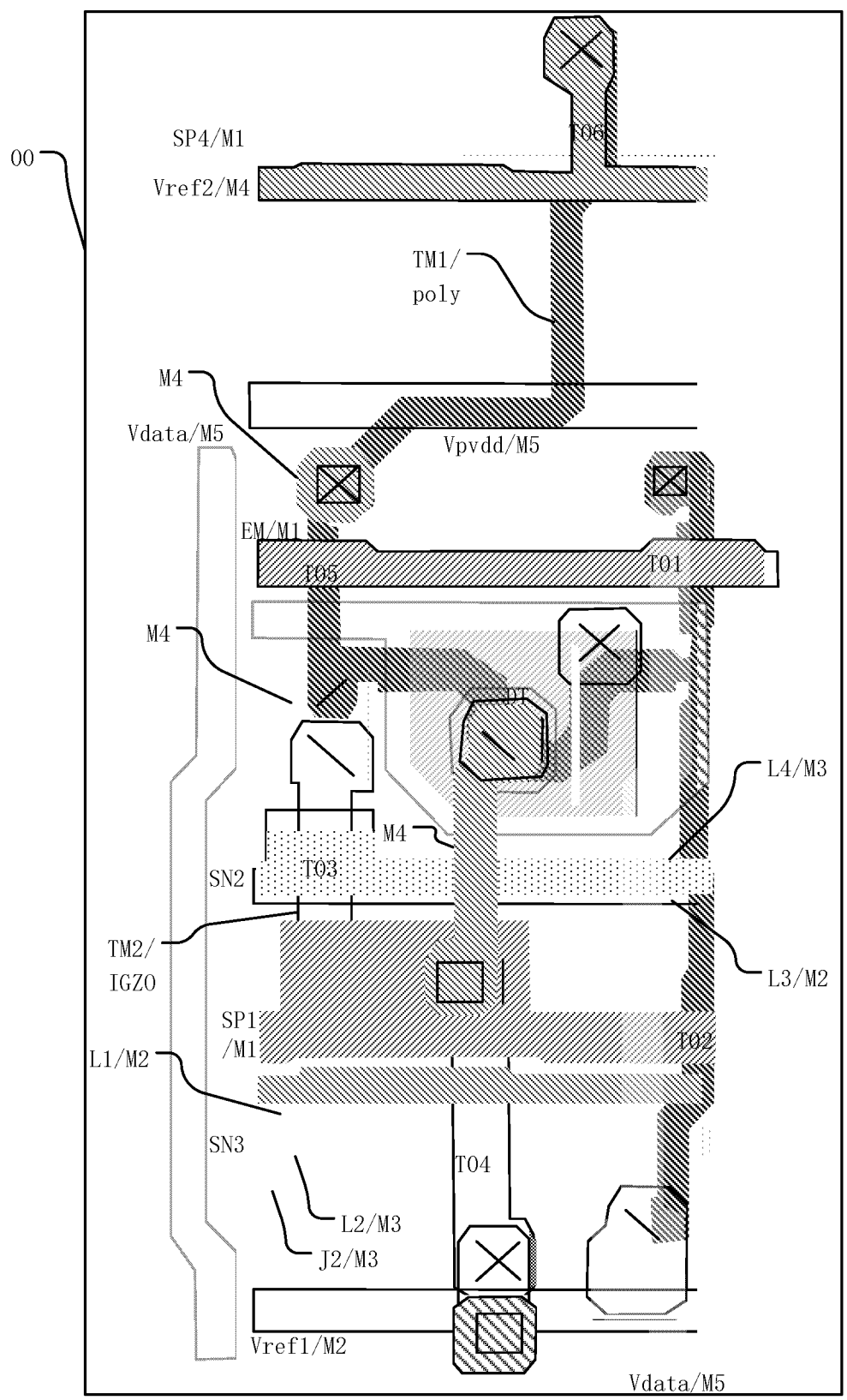
FIG. 26 illustrates a schematic diagram of a local layout structure of a first subpixel on a substrate in FIG. 25.
Figure 27:
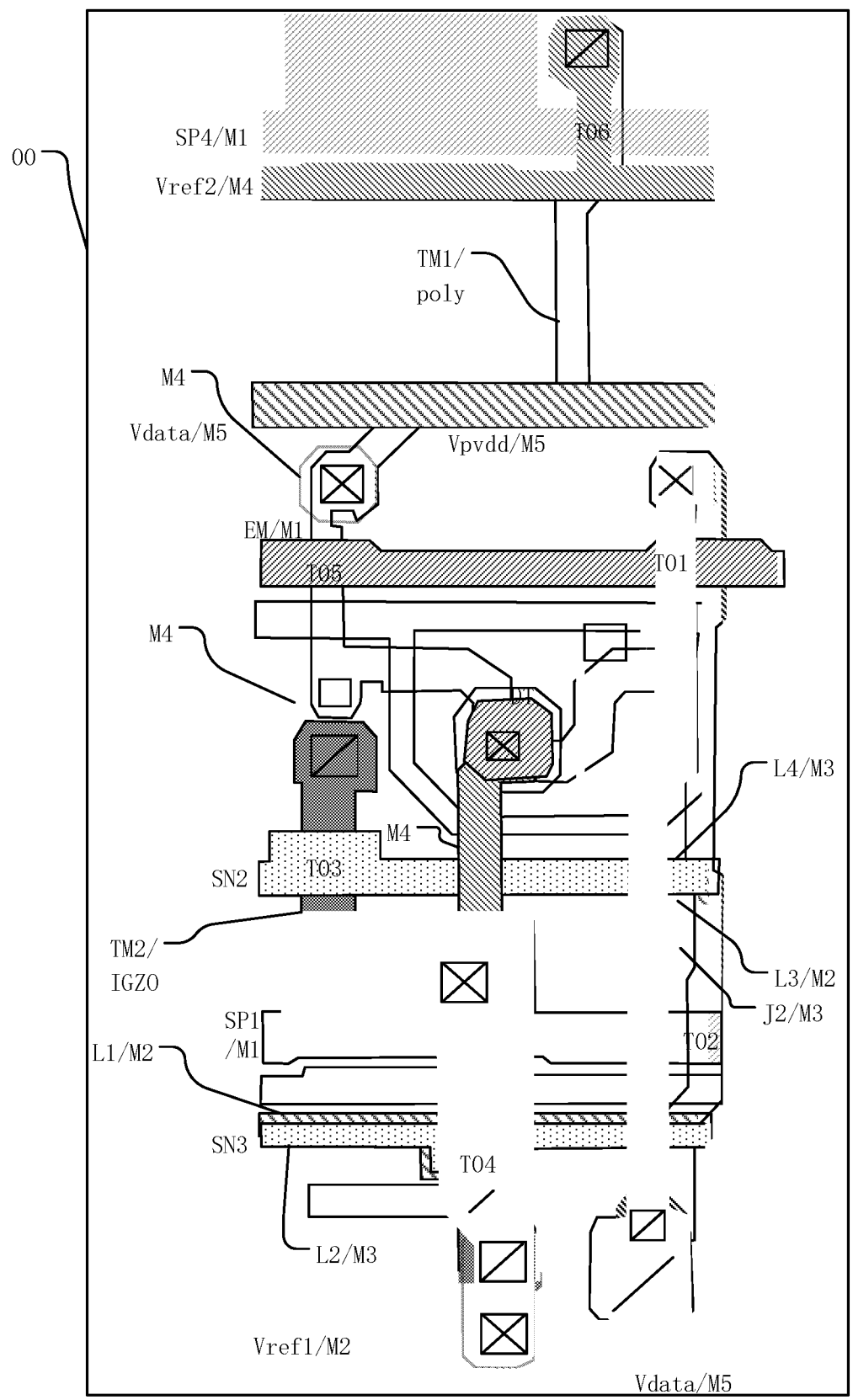
FIG. 27 illustrates a schematic diagram of another local layout structure of a first subpixel on the substrate in FIG. 25.

In some optional embodiments, referring to FIG. 10, FIG. 11, FIG. 25 and FIG. 26, FIG. 25 illustrates another structural plan view of a display panel consistent with various embodiments of the present disclosure. FIG. 26 illustrates a schematic diagram of a local layout structure of a first subpixel on a substrate in FIG. 25. It can be understood that transparencies are filled in FIGS. 25-26 to clearly illustrate a structure of one embodiment. In the embodiment, the second detection line J2 is in the display area AA.

The embodiment explains that the second detection line J2 for monitoring the line width of the second control line L2 can be set within a range of the display area AA. When the second control line L2 is formed, the second detection line J2 with a same width as the second control line L2 can be formed on a same layer. Optionally, in one embodiment, the second detection line J2 can be disposed at any position in the display area AA provided that no other metal traces are on a film layer under the second detection line J2 to interfere with the boundary of the line width pattern of the second detection line J2, and the boundary of the line width pattern of the second detection line J2 can be clearly identified. As shown in FIG. 25 and FIG. 26, the second detection line J2 may be disposed at a spare position in the display area AA to avoid interfering with a transmission of a driving signal of the display panel 000. In the embodiment, the second detection line J2 is disposed in the display area AA, thereby helping reduce number of traces in the non-display area NA and helping realize a narrow frame effect.

It can be understood that, in the embodiment, when the line width of the first control line L1 is monitored, since a top of the first control line L1 is not covered with other metal traces, the line width of the first control line L1 can be obtained by photographing the line width pattern of the first control line L1 for identification.

Optionally, as shown in FIG. 26, in one embodiment, both the second detection line J2 and the second control line L2 may be on the third metal layer M3 and may be formed at a same time. That is, when the third metal layer M3 is patterned, a structure of part of the third metal layer M3 can be defined as the second control line L2. a structure of part of the patterned third metal layer M3 can be defined as the second detection line J2, to realize a purpose of monitoring the line width of the second control line L2 in the display area AA through the second detection line J2 in the display area NA. The second detection line J2 in the display area AA can also not affect signal transmissions of various types of signal traces.

Optionally, as shown in FIG. 26, in the direction perpendicular to the plane where the display panel 000 is located, no metal structure is included between the second detection line J2 and the substrate 00. The embodiment explains that when the second detection line J2 is disposed on the substrate 00 in the display area AA, in the direction perpendicular to the plane of the display panel 000, no metal structure is included between the second detection line J2 and the substrate 00. When the second detection line J2 is formed, no other metal lines are formed to overlap a position of the second detection line J2 on the substrate 00, so that the boundary of the line width pattern of the second detection line J2 can be clearly identified when the line width pattern of the second detection line J2 is photographed, thereby avoiding an influence of monitoring accuracy due to a boundary interference of other metal traces under the second detection line J2.

In some optional embodiments, referring to FIG. 10, FIG. 11, FIG. 25, FIG. 26, and FIG. 27, FIG. 27 illustrates a schematic diagram of another local layout structure of a first subpixel on the substrate in FIG. 25. It can be understood that a transparency is filled in FIG. 27 to clearly illustrate a structure of one embodiment. In the embodiment, the second detection line J2 is floating or the second detection line J2 is connected to a fixed potential.

The embodiment explains that when the second detection line J2 is set in the display area AA, the second detection line J2 may be in a floating state. The second detection line J2 is not connected to any signal and is only configured for monitoring the line width of the second control line L2. Or the second detection line J2 disposed in the display area AA not only can be configured to monitor the line width of the second control line L2, but also can be connected to a fixed potential. For example, the second detection line J2 on the third metal layer M3 is electrically connected to a first power supply signal line configured for providing a first power supply signal Vpvdd (not filled). Optionally, different metal film layers can be electrically connected through vias, which not only can stabilize a signal of the second detection line J2, but also can reduce an impedance of the first power signal line in the display area AA, which is equivalent to that the first power signal line of the display panel is connected in parallel by two metal traces on different layers (i.e., an original first power signal line on the fifth metal layer M5 and the second detection line J2 on the third metal layer M3), thereby reducing an impedance of the first power signal line in the entire display panel 000 and improving signal transmission of the display panel.

In some optional embodiments, referring to FIG. 10, FIG. 11, and FIG. 25, in one embodiment, the first control line L1 includes a first subsection L11 and a second subsection L12. The second control line L2 includes a third subsection L21 and a fourth subsection L22. The orthographic projection of the active part T1P of the first type of double-gate transistor T1 on the substrate 00 overlaps an orthographic projection of the first subsection L11 on the substrate 00. An orthographic projection of the active part T1P of the first type of double-gate transistor T1 on the substrate 00 overlaps an orthographic projection of the third subsection L21 on the substrate 00. A line width W11 of the first subsection L11 is larger than a line width W21 of the second subsection L21, and a line width W21 of the third subsection L21 is larger than a line width W22 of the fourth subsection L22.

The embodiment explains that the first control line L1 includes the first subsection L11 and the second subsection L12. The second control line L2 includes a third subsection L21 and a fourth subsection L22. The first subsection L11 and the second subsection L12 only represent the first control line L1 in different areas, and the first subsection L11 and the second subsection L12 constitute an integral structure of the first control line L1. The third subsection L21 and the fourth subsection L22 only represent the second control line L2 in different areas, and the third subsection L21 and the fourth subsection L22 constitute an integral structure of the second control line L2. In the embodiment, the orthographic projection of the active part T1P of the first type of double-gate transistor T1 on the substrate 00 overlaps an orthographic projection of the first subsection L11 on the substrate 00. The orthographic projection of the active part T1P of the first type of double-gate transistor T1 on the substrate 00 overlaps an orthographic projection of the third subsection L21 on the substrate 00. A material of the active part T1P of the first type of double-gate transistor T1 can be a metal oxide, such as IGZO, to form a transistor with a double-gate structure including the bottom gate and the top gate of the first type of double-gate transistor T1. The first subsection L11 overlapping the orthographic projection of the active part T1P of the first type of double-gate transistor T1 on the substrate 00 is the first gate T1G1 of the first type of double-gate transistor T1. The third subsection L21 overlapping the orthographic projection of the active part T1P of the first type dual-gate transistor T1 on the substrate 00 is the second gate T1G2 of the first type dual-gate transistor T1. In the embodiment, a line width of the first subsection L11 is set larger than a line width of the second subsection L12, and a line width of the third subsection L21 is set larger than a line width of the fourth subsection L22, Since a performance of a metal oxide transistor is proportional to a channel width-to-length ratio of the metal oxide transistor, that is, the line width of the first subsection L11 is set larger than the line width of the second subsection L12, and the line width of the third subsection L21 is set larger than the line width of the fourth subsection L22, which helps improve the channel width-to-length ratio of the first type of double-gate transistor T1, thereby improving driving capability of the first type of double-gate transistor T1.

Figure 28:
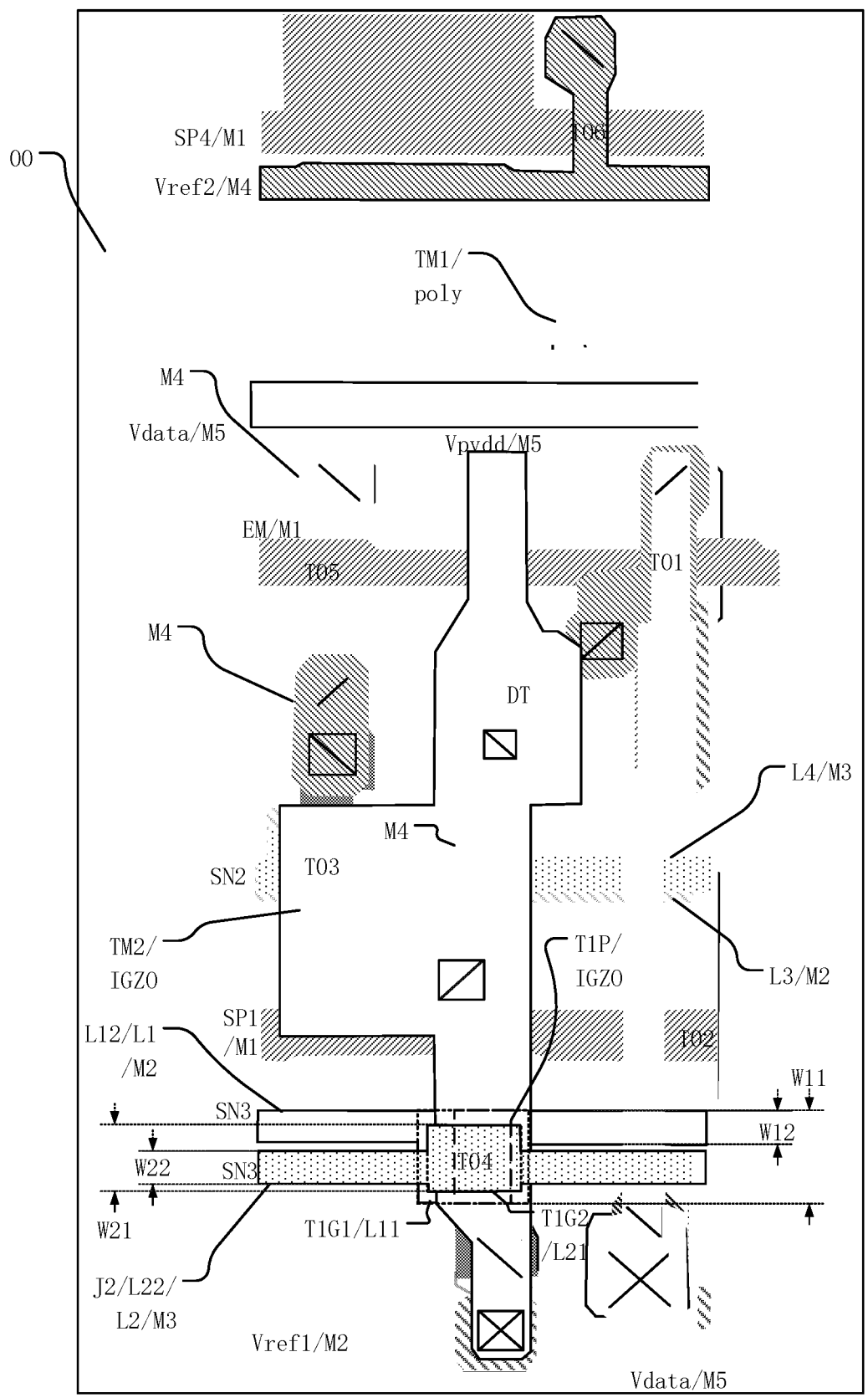
FIG. 28 illustrates a schematic diagram of another local layout structure of a first subpixel on the substrate in FIG. 25.

In some optional embodiments, referring to FIG. 10, FIG. 11, FIG. 25, and FIG. 28. FIG. 28 illustrates a schematic diagram of another local layout structure of a first subpixel on the substrate in FIG. 25. It can be understood that a transparency is filled in FIG. 28 to clearly illustrate a structure of one embodiment. In the embodiment, an orthographic projection of the second subsection L12 on the substrate 00 does not overlap an orthographic projection of the fourth subsection L22 on the substrate 00. The fourth subsection L22 is multiplexed into the second detection line J2.

The embodiment explains that when the second detection line J2 is in the display area AA, the original signal lines in the display area AA can be multiplexed into traces for monitoring line width. Specifically, the orthographic projection of the second subsection L12 of the first control line L1 on the substrate 00 does not overlap the orthographic projection of the fourth subsection L22 of the second control line L2 on the substrate 00. That is, the second subsection L12 in an area other than the first type of double-gate transistor T1 in the first control line L1 and the fourth subsection L22 in an area other than the first type of double-gate transistor T1 in the second control line L2 are staggered from each other without overlapping at all. The fourth subsection L22 and the substrate 00 are not interfered by the second subsection L12. Therefore, the fourth subsection L22 can be multiplexed into the second detection line J2 for monitoring the line width of the entire second control line L2. In the embodiment, multiplexing some subsections of the second control line L2 on the display panel 000 to monitor the line width of the second control line L2, not only can realize an accurate monitoring of the second control line L2, but also can avoid disposing an additional detection line in the display area AA for monitoring line width, which helps ensure display quality of the first subpixels P.

It can be understood that, in the embodiment, the line width W21 of the third subsection L21 of the second control line L2 is larger than the line width W22 of the fourth subsection L22. Therefore, when the line width of the second control line L2 is monitored, it is only necessary to monitor line widths of thinner parts of the fourth subsection L22 provided that the line widths of the thinner parts meet design requirements and avoids a risk of wire breakage at the thinner parts.

Figure 29:
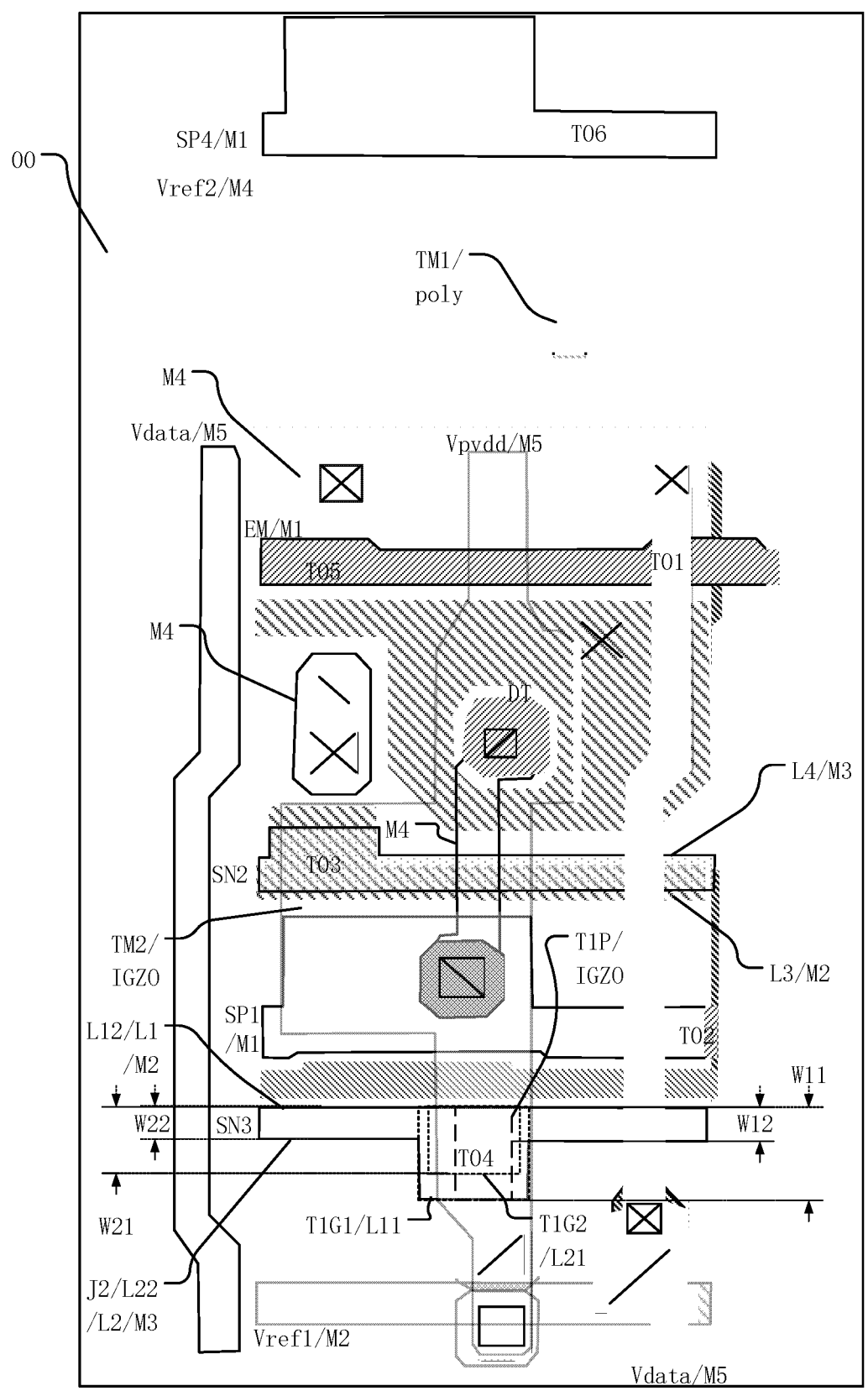
FIG. 29 illustrates a schematic diagram of another local layout structure of a first subpixel on the substrate in FIG. 25.
Figure 30:
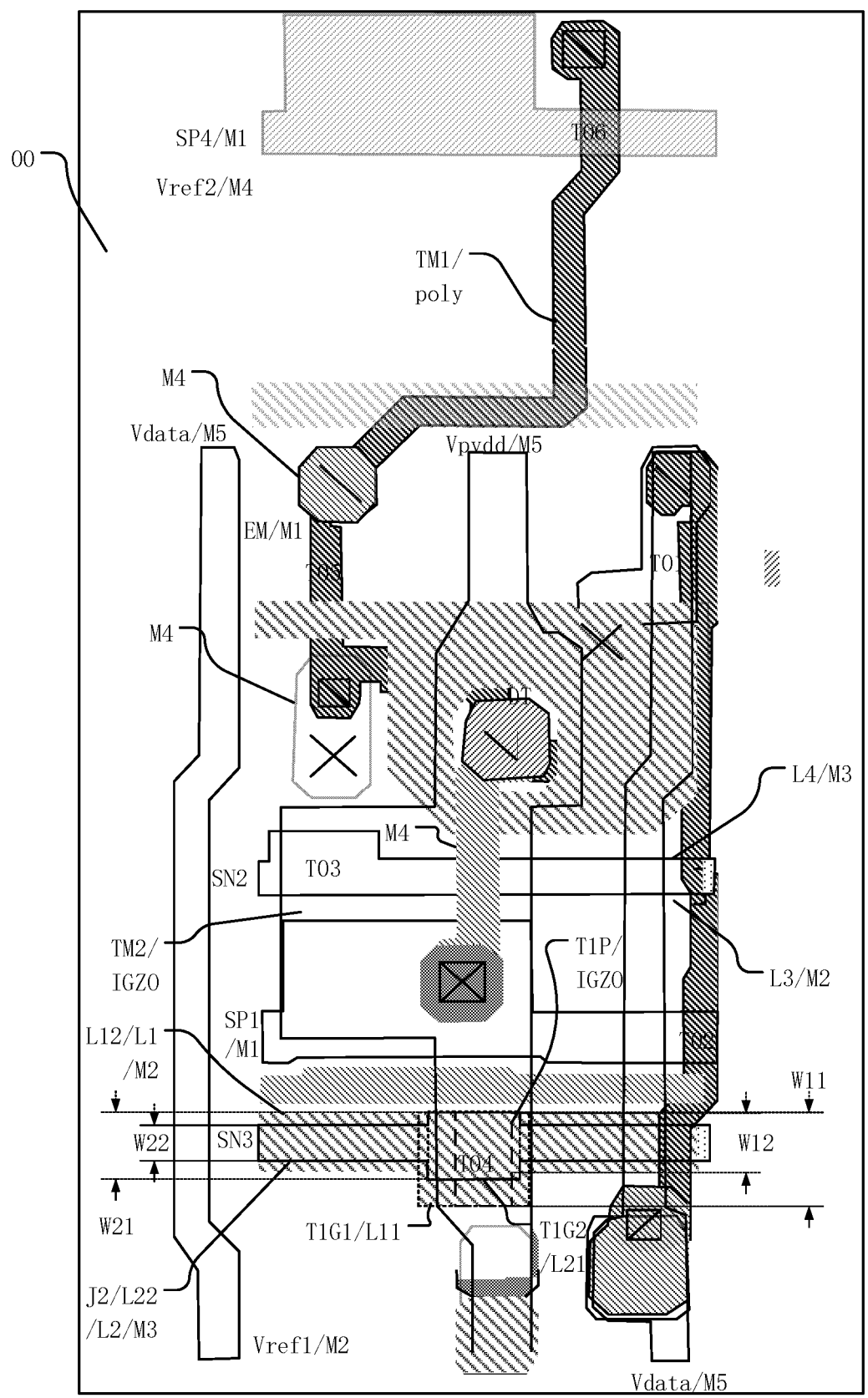
FIG. 30 illustrates a schematic diagram of another local layout structure of a first subpixel on the substrate in FIG. 25.

In some optional embodiments, referring to FIG. 10, FIG. 11, FIG. 25, and FIG. 29 and FIG. 30. FIG. 29 illustrates a schematic diagram of another local layout structure of a first subpixel on the substrate in FIG. 25. FIG. 30 illustrates a schematic diagram of another local layout structure of a first subpixel on the substrate in FIG. 25. It can be understood that transparencies are filled in FIGS. 29-30 to clearly illustrate a structure of one embodiment. In the embodiment, in the direction perpendicular to the plane where the display panel 000 is located, the orthographic projection of the second subsection L12 on the substrate 00 covers the orthographic projection of the fourth subsection L22 on the substrate 00. The fourth subsection L22 is multiplexed into the second detection line J2.

The embodiment explains that when the second detection line J2 is in the display area AA, Original signal lines in the display area AA can be multiplexed into traces for monitoring line width. Specifically, the orthographic projection of the second subsection L12 on the substrate 00 covers the orthographic projection of the fourth subsection L22 on the substrate 00. As shown in FIG. 29, a line width W12 of the second subsection L12 is equal to the line width W22 of the fourth subsection L22, and the orthographic projection of the second subsection L12 on the substrate 00 coincides with the orthographic projection of the fourth subsection L22 on the substrate 00. Or as shown in FIG. 30, the line width W12 of the second subsection L12 is larger than the line width W22 of the fourth subsection L22 and the orthographic projection of the second subsection L12 on the substrate 00 covers the orthographic projection of the fourth subsection L22 on the substrate 00. Since the orthographic projection of the second subsection L12 on the substrate 00 coincides with the orthographic projection of the fourth subsection L22 on the substrate 00, or the orthographic projection of the second subsection L12 on the substrate 00 covers the fourth subsection The orthographic projection of L22 on the substrate 00, the fourth subsection L22 can be multiplexed into the second detection line J2 for monitoring the line width of the entire second control line L2. There is no line width boundary interference of the second subsection L12 below the fourth subsection L22. The line width of the second control line L2 can be obtained by monitoring the line width of the fourth subsection L22. In the embodiment, multiplexing some subsections of the second control line L2 originally on the display panel 000 to monitor the line width thereof, not only can realize an accurate monitoring of the second control line L2, but also can avoid disposing an additional detection line in the display area AA for monitoring line width, which helps ensure display quality of the first subpixels P.

It can be understood that, in the embodiment, the line width W21 of the third subsection L21 of the second control line L2 is larger than the line width W22 of the fourth subsection L22. Therefore, when the line width of the second control line L2 is monitored, it is only necessary to monitor line widths of thinner parts of the fourth subsection L22 only once, provided that the line widths of the thinner parts meet design requirements and avoids a risk of wire breakage at the thinner parts.

Optionally, in one embodiment, in the direction perpendicular to the plane where the display panel 000 is located, and the orthographic projection of the second subsection L12 on the substrate 00 is set to cover the orthographic projection of the fourth subsection L22 on the substrate 00. It can also be avoided that when the orthographic projection of the fourth subsection L22 on the substrate 00 covers the orthographic projection of the second subsection L12 on the substrate 00, since the fourth subsection L22 is above the second subsection L12, if the line width of the fourth subsection L22 is relatively wide, and the line width of the second subsection L12 is relatively narrow, part of the fourth subsection L22 is easy to sag and climb on two sides of the second subsection L12. When the fourth subsection L22 is multiplexed into the second detection line J2, a monitoring of line width is likely to be inaccurate. Therefore, in the embodiment, in the direction perpendicular to the plane where the display panel 000 is located, the orthographic projection of the second subsection L12 on the substrate 00 is set to cover the orthographic projection of the fourth subsection L22 on the substrate 00. Monitoring of the line width of the second control line L2 can be realized by multiplexing the fourth sub-section L22, and monitoring accuracy can be further improved.

Optionally, as shown in FIG. 29, the line width W12 of the second subsection L12 is equal to the line width W22 of the fourth subsection L22, and the orthographic projection of the second subsection L12 on the substrate 00 coincides with the orthographic projection of the fourth subsection L22 on the substrate 00. Not only can the fourth subsection L22 be multiplexed to monitor the line width of the second control line L2, but also transmittance of the display area AA can be further improved.

Figure 31:
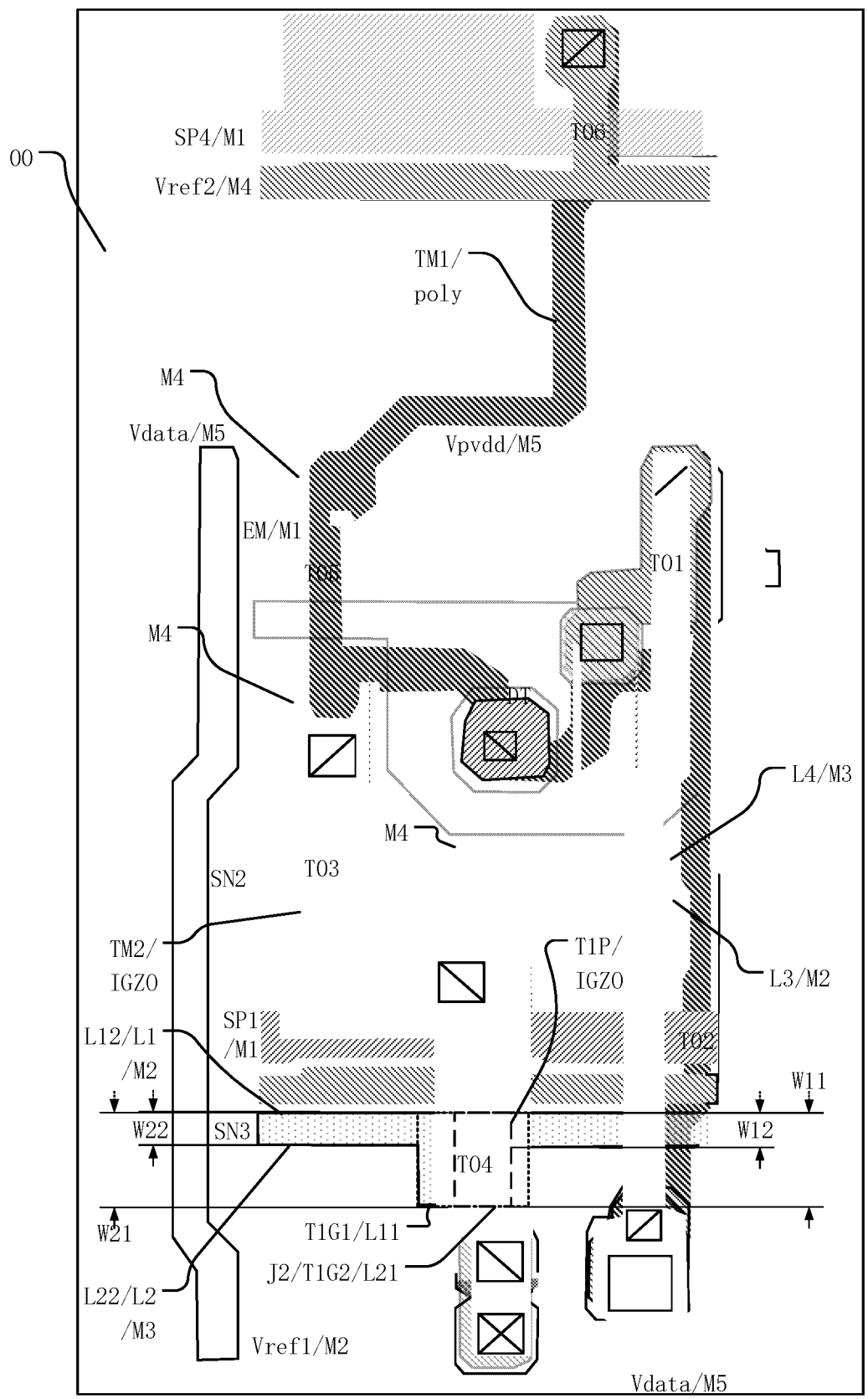
FIG. 31 illustrates a schematic diagram of another local layout structure of a first subpixel on the substrate in FIG. 25.
Figure 32:
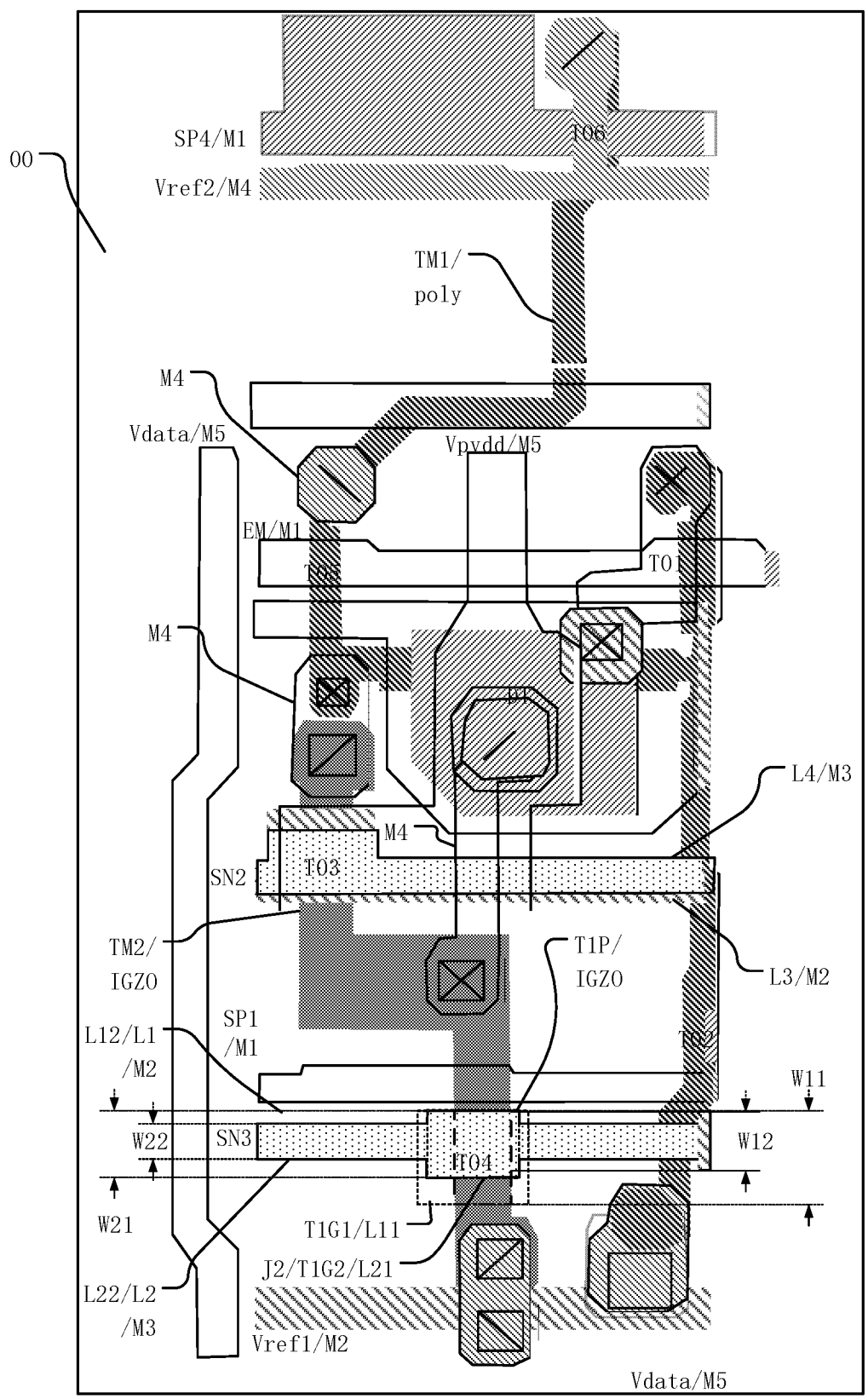
FIG. 32 illustrates a schematic diagram of another local layout structure of a first subpixel on the substrate in FIG. 25.

In some optional embodiments, referring to FIG. 10, FIG. 11, FIG. 25, and FIG. 31 and FIG. 32. FIG. 31 illustrates a schematic diagram of another local layout structure of a first subpixel on the substrate in FIG. 25. FIG. 32 illustrates a schematic diagram of another local layout structure of a first subpixel on the substrate in FIG. 25. It can be understood that transparencies are filled in FIGS. 31-32 to clearly illustrate a structure of one embodiment. In the embodiment, in the direction perpendicular to the plane where the display panel 000 is located, the orthographic projection of the first subsection L11 on the substrate 00 covers the orthographic projection of the third subsection L21 on the substrate 00.

The embodiment explains that the orthographic projection of the active part T1P of the first type of double-gate transistor T1 on the substrate 00 overlaps the orthographic projection of the first subsection L11 on the substrate 00. The orthographic projection of the active part T1P of the first type of double-gate transistor T1 on the substrate 00 overlaps the orthographic projection of the third subsection L21 on the substrate 00. A material of the active part T1P of the first type of double-gate transistor T1 may be a metal oxide such as IGZO to form a transistor with a double-gate structure including the bottom gate and the top gate of the first type of double-gate transistor T1. When the first subsection L11 overlapping the orthographic projection of the active part T1P of the first type of double-gate transistor T1 on the substrate 00 is the first gate T1G1 of the first type of double-gate transistor T1, and the third subsection L21 overlapping the orthographic projection of the active part T1P of the first type dual-gate transistor T1 on the substrate 00 is the second gate T1G2 of the first type dual-gate transistor T1, in the direction of the plane where the display panel 000 is located, the orthographic projection of the first subsection L11 on the substrate 00 covers the orthographic projection of the third subsection L21 on the substrate 00. As shown in FIG. 31, the orthographic projection of the first subsection L11 on the substrate 00 may coincide with the orthographic projection of the third subsection L21 on the substrate 00, which helps improve transmittance of the display area AA. Alternatively, as shown in FIG. 32, the orthographic projection of the third subsection L21 on the substrate 00 may be in a range of the orthographic projection of the first subsection L11 on the substrate 00. An area of the first gate T1G1 of the first type of double-gate transistor T1 is made relatively large to shield hydrogen ions and prevent the hydrogen ions in a film layer under the first gate T1G1 from diffusing to the active part T1P of IGZO in a high temperature process and avoid affecting a driving performance of the first type of double-gate transistor T1.

Optionally, as shown in FIG. 10, FIG. 11, FIG. 25 and FIG. 31 and FIG. 32, in the direction perpendicular to the plane where the display panel 000 is located, when the orthographic projection of the first subsection L11 on the substrate 00 covers the orthographic projection of the third subsection L21 on the substrate 00, the third subsection L21 is multiplexed into the second detection line J2.

The embodiment explains that when the second detection line J2 is in the display area AA, original signal lines in the display area AA can be multiplexed into traces for monitoring line width. Specifically, in the direction perpendicular to the plane of the display panel 000, the orthographic projection of the first subsection L11 on the substrate 00 covers the orthographic projection of the third subsection L21 on the substrate 00. As shown in FIG. 31, the line width W11 of the first subsection L11 is equal to the line width W21 of the third subsection L21, and the orthographic projection of the first subsection L11 on the substrate 00 coincides with the orthographic projection of the third subsection L21 on the substrate 00. Alternatively, as shown in FIG. 32, the line width W11 of the first subsection L11 is larger than the line width W21 of the third subsection L21 and the orthographic projection of the first subsection L11 on the substrate 00 covers the orthographic projection of the third subsection L21 on the substrate 00. Since the orthographic projection of the first subsection L11 on the substrate 00 coincides with the orthographic projection of the third subsection L21 on the substrate 00, or the orthographic projection of the first subsection L11 on the substrate 00 covers the orthographic projection of the third subsection L21 on the substrate 00, and the third subsection L21 can be multiplexed into the second detection line J2 for monitoring the line width of the entire second control line L2. There is no line width boundary interference of the second subsection L12 below the fourth subsection L22. The line width of the second control line L2 can be obtained by monitoring the line width of the fourth subsection L22. In the embodiment, multiplexing some subsections of the second control line L2 originally on the display panel 000 to monitor the line width of the second control line L2, not only can realize an accurate monitoring of the second control line L2, but also can avoid setting up an additional detection line in the display area AA for monitoring line width, which helps ensure display quality of the first subpixels P.

Figure 33:
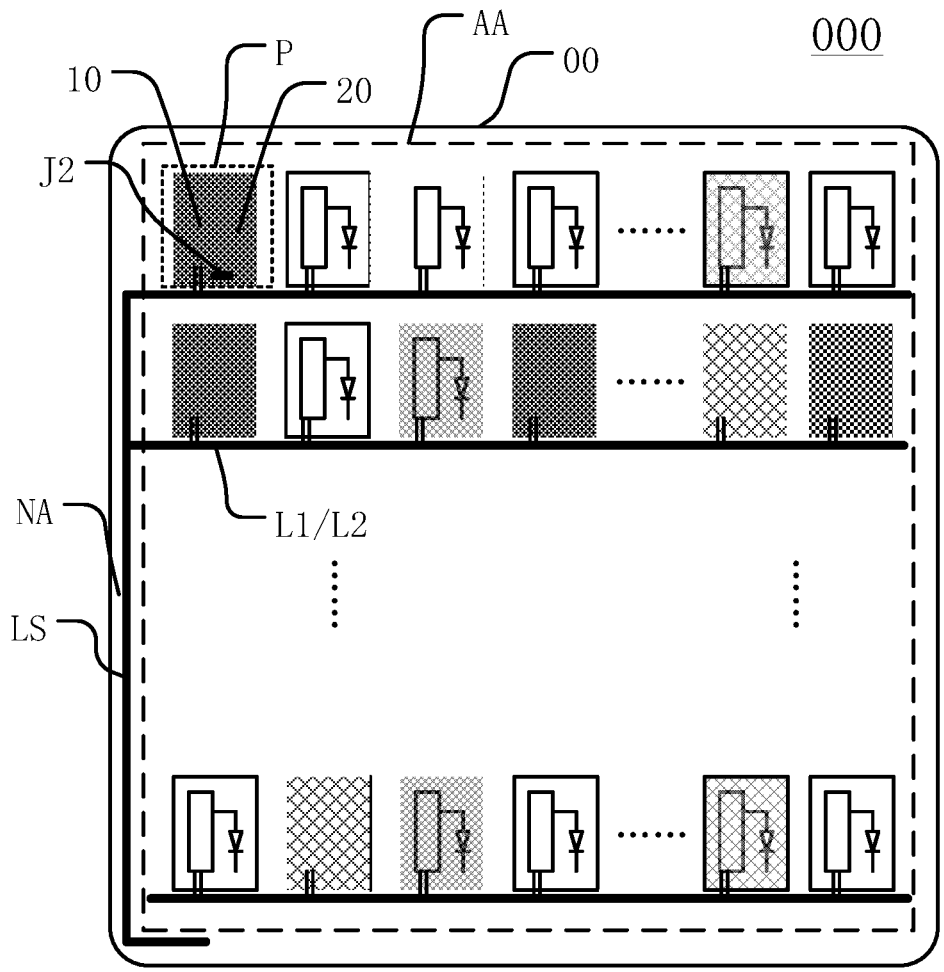
FIG. 33 illustrates another structural plan view of a display panel consistent with various embodiments of the present disclosure.
Figure 34:
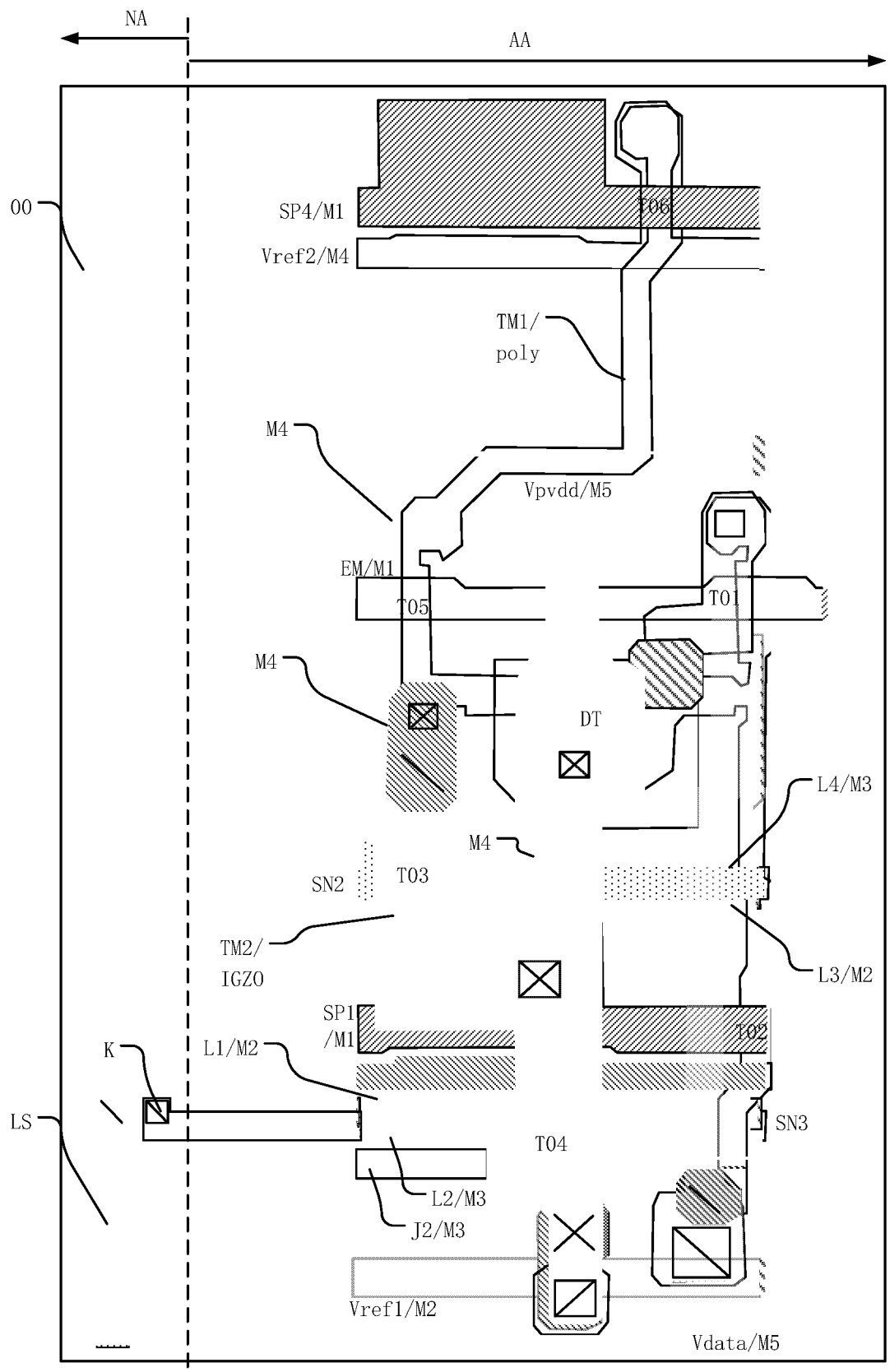
FIG. 34 illustrates a schematic diagram of the layout structure of the partial structure fabricated on the substrate in FIG. 33.

In some optional embodiments, referring to FIG. 33 and FIG. 34, FIG. 33 illustrates another structural plan view of a display panel consistent with various embodiments of the present disclosure. FIG. 34 illustrates a schematic diagram of the layout structure of the partial structure fabricated on the substrate in FIG. 33. It can be understood that transparencies are filled in FIGS. 33-34 to clearly illustrate a structure of one embodiment. In the embodiment, the non-display area NA further includes first transmission lines LS. In the non-display area NA, the first control line L1 is electrically connected to the second control line L2 through vias K. The first control line L1 is connected to a first transmission line LS or the second control line L2 is connected to a first transmission line LS.

The embodiment explains that the first control line L1 connected to the first gate T1G1 of the first type of double-gate transistor T1 and the second control line L2 connected to the second gate T1G2 of the first type of double-gate transistor T1 in the first pixel circuit 10 all need to be connected to the third scanning signal SN3. Therefore, the first control line L1 and the second control line L2 disposed on different layers can be electrically connected in the non-display area NA through the vias K, so that a setting area of the vias K can avoid the display area AA, which helps reduce the number of vias opened in the display area AA and prevent a display quality from being affected by an excessive number of the vias K in the display area AA. In the embodiment, the non-display area NA is further provided with first transmission lines LS. A first transmission line LS can be understood as an outer surrounding line of the display panel 000. As shown in FIG. 34, one end of the first transmission line LS may be connected to the first control line L1. Alternatively, one end of the first transmission line LS may be connected to the second control line L2 (not shown). The first transmission lines LS are disposed at least partially around the display area AA and is connected to a conductive pad in a binding area (not shown) of the display panel 000. Through a subsequent driver chip or flexible circuit board bound in the binding area, the third scanning signals SN3 are respectively transmitted by the first transmission lines LS to the first control line L1 and the second control line L2 in the display area AA to realize a driving function and a display effect of the display panel.

Optionally, in one embodiment, the first transmission lines LS in the non-display area NA may be disposed on a same layer as the first control line L1, or the first transmission lines LS in the non-display area NA may be disposed on a same layer as the second control line L2, or the first transmission lines LS in the non-display area NA may be disposed on a different layer from the first control line L1 and the second control line L2 (i.e., as shown in FIG. 34, the first transmission lines LS on different layers can also be electrically connected to the first control line L1 by opening vias), which is not limited herein. Provided that a wiring structure in the non-display area NA is not affected and short circuits between the wirings are avoided, the first transmission lines LS can be formed by adopting any conductive film layer.

Figure 35:
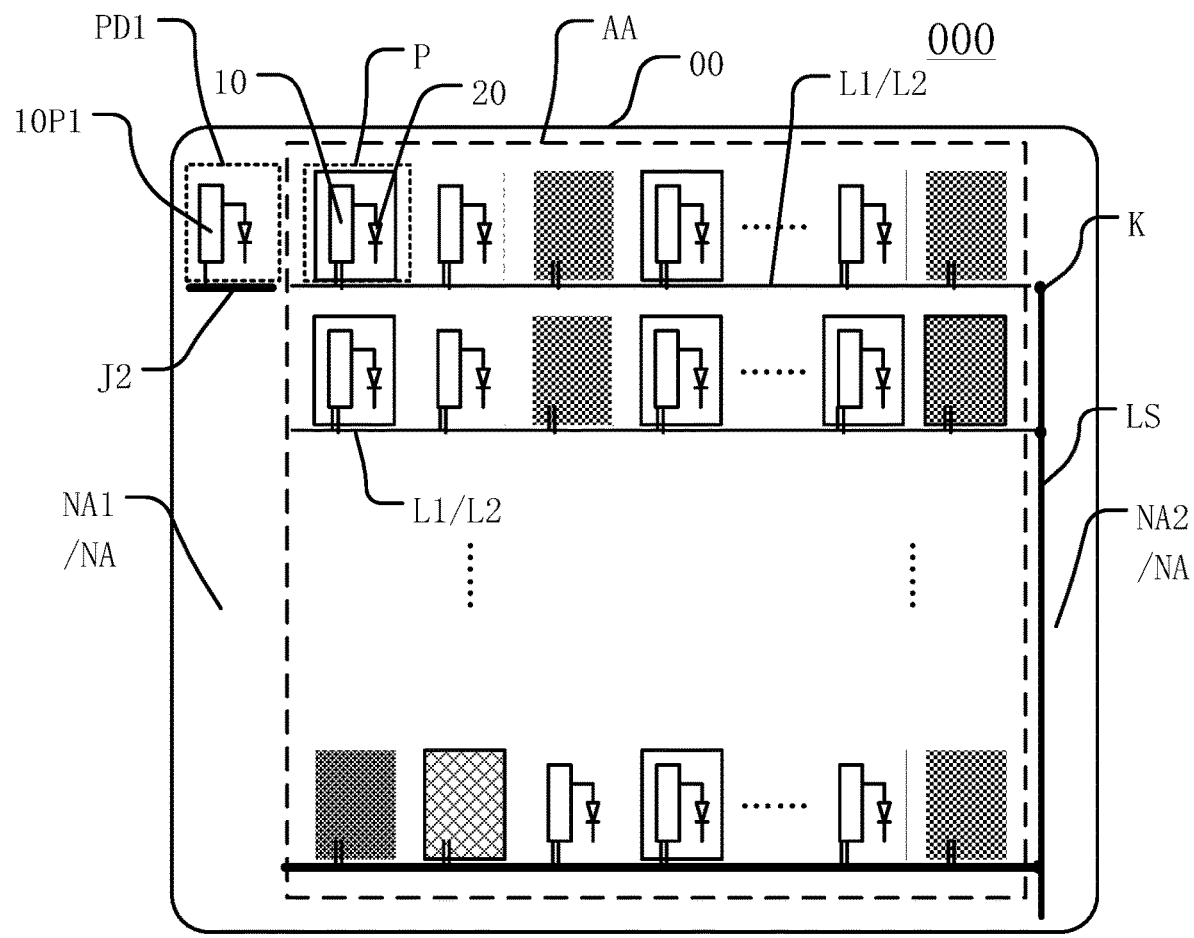
FIG. 35 illustrates another structural plan view of a display panel consistent with various embodiments of the present disclosure.

In some optional embodiments, referring to FIG. 35. FIG. 35 illustrates another structural plan view of a display panel consistent with various embodiments of the present disclosure. It can be understood that a transparency is filled in FIG. 35 to clearly illustrate a structure of one embodiment. In the embodiment, the non-display area NA includes a first non-display area NA1 and a second non-display area NA2. The first non-display area NA1 and the second non-display area NA2 are respectively located on opposite sides of the display area AA. The first dummy subpixel PD1 is in the first non-display area NA1. The first control line L1 is electrically connected to the second control line L2 in the second non-display area NA2 through the vias K.

The embodiment explains that the display panel 00 may include a first non-display area NA1 and a second non-display area NA2 on opposite sides of the display area AA respectively, the first dummy subpixel PD1 for electrostatic protection is disposed in the first non-display area NA1, and the first control line L1 is electrically connected to the second control line L2 in the second non-display area NA2 through the vias K, which can avoid that too much space is occupied if the first dummy subpixel PD1 and the vias K are disposed in the non-display area NA on a same side of the display area AA, resulting in a spatial unevenness between the first non-display area NA1 and the second non-display area NA2 on the opposite sides of the display area AA. The vias K connected to the first control line L1 and the second control line L2 is disposed in the second non-display area NA2, to avoid a leakage of static electricity along the via caused by setting the vias K, thereby affecting an electrostatic protection effect of the first dummy subpixel PD1.

It can be understood that, in the embodiment, a setting structure and a principle of the first dummy subpixel PD1 are not repeated herein. One embodiment in which the second detection line J2 can multiplex part of structures in the first dummy subpixel PD1 are not repeated herein as well. For details, references can be made to a description of the above related embodiment.

Figure 36:
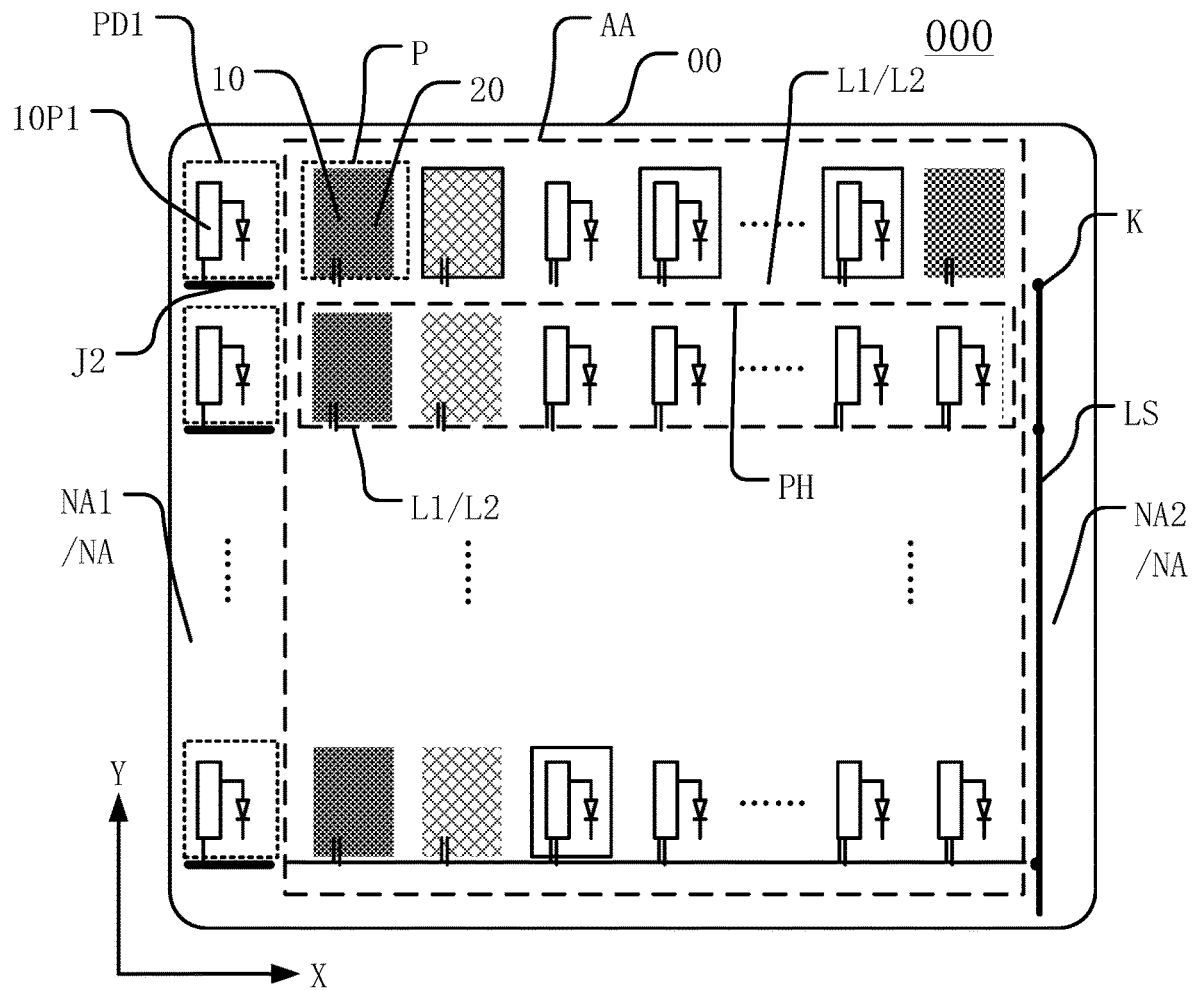
FIG. 36 illustrates another structural plan view of a display panel consistent with various embodiments of the present disclosure.

In some optional embodiments, referring to FIG. 36. FIG. 36 illustrates another structural plan view of a display panel consistent with various embodiments of the present disclosure. It can be understood that a transparency is filled in FIG. 36 to clearly illustrate a structure of one embodiment. In the embodiment, the non-display area NA includes a plurality of first dummy subpixels PD1 disposed at least partially around the display area AA. A plurality of first subpixels P is disposed along a first direction X to form a first subpixel row PH. A plurality of first subpixel rows PH is disposed along a second direction Y. The first direction X and the second direction Y intersect. The plurality of first subpixels P in the first subpixel row PH is electrically connected to a same first control line L1. The plurality of first subpixels P in the first subpixel row PH is electrically connected to a same second control line L2. At least one first subpixel row PH corresponds to one first dummy subpixel PD1.

The embodiment explains that the first subpixels P in the display area AA of the display panel 000 can be disposed in an array. The plurality of first subpixels P is disposed along the first direction X to form the first subpixel row PH. The plurality of first subpixel rows PH is disposed along the second direction Y. The first direction X and the second direction Y intersect. Optionally, one embodiment is illustrated by taking an example that the first direction X and the second direction Y are perpendicular to each other in a direction parallel to the plane where the display panel 000 is located. In the embodiment, the plurality of first subpixels P in the first subpixel row PH is electrically connected to a same first control line L1. The plurality of first subpixels P in the first subpixel row PH is electrically connected to a same second control line L2. Therefore, the plurality of first subpixels P in the entire first subpixel row PH can be controlled through the first control line L1, so that first gates of the first type of double-gate transistors T1 in the plurality of first subpixels P in a first subpixel row PH are all turn-on signals. The plurality of first subpixels P of the entire first subpixel row PH can be controlled through the second control line L2, so that the second gates of the first type double-gate transistors T1 in the plurality of first subpixels P of the first subpixel row PH are all turn-on signals. Therefore, the first type of double-gate transistors T1 in a same first subpixel row PH are turned on or off at a same time to input scan driving signals. In the embodiment, at least one first subpixel row PH corresponds to one first dummy subpixel PD1, so that the plurality of first dummy subpixels PD1 can be disposed around the display area AA, which helps play a role of electrostatic protection for the first subpixels P in each first subpixel row PH, avoids damage to the first subpixels P of a certain first subpixel row PH when the first dummy subpixels PD1 are not disposed on a periphery of the certain first subpixel row PH, and further improves anti-static effect of the entire display panel 000.

Optionally, at least one first subpixel row PH corresponds to one first dummy subpixel PD1. The second control line L2 corresponding to each first subpixel row PH can also correspond to one first dummy subpixel PD1. A structure of a corresponding first dummy subpixel PD1 can be multiplexed into a monitoring line for monitoring the line width the second control line L2, that is, can be multiplexed into the second detection line J2, so that the display panel 000 may include a plurality of second detection lines J2. At least one second control line L2 is set corresponding to one second detection line J2, to better monitor line widths of all the second control lines L2 on the display panel 000.

Optionally, in one embodiment, the first dummy subpixels PD1 corresponding to different first subpixel rows PH are all on a same side of the display area AA in the first direction X. The embodiment explains that a plurality of first dummy subpixels PD1 included in the non-display area NA may be on a same side of the display area AA in the first direction X. That is, the first dummy subpixels PD1 corresponding to different first subpixel rows PH can all be disposed at a same end of the first subpixel row PH. A structure of a plurality of first dummy subpixels PD1 can be formed on the substrate 00 on a same side of the display area AA, which helps reduce a process difficulty and improve process efficiency.

Figure 37:
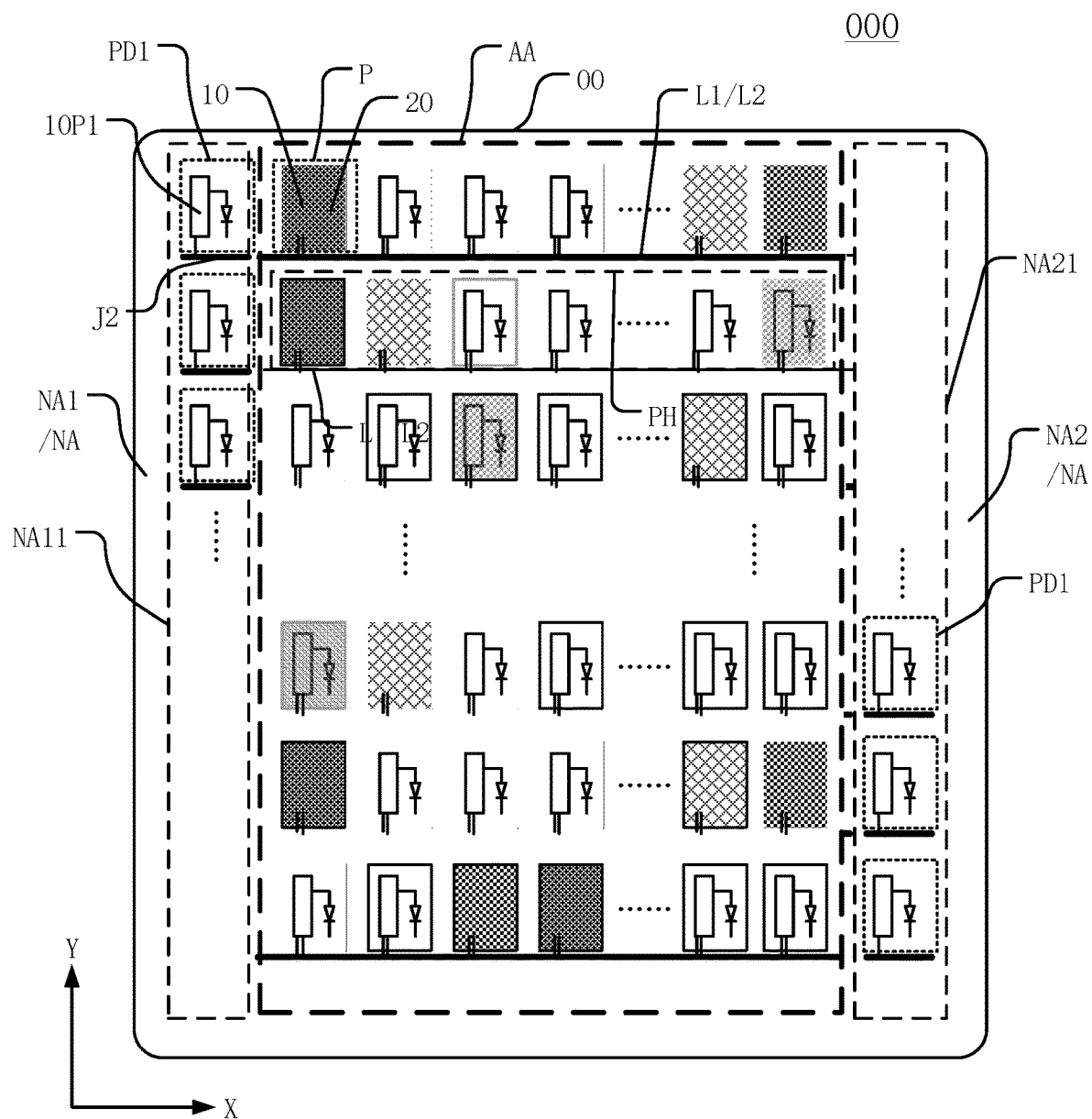
FIG. 37 illustrates another structural plan view of a display panel consistent with various embodiments of the present disclosure.

In some optional embodiments, referring to FIG. 37. FIG. 37 illustrates another structural plan view of a display panel consistent with various embodiments of the present disclosure. It can be understood that a transparency is filled in FIG. 37 to clearly illustrate a structure of one embodiment. In the embodiment, in the first direction X, two sides of the display area AA1 include a first area NA11 and a second area NA21 that are oppositely disposed. Both the first area NA11 and the second area NA21 are in the non-display area NA. Optionally, the first area NA11 can be understood as part of the first non-display area NA1 of the non-display area NA close to the display area AA. The second area NA21 can be understood as part of the second non-display area NA2 of the non-display area NA close to the display area AA.

At least part of the first dummy subpixels PD1 corresponding to the first subpixel rows PH are in the first area NA11, and at least part of the first dummy subpixels PD1 corresponding to the first subpixel rows PH are in the second area NA21.

The embodiment explains that the first dummy subpixels PD1 corresponding to different first subpixel rows PH may be on different sides of the display area AA in the first direction X. That is, the plurality of first dummy subpixels PD1 included in the non-display area NA may be on different sides of the display area AA in the first direction X. At least part of the first dummy subpixels PD1 corresponding to the first subpixel row PH are in the first area NA11. At least part of the first dummy subpixels PD1 corresponding to the first subpixel row PH are in the second area NA21. Therefore, the plurality of first dummy subpixels PD1 are evenly disposed on two sides of the display area AA, which helps make border widths of the first non-display area NA1 and the second non-display area NA2 as equal as possible, to avoid an excessively large border at one edge of the display panel 000 to affect a user's visual effect.

Figure 38:
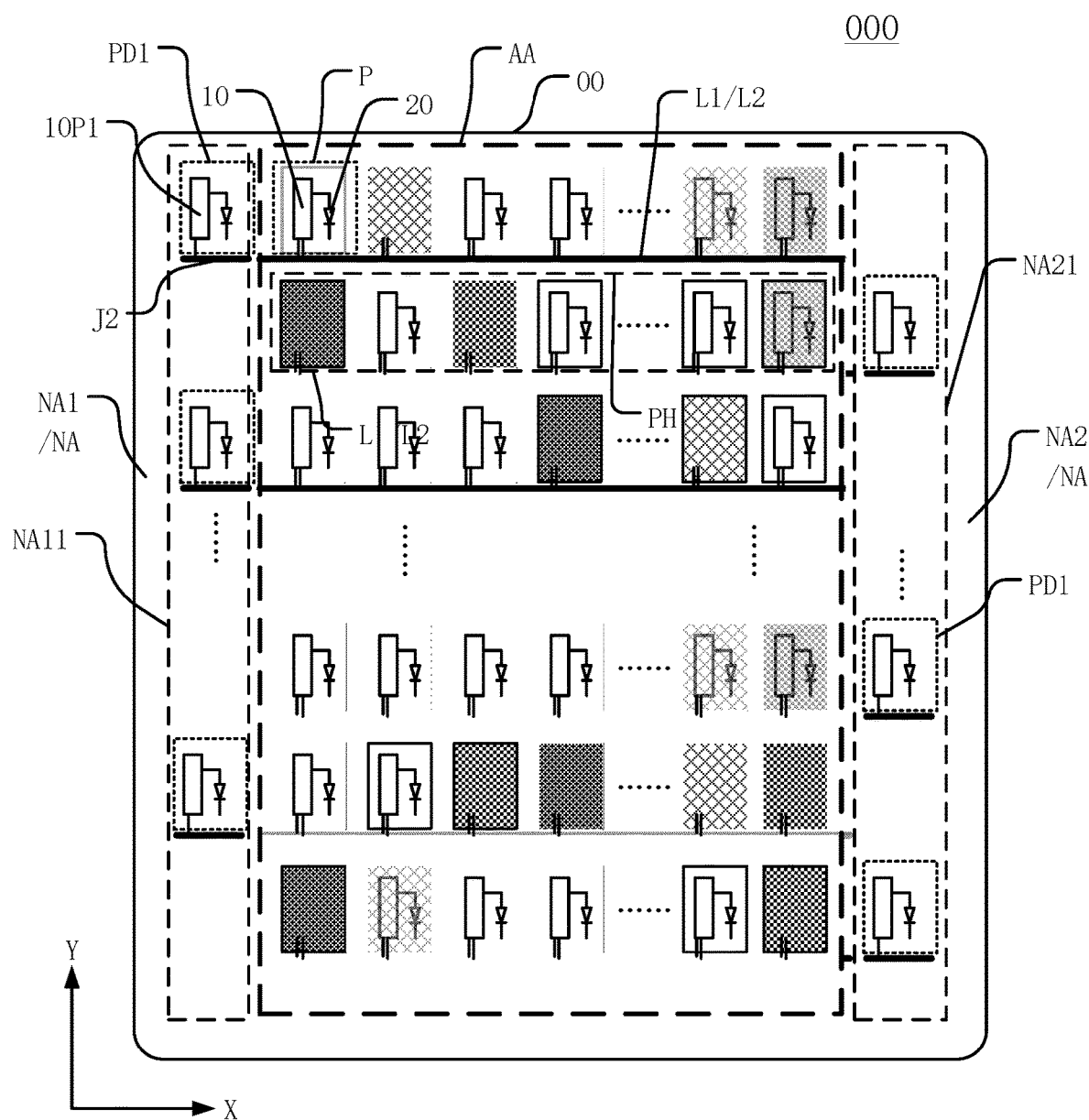
FIG. 38 illustrates another structural plan view of a display panel consistent with various embodiments of the present disclosure.

Optionally, referring to FIG. 38, FIG. 38 illustrates another structural plan view of a display panel consistent with various embodiments of the present disclosure. It can be understood that a transparency is filled in FIG. 38 to clearly illustrate a structure of one embodiment. In the embodiment, for two adjacent first subpixel rows PH, the first dummy subpixel PD1 corresponding to one first subpixel row PH are in the first area NA11, and the first dummy subpixel PD1 corresponding to the other first subpixel row PH are in the second area NA21.

The embodiment explains that when the first dummy subpixels PD1 corresponding to different first subpixel rows PH are on different sides of the display area AA in the first direction X, two first dummy subpixels PD1 corresponding to two adjacent first subpixel rows PH are respectively on opposite sides of the display area AA. That is, for the two adjacent first subpixel rows PH, the first dummy subpixel PD1 corresponding to one first subpixel row PH is in the first area NA11, and the first dummy subpixel PD1 corresponding to the other first subpixel row PH is in the second area NA21, which can make the first dummy subpixels PD1 disposed at two ends of an area where the two adjacent first subpixel rows PH are located more uniform and can make number of the first dummy subpixels PD1 in the first area NA11 and number of the first dummy subpixels PD1 in the second area NA21 as consistent as possible. The entire display panel is better protected by the plurality of first dummy sub-pixels PD1 in the first non-display area NA1 and the plurality of first dummy sub-pixels PD1 in the second non-display area NA2, thereby avoiding electrostatic damage, and further helping improve anti-static effect of the display panel 000.

Figure 39:
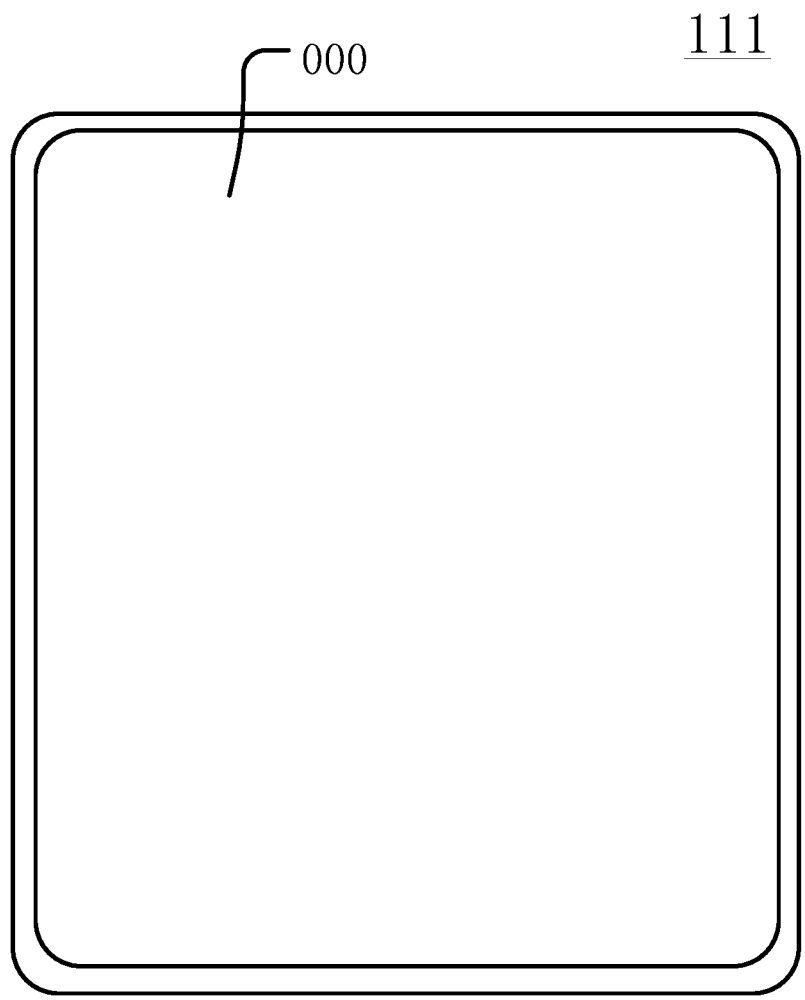
FIG. 39 illustrates a structural plan view of a display device consistent with various embodiments of the present disclosure.

In some optional embodiments, referring to FIG. 39, FIG. 39 illustrates a structural plan view of a display device consistent with various embodiments of the present disclosure. In one embodiment, the display device 111 includes the display panel 000 provided in the above embodiments. The embodiment of FIG. 39 only takes a mobile phone as an example to describe the display device 111. It can be understood that the display device 111 may be another display device with a display function, such as a computer, a TV, or a vehicle-mounted display device, which is not specifically limited herein. The display device 111 has beneficial effects of the display panel 000 provided by the embodiments of the present disclosure. For details, references may be made to specific descriptions of the display panel 000 in the above embodiments, which are not repeated herein.

As disclosed, the display panel and the display device provided by the present disclosure at least achieve the following beneficial effects.

The display area of the display panel provided by the present disclosure may include a plurality of first subpixels. The first subpixel can be understood as a subpixel for display on the display panel. The first pixel circuit in the first subpixel at least includes the first type of double-gate transistor. Compared with a single-gate transistor, a double-gate transistor can effectively improve carrier mobility of the first type of double-gate transistor, which is beneficial to further improve resolution of the display panel. The first pixel circuit in the present disclosure includes the first type of double-gate transistor, and a driving capability of the double-gate transistor can be improved by utilizing a high mobility characteristic of the double-gate transistor, so that the first pixel circuit is more suitable for a large-sized, high-resolution display panel. In the present disclosure, the first gate of the first type of double-gate transistor is connected to the first control line, the second gate of the first type of double-gate transistor is connected to the second control line. That is, two gates of a same first type of double-gate transistor are respectively supplied with control signals by two control lines, to realize a turn-on or turn-off of the first type of double-gate transistor. The display panel of the present disclosure further includes the second detection line. The second detection line and the second control line have a same width, so that the second detection line and the second control line are on a same layer and have a same width. The line width of the second control line is obtained by monitoring the line width of the second detection line. Since a position of the second detection line avoids an area overlapping the first control line, that is, there are no other interference lines that overlap the second detection line under the second detection line, a boundary of a line width pattern of the second detection line in a picture including the second detection line on the substrate can be automatically distinguished by a machine. Therefore, the line width of the second detection line can be accurately obtained, and the line width of the second control line can be obtained at a same time. The display panel provided by the present disclosure can monitor signal trace width on the display panel in real time by disposing the second detection line. Not only a monitoring method is simple and easy to operate, but also monitoring accuracy can be improved, which helps ensure display quality of a formed display panel.

Although some specific embodiments of the present disclosure have been described in detail by way of examples, a person skilled in the art should understand that the above examples are only for illustration, not for limiting the scope of the present disclosure. It should be understood by a person skilled in the art that modifications to the above embodiments may be made without departing from the scope and spirit of the present disclosure. The scope of the disclosure is defined by the appended claims.

What is claimed is:

1. A display panel, comprising a display area and a non-display area, wherein:
    the display panel includes:
        a substrate;
        a plurality of first subpixels on the substrate, wherein:
            a first subpixel of the plurality of first subpixels includes a first pixel circuit and a light-emitting element electrically connected to the first pixel circuit,
            the first pixel circuit at least includes a first type of double-gate transistor, a first gate of the first type of double-gate transistor is connected to a first control line, and a second gate of the first type of double-gate transistor is connected to a second control line,
            in the display area, the first control line and the second control line are disposed on different layers, and a film layer where the second control line is located is on a side of a film layer where the first control line is located away from the substrate,
            at least part of an orthographic projection of the first control line corresponding to the first type of double-gate transistor on the substrate at least overlaps part of an orthographic projection of the second control line on the substrate; and
        a second detection line having a same width as the second control line.

2. The display panel according to claim 1, wherein the second detection line and the second control line are disposed on a same layer.

3. The display panel according to claim 1, wherein:
an active layer is included between the film layer where the first control line is located and the film layer where the second control line is located, and an active part of the first type of double-gate transistor is on the active layer; and
at least part of an orthographic projection of the first control line on the substrate overlaps an orthographic projection of the active part of the first type of double-gate transistor on the substrate, at least part of an orthographic projection of the second control line on the substrate overlaps the orthographic projection of the active part of the first type of double-gate transistor on the substrate.

4. The display panel according to claim 3, wherein the second detection line is in the display area.

5. The display panel according to claim 4, wherein no metal structure is included between the second detection line and the substrate in a direction perpendicular to a plane where the display panel is located.

6. The display panel according to claim 5, wherein the second detection line is floating, or the second detection line is connected to a fixed potential.

7. The display panel according to claim 4, wherein:
the first control line includes a first subsection and a second subsection, and the second control line includes a third subsection and a fourth subsection;
an orthographic projection of the active part of the first type of double-gate transistor on the substrate overlaps an orthographic projection of the first subsection on the substrate, and the orthographic projection of the active part of the first type of double-gate transistor on the substrate overlaps an orthographic projection of the third subsection on the substrate; and
a line width of the first subsection is larger than a line width of the second subsection, a line width of the third subsection is larger than a line width of the fourth subsection.

8. The display panel according to claim 7, wherein:
an orthographic projection of the second subsection on the substrate does not overlap an orthographic projection of the fourth subsection on the substrate; and
the fourth subsection is multiplexed into the second detection line.

9. The display panel according to claim 7, wherein:
in a direction perpendicular to a plane where the display panel is located, an orthographic projection of the second subsection on the substrate covers an orthographic projection of the fourth subsection on the substrate; and
the fourth subsection is multiplexed into the second detection line.

10. The display panel according to claim 7, wherein the orthographic projection of the first subsection on the substrate covers the orthographic projection of the third subsection on the substrate in a direction perpendicular to a plane where the display panel is located.

11. The display panel according to claim 10, wherein the third subsection is multiplexed into the second detection line.

12. The display panel according to claim 11, wherein:
the non-display area further includes a first transmission line;
in the non-display area, the first control line and the second control line are electrically connected through a via; and
the first control line is connected to the first transmission line or the second control line is connected to the first transmission line.

13. The display panel according to claim 1, wherein the second detection line is in the non-display area.

14. The display panel according to claim 13, wherein:
the non-display area includes at least one first dummy subpixel, and a first dummy subpixel of the at least one first dummy subpixel includes a second pixel circuit; and
the second pixel circuit at least includes a second type of transistor, and the second detection line and a gate of the second type of transistor are disposed on a same layer.

15. The display panel according to claim 14, wherein:
the second type of transistor is a double-gate transistor, a first gate of the second type of transistor and the first gate of the first type of double-gate transistor are formed on a same layer and in a same process, a second gate of the second type of transistor and the second gate of the first type of double-gate transistor are formed on a same layer and in a same process, and a source and drain of the second type of transistor and a source and drain of the first type of double-gate transistor are formed on a same layer and in a same process; and
the second gate of the second type of transistor and the second detection line are disposed on a same layer.

16. The display panel according to claim 14, wherein:
the non-display area includes a first non-display area and a second non-display area that are on opposite sides of the display area respectively; and
the at least one first dummy subpixel is in the first non-display area, and the first control line and the second control line are electrically connected through a via in the second non-display area.

17. The display panel according to claim 14, wherein:
the non-display area includes a plurality of the first dummy subpixels disposed around the display area;
a plurality of the first subpixels is disposed along a first direction to form a first subpixel row, a plurality of first subpixel rows is disposed along a second direction, and the first direction intersects the second direction;
a plurality of the first subpixels of the first subpixel row is electrically connected to a same first control line, a plurality of the first subpixels of the first subpixel row is electrically connected to a same second control line; and
at least one of the plurality of first subpixel rows corresponds to one of the plurality of the first dummy subpixels.

18. The display panel according to claim 17, wherein the first dummy subpixels corresponding to different first subpixel rows are all on a same side of the display area in the first direction.

19. The display panel according to claim 17, wherein:
in the first direction, two sides of the display area include a first area and a second area opposite to each other, both of which are in the non-display area; and
at least part of the first dummy subpixels corresponding to the first subpixel row are in the first area, and at least part of the first dummy subpixels corresponding to the first subpixel row are in the second area.

20. The display panel according to claim 19, wherein in two adjacent first subpixel rows, the first dummy subpixel corresponding to one of the two adjacent first subpixel rows is in the first area, the first dummy subpixel corresponding to the other of the two adjacent first subpixel rows is in the second area.

21. The display panel according to claim 17, wherein:
the first pixel circuit further includes a plurality of thin film transistors, a thin film transistor of the plurality of thin film transistors is a P-type low-temperature polysilicon transistor, and the first type of double-gate transistor is a N-type oxide transistor;
the display panel at least further includes a first metal layer, a second metal layer, a third metal layer, and a fourth metal layer on a side of the substrate; and
a gate of the thin film transistor is in the first metal layer, the first control line and the first gate of the first type of double-gate transistor are on the second metal layer, the second control line and the second gate of the first type of double-gate transistor is on the third metal layer, a source and drain of the thin film transistor and the source and drain of the first type of double-gate transistor are on the fourth metal layer.

22. The display panel according to claim 13, wherein the second control line and the second detection line are connected in the non-display area.

23. The display panel according to claim 13, wherein:
the non-display area includes at least one second dummy subpixel, and a second dummy subpixel of the at least one second dummy subpixel includes a third pixel circuit;
the third pixel circuit at least includes a third type of double-gate transistor, a first gate of the third type of double-gate transistor and the first gate of the first type of double-gate transistor are formed on a same layer and in a same process, a second gate of the third type of double-gate transistor and the second gate of the first type of double-gate transistor are formed on a same layer and in a same process, and a source and drain of the third type of double-gate transistor and a source and drain of the first type of double-gate transistor are formed on a same layer and in a same process; and
the non-display area includes at least one first detection line, the first gate of the third type of double-gate transistor is connected to a first detection line of the at least one first detection line in the non-display area, the first detection line of the at least one first detection line is connected to the first control line, and the first detection line of the at least one first detection line and the first control line are on a same layer and have a same width.

24. The display panel according to claim 13, wherein:
the non-display area includes at least one third dummy subpixel, and a third dummy subpixel of the at least one third dummy subpixel includes a fourth pixel circuit;
the fourth pixel circuit at least includes a fourth type of double-gate transistor, a first gate of the fourth type of double-gate transistor and the first gate of the first type of double-gate transistor are formed on a same layer and in a same process, a second gate of the fourth type of double-gate transistor and the second gate of the first type of double-gate transistor are formed on a same layer and in a same process, and a source and drain of the fourth type of double-gate transistor and a source and drain of the first type of double-gate transistor are formed on a same layer and in a same process; and
the non-display area includes at least one first detection line, the first gate of the fourth type of double-gate transistor is connected to the first detection line in the non-display area, a line width of the first detection line is larger than a line width of the first control line, the line width of the first detection line is larger than a line width of the second detection line, and an orthographic projection of the first detection line on the substrate covers an orthographic projection of the second detection line on the substrate.

25. The display panel according to claim 1, wherein:
the first pixel circuit includes a driving transistor, a data writing module, a compensation module, a first lighting control module, a second lighting control module, a first reset module and a second reset module, that are electrically connected;
a first end of the first lighting control module is connected to a first power signal, a second end of the first lighting control module is connected to a first electrode of the driving transistor;
a first end of the data writing module is connected to a data voltage signal, a second end of the data writing module is connected to the first electrode of the driving transistor;
a first end of the compensation module is connected to a gate of the driving transistor, a second end of the compensation module is connected to a second electrode of the driving transistor;
a first end of the first reset module is connected to a first reset signal, a second end of the first reset module is connected to the gate of the driving transistor;
a first end of the second reset module is connected to a second reset signal, a second end of the second reset module is connected to an anode of the light-emitting element;
a first end of the second light-emitting control module is connected to the second electrode of the driving transistor, a second end of the second light-emitting control module is connected to the anode of the light-emitting element, and a cathode of the light-emitting element is connected to a second power supply signal; and
the compensation module and/or the first reset module includes the first type of double-gate transistor.

26. The display panel according to claim 25, wherein: the first light-emitting control module includes a first transistor, a gate of the first transistor is connected to a first light-emitting control signal, a first electrode of the first transistor is connected to a first power supply signal, and a second electrode of the first transistor is connected to the first electrode of the driving transistor; the data writing module includes a second transistor, a gate of the second transistor is connected to a first scanning signal, a first electrode of the second transistor is connected to the data voltage signal, and a second electrode of the second transistor is connected to the first electrode of the driving transistor; the compensation module includes a third transistor, the third transistor is the first type of double-gate transistor, a first gate of the third transistor is connected to a second scanning signal, a second gate of the third transistor is connected to the second scanning signal, a first electrode of the third transistor is connected to the gate of the driving transistor, and a second electrode of the third transistor is connected to the second electrode of the driving transistor; the first reset module includes a fourth transistor, the fourth transistor is the first type of double-gate transistor, a first gate of the fourth transistor is connected to a third scanning signal, a second gate of the fourth transistor is connected to the third scanning signal, a first electrode of the fourth transistor is connected to a first reset signal, and a second electrode of the fourth transistor is connected to the gate of the driving transistor; the second light-emitting control module includes a fifth transistor, a gate of the fifth transistor is connected to a second light-emitting control signal, a first electrode of the fifth transistor is connected to the second electrode of the driving transistor, and a second electrode of the fifth transistor is connected to the anode of the light-emitting element; and the second reset module includes a sixth transistor, a gate of the sixth transistor is connected to a fourth scanning signal, a first electrode of the sixth transistor is connected to the second electrode of the driving transistor, and a second electrode of the sixth transistor is connected to the anode of the light-emitting element.

27. A display device, comprising a display panel comprising a display area and a non-display area, wherein:
   the display panel includes:
      a plurality of first subpixels on the substrate, wherein:
         a first subpixel of the plurality of first subpixels includes a first pixel circuit and a light-emitting element electrically connected to the first pixel circuit,
         the first pixel circuit at least includes a first type of double-gate transistor, a first gate of the first type of double-gate transistor is connected to a first control line, and a second gate of the first type of double-gate transistor is connected to a second control line,
      in the display area, the first control line and the second control line are disposed on different layers, and a film layer where the second control line is located is on a side of a film layer where the first control line is located away from the substrate,
      at least part of an orthographic projection of the first control line corresponding to the first type of double-gate transistor on the substrate at least overlaps part of an orthographic projection of the second control line on the substrate; and
   a second detection line having a same width as the second control line.

* * * * *